US010875950B2

(12) United States Patent
Takasaki et al.

(10) Patent No.: US 10,875,950 B2
(45) Date of Patent: Dec. 29, 2020

(54) COLORING COMPOSITION, CURED FILM, COLOR FILTER, METHOD FOR MANUFACTURING COLOR FILTER, SOLID-STATE IMAGING DEVICE, IMAGE DISPLAY DEVICE, AND POLYMER

(71) Applicant: FUJIFILM Corporation, Tokyo (JP)

(72) Inventors: Yuta Takasaki, Fujinomiya (JP); Takuma Amemiya, Fujinomiya (JP); Yasuhiro Ishiwata, Fujinomiya (JP); Atsuyasu Nozaki, Fujinomiya (JP); Hiroaki Idei, Fujinomiya (JP); Atsushi Nakayama, Fujinomiya (JP); Akinori Fujita, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 271 days.

(21) Appl. No.: 15/889,720

(22) Filed: Feb. 6, 2018

(65) Prior Publication Data
US 2018/0162976 A1 Jun. 14, 2018

Related U.S. Application Data

(63) Continuation of application No. PCT/JP2016/073397, filed on Aug. 9, 2016.

(30) Foreign Application Priority Data

Aug. 13, 2015 (JP) .................................. 2015-159979
Mar. 3, 2016 (JP) .................................. 2016-040784

(51) Int. Cl.
| | | |
|---|---|---|
| *G02B 5/20* | (2006.01) |
| *G03F 7/004* | (2006.01) |
| *C08F 220/36* | (2006.01) |
| *C08J 3/24* | (2006.01) |
| *G03F 7/00* | (2006.01) |
| *G03F 7/16* | (2006.01) |
| *G03F 7/20* | (2006.01) |
| *G03F 7/32* | (2006.01) |
| *G03F 7/40* | (2006.01) |
| *H01L 27/146* | (2006.01) |
| *G02B 5/22* | (2006.01) |
| *C08F 220/34* | (2006.01) |
| *C09B 11/12* | (2006.01) |
| *C08F 2/44* | (2006.01) |
| *C08F 212/14* | (2006.01) |
| *C09B 11/26* | (2006.01) |
| *C09B 69/10* | (2006.01) |
| *G03F 7/033* | (2006.01) |
| *G03F 7/105* | (2006.01) |
| *C09D 133/08* | (2006.01) |
| *G02F 1/1362* | (2006.01) |
| *G02F 1/1335* | (2006.01) |
| *C08F 220/30* | (2006.01) |

(52) U.S. Cl.
CPC ............. *C08F 220/36* (2013.01); *C08F 2/44* (2013.01); *C08F 212/14* (2013.01); *C08F 220/34* (2013.01); *C08J 3/24* (2013.01); *C09B 11/12* (2013.01); *C09B 11/26* (2013.01); *C09B 69/103* (2013.01); *C09D 133/08* (2013.01); *G02B 5/223* (2013.01); *G03F 7/0007* (2013.01); *G03F 7/033* (2013.01); *G03F 7/105* (2013.01); *G03F 7/164* (2013.01); *G03F 7/168* (2013.01); *G03F 7/2002* (2013.01); *G03F 7/322* (2013.01); *G03F 7/40* (2013.01); *H01L 27/14621* (2013.01); *H01L 27/14685* (2013.01); *C08F 220/301* (2020.02); *C08F 220/302* (2020.02); *C08F 220/303* (2020.02); *C08F 220/365* (2020.02); *C08F 2800/20* (2013.01); *C08F 2810/20* (2013.01); *C08J 2333/14* (2013.01); *G02F 1/1362* (2013.01); *G02F 1/133516* (2013.01); *G02F 2001/136222* (2013.01)

(58) Field of Classification Search
CPC ........ G03F 7/0007; G03F 7/033; G03F 7/105; G02B 5/223; G02F 1/133514; H01L 27/14621; C09B 69/103
USPC .................................................. 430/7, 281.1
See application file for complete search history.

(56) References Cited

U.S. PATENT DOCUMENTS

| | | | |
|---|---|---|---|
| 2012/0242940 A1 | 9/2012 | Nagata et al. |
| 2013/0012648 A1 | 1/2013 | Fujie et al. |
| 2013/0141810 A1 | 6/2013 | Lee et al. |

(Continued)

FOREIGN PATENT DOCUMENTS

| | | |
|---|---|---|
| CN | 103718106 A | 4/2014 |
| JP | 2006088582 A | 4/2006 |
| JP | 2011-213925 A | 10/2011 |

(Continued)

OTHER PUBLICATIONS

Office Action dated Sep. 25, 2018, issued by the Japan Patent Office in corresponding Japanese Application No. 2016-040784.
Office Action dated Sep. 6, 2019 in corresponding Chinese Application No. 201680047379.9.
Office Action dated Feb. 26, 2019 in corresponding Chinese Application No. 201680047379.9.

(Continued)

*Primary Examiner* — John A McPherson
(74) *Attorney, Agent, or Firm* — Sughrue Mion, PLLC

(57) ABSTRACT

Provided are a coloring composition having excellent heat resistance and solvent resistance, a cured film, a color filter, a method for manufacturing a color filter, a solid-state imaging device, an image display device, and a polymer. The coloring composition includes a polymer TP consisting only of a repeating unit A having a triarylmethane structure and a repeating unit B having an acid group, and a polymerizable compound, in which the polymer TP contain the repeating unit B in the amount of 12% to 60% by mass with respect to all the repeating units of the polymer TP.

22 Claims, No Drawings

(56) References Cited

U.S. PATENT DOCUMENTS

2014/0154616 A1 6/2014 Nagata et al.
2016/0216604 A1 7/2016 Fujita et al.

FOREIGN PATENT DOCUMENTS

| JP | 2012215806 A | 11/2012 |
|---|---|---|
| JP | 2013041097 A | 2/2013 |
| JP | 2016075845 A | 5/2016 |
| TW | 201348341 A | 12/2013 |
| TW | 201522521 A | 6/2015 |
| WO | 2013176383 A1 | 11/2013 |
| WO | 2014/196464 A1 | 12/2014 |
| WO | 2015046285 A1 | 4/2015 |
| WO | 2015/098999 A1 | 7/2015 |
| WO | 2015115412 A1 | 8/2015 |
| WO | 2016031574 A1 | 3/2016 |
| WO | 2016121194 A1 | 8/2016 |

OTHER PUBLICATIONS

Office Action dated Apr. 1, 2019, issued by the Korean Intellectual Property Office in corresponding Korean Application No. 10-2018-7003862.
Communication dated Jan. 20, 2020 from the Taiwanese Patent Office in TW Application No. 105125363.
International Search Report of PCT/JP2016/073397 dated Oct. 25, 2016 [PCT/ISA/210].
Written Opinion of PCT/JP2016/073397 dated Oct. 25, 2016 [PCT/ISA/237].
International Preliminary Report on Patentability dated Feb. 22, 2018 from the International Bureau in counterpart International application No. PCT/JP2016/073397.
Office Action dated Feb. 26, 2020 in corresponding Chinese Application No. 201680047379.9.
Decision of Rejection dated May 27, 2020, from the Taiwanese Intellectual Property Office in Taiwan application No. 105125363.

COLORING COMPOSITION, CURED FILM, COLOR FILTER, METHOD FOR MANUFACTURING COLOR FILTER, SOLID-STATE IMAGING DEVICE, IMAGE DISPLAY DEVICE, AND POLYMER

CROSS-REFERENCE TO RELATED APPLICATIONS

This application is a Continuation of PCT International Application No. PCT/JP2016/073397 filed on Aug. 9, 2016, which claims priority under 35 U.S.C § 119(a) to Japanese Patent Application No. 2015-159979 filed on Aug. 13, 2015 and Japanese Patent Application No. 2016-040784 filed on Mar. 3, 2016. Each of the above application(s) is hereby expressly incorporated by reference, in its entirety, into the present application.

BACKGROUND OF THE INVENTION

1. Field of the Invention

The present invention relates to a coloring composition, a cured film, a color filter, a method for manufacturing a color filter, a solid-state imaging device, an image display device, and a polymer.

2. Description of the Related Art

A coloring composition has been used in the manufacture of a color filter and the like.
Recently, there has been a trend toward further utilization of color filters not only in monitors but also in televisions in the application of liquid crystal display devices. With the trend of this expanding utilization, color filters are required to have high-grade color characteristics in terms of chromaticity, contrast, or the like. As a coloring composition for a color filter, a coloring composition including triarylmethane, and the like are known. In US2013/0141810A, WO2013/176383A, and WO2015/046285A, a coloring composition including a compound having a triarylmethane structure is disclosed.

SUMMARY OF THE INVENTION

As a coloring composition for use in a color filter or the like, those capable of forming a film having excellent heat resistance and solvent resistance are required. In recent years, heat resistance and solvent resistance in the color filter have been required to further improve.
Therefore, an object of the present invention is to provide a coloring composition capable of producing a cured film of a color filter or the like, having excellent heat resistance and solvent resistance. Further, another object of the present invention is to provide a cured film, a color filter, a method for manufacturing a color filter, a solid-state imaging device, an image display device, and a polymer.
Under these circumstances, the present inventors have conducted extensive studies, and as a result, they have found that it is possible to accomplish the objects by using a polymer TP which consists only of a repeating unit A having a triarylmethane structure which will be described later, and a repeating unit B having an acid group, and contains the repeating unit B in the amount of 12% to 60% by mass with respect to all the repeating units, thereby completing the present invention. The present invention provides the following aspects.

<1> A coloring composition comprising:
a polymer TP consisting only of a repeating unit A having at least one triarylmethane structure selected from General Formulae (TP1) and (TP2), and a repeating unit B having an acid group; and
a polymerizable compound,
in which the polymer TP contains the repeating unit B in the amount of 12% to 60% by mass with respect to all the repeating units of the polymer TP;

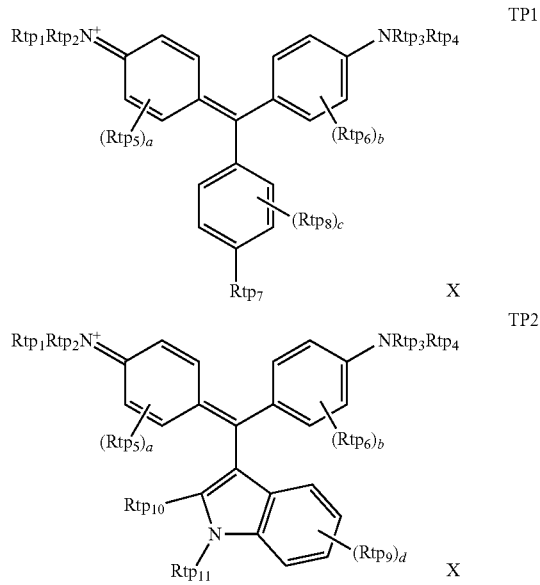

in General Formulae (TP1) and (TP2), $Rtp_1$ to $Rtp_4$ each independently represent a hydrogen atom, an alkyl group, or an aryl group; $Rtp_5$, $Rtp_6$, $Rtp_8$, $Rtp_9$, and $Rtp_{11}$ each independently represent a substituent; $Rtp_7$ represents a hydrogen atom, an alkyl group, an aryl group, or $NRtp_{71}Rtp_{72}$; $Rtp_{71}$ and $Rtp_{72}$ each independently represent a hydrogen atom, an alkyl group, or an aryl group; $Rtp_{10}$ represents a hydrogen atom, an alkyl group, or an aryl group; a, b, c, and d each independently represent an integer of 0 to 4; in a case where a is 2 or more, $Rtp_5$'s may be linked to each other to form a ring; in a case where b is 2 or more, $Rtp_6$'s may be linked to each other to form a ring; in a case where c is 2 or more, $Rtp_8$'s may be linked to each other to form a ring; in a case where d is 2 or more, $Rtp_9$'s may be linked to each other to form a ring; X represents an anion, or X is not present and at least one of $Rtp_1$, ..., or $Rtp_{11}$, $Rtp_{71}$, or $Rtp_{72}$ includes an anion; and any one of $Rtp_1$ to $Rtp_{11}$, $Rtp_{71}$, and $Rtp_{72}$ has a site for binding to the repeating unit A.

<2> The coloring composition as described in <1>,
in which the weight-average molecular weight of the polymer TP is from 5,000 to 500,000.

<3> The coloring composition as described in <2>, further comprising:
a compound A with a weight-average molecular weight of less than 5,000, having a triarylmethane structure,
in which the content of the compound A is 20 parts by mass or less with respect to 100 parts by mass of the total amount of the polymer TP and the compound A.

<4> The coloring composition as described in any one of <1> to <3>,
in which the acid group contained in the repeating unit B is a carboxyl group.

<5> The coloring composition as described in any one of <1> to <4>,
in which X is selected from a fluorine anion, a chlorine anion, a bromine anion, an iodine anion, a cyanide ion, a perchloric acid anion, a borate anion, $PF_6^-$ and $SbF_6^-$ anions, and a compound having at least one structure selected from $-SO_3^-$, $-COO^-$, $-PO_4^-$, a structure represented by General Formula (A1), and a structure represented by General Formula (A2),

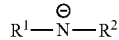

General Formula (A1)

in General Formula (A1), $R^1$ and $R^2$ each independently represent $-SO_2-$ or $-CO-$; and

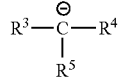

General Formula (A2)

in General Formula (A2), $R^3$ represents $-SO_2-$ or $-CO-$; and $R^4$ and $R^5$ each independently represent $-SO_2-$, $-CO-$, or $-CN$.

<6> The coloring composition as described in any one of <1> to <5>,
in which X is a compound including a bis(sulfonyl)imide anion, a tris(sulfonyl)methide anion, or a sulfonic acid anion.

<7> The coloring composition as described in any one of <1> to <4>,
in which in General Formulae (TP1) and (TP2), at least one of $Rtp_1, \ldots,$ or $Rtp_{11}$, $Rtp_{71}$, or $Rtp_{72}$ is substituted with General Formula (P);

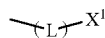

General Formula (P)

in General Formula (P), L represents a single bond or a divalent linking group; $X^1$ represents at least one selected from $-SO_3^-$, $-COO^-$, $-PO_4^-$, a group including the structure represented by General Formula (A1), and a group including the structure represented by General Formula (A2);

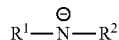

General Formula (A1)

in General Formula (A1), $R^1$ and $R^2$ each independently represent $-SO_2-$ or $-CO-$; and

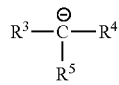

General Formula (A2)

in General Formula (A2), $R^3$ represents $-SO_2-$ or $-CO-$; and $R^4$ and $R^5$ each independently represent $-SO_2-$, $-CO-$, or $-CN$.

<8> The coloring composition as described in any one of <1> to <7>,
in which the triarylmethane structure contained in the repeating unit A is represented by General Formula (TP3);

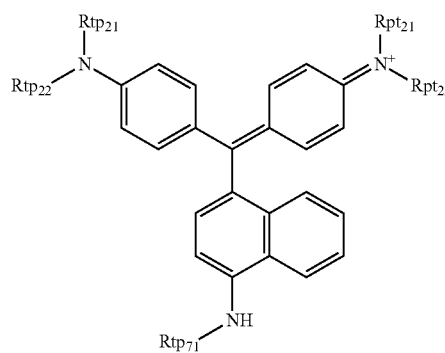

TP3 in General Formula (TP3), $Rtp_{21}$'s each independently represent a hydrogen atom or an alkyl group having 1 to 6 carbon atoms; $Rtp_{22}$'s each independently represent an aryl group having 6 to 10 carbon atoms; $Rtp_{71}$ represents an alkyl group or an aryl group; X represents an anion, or X is not present and at least one of $Rtp_{21}$, $Rtp_{22}$, or $Rtp_{71}$ includes an anion; and any one of $Rtp_{21}$, $Rtp_{22}$, and $Rtp_{71}$ has a site for binding to the repeating unit A.

<9> The coloring composition as described in any one of <1> to <8>,
in which the repeating unit A is represented by General Formula (TP3-1);

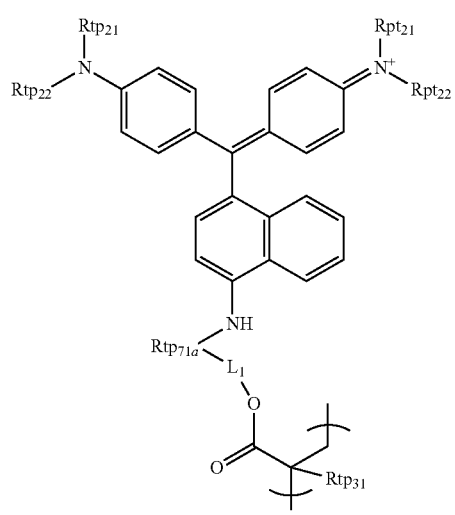

TP3-1 in General Formula (TP3-1), $Rtp_{21}$'s each independently represent a hydrogen atom or an alkyl group having 1 to 6 carbon atoms; $Rtp_{22}$'s each independently represent an aryl group having 6 to 10 carbon atoms; $Rtp_{71a}$ represents an alkylene group or an arylene group; $L_1$ represents a single bond or a divalent linking group; $Rtp_{31}$ represents a hydrogen atom or a methyl group; and X represents an anion, or X is not present and at least one of $Rtp_{21}$ or $Rtp_{22}$ includes an anion.

<10> The coloring composition as described in any one of <1> to <9>, in which the repeating unit A is represented by General Formula (TP3-2);

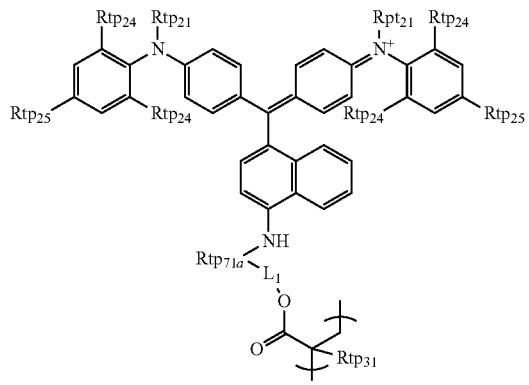

(TP3-2)

in General Formula (TP3-2), $Rtp_{21}$'s each independently represent a hydrogen atom or an alkyl group having 1 to 6 carbon atoms; $Rtp_{24}$'s each independently represent an alkyl group having 1 to 4 carbon atoms; $Rtp_{25}$'s each independently represent a hydrogen atom or an alkyl group having 1 to 3 carbon atoms; $Rtp_{71a}$ represents an alkylene group or an arylene group; $Rtp_{31}$ represents a hydrogen atom or a methyl group; $L_1$ represents a single bond or a divalent linking group; and X represents an anion, or X is not present and at least one of $Rtp_{21}$, $Rtp_{24}$, or $Rtp_{25}$ includes an anion.

<11> The coloring composition as described in any one of <1> to <10>, in which the repeating unit A is represented by General Formula (TP3-3);

in General Formula (TP3-3), $Rtp_{21}$'s each independently represent a hydrogen atom or an alkyl group having 1 to 6 carbon atoms; $Rtp_{24}$'s each independently represent an alkyl group having 1 to 4 carbon atoms; $Rtp_{25}$'s each independently represent a hydrogen atom or an alkyl group having 1 to 3 carbon atoms; $Rtp_{31}$ represents a hydrogen atom or a methyl group; and X represents an anion.

<12> The coloring composition as described in any one of <1> to <11>, in which the repeating unit B is represented by General Formula (B-1);

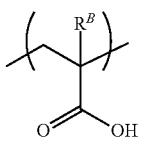

(B-1)

in General Formula (B-1), $R^B$ represents a hydrogen atom or a methyl group.

<13> The coloring composition as described in any one of <1> to <12>, further comprising:

at least one selected from a xanthene compound, a dipyrromethene-based metal complex compound, a dioxazine compound, and a phthalocyanine compound.

<14> The coloring composition as described in any one of <1> to <13>, in which the polymer TP is a polymer represented by General Formula (TP-7);

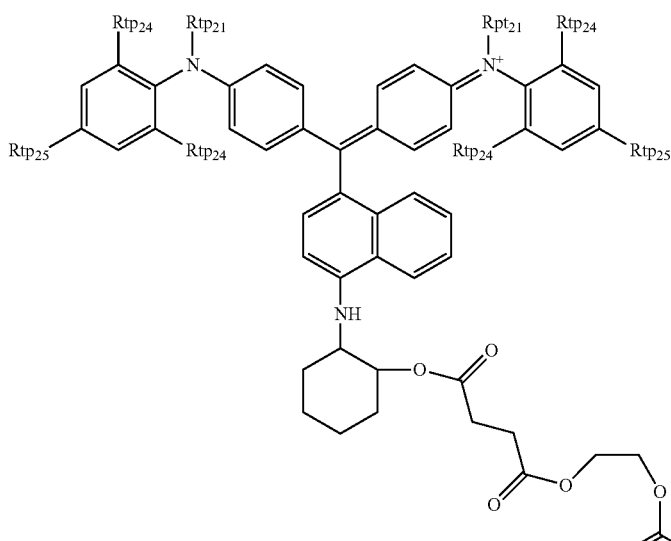

TP3-3

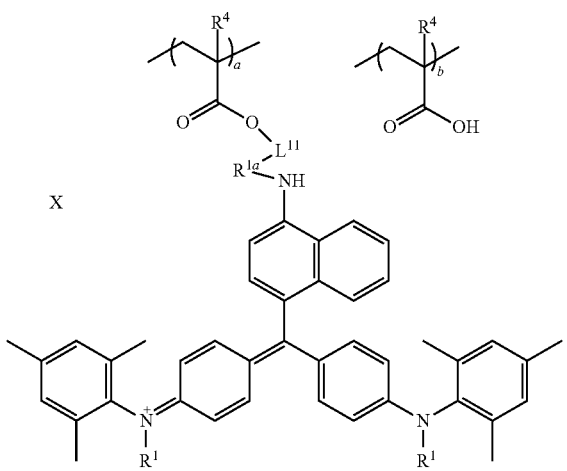

TP-7 in General Formula (TP-7), $R^1$'s each independently represent a hydrogen atom or an alkyl group having 1 to 6 carbon atoms; $R^4$ represents a hydrogen atom or a methyl group; $R^{1a}$ represents an alkylene group or an arylene group; $L^{11}$ represents a single bond or a divalent linking group having 1 to 30 carbon atoms; X represents a compound including a bis(sulfonyl)imide anion, a tris(sulfonyl)methide anion, or a sulfonic acid anion; and a and b each represent the mass ratio of the repeating units, a represents 40 to 88, b represents 12 to 60, and a+b represents 100.

<15> The coloring composition as described in any one of <1> to <14>, in which the polymer TP is a polymer represented by General Formula (TP-8);

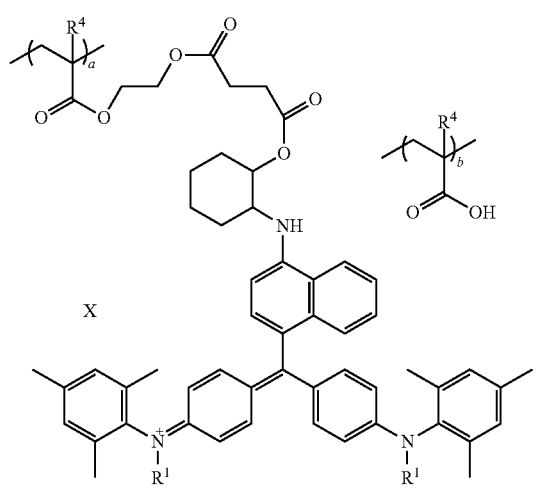

TP-8 in General Formula (TP-8), $R^1$'s each independently represent a hydrogen atom or an alkyl group having 1 to 6 carbon atoms; $R^4$ represents a hydrogen atom or a methyl group; X represents a compound including a bis(sulfonyl) imide anion, a tris(sulfonyl)methide anion, or a sulfonic acid anion; and a and b each represent the mass ratio of the repeating units, a represents 40 to 88, b represents 12 to 60, and a+b represents 100.

<16> The coloring composition as described in any one of <1> to <15>, in which the polymer TP includes a bis(trifluoromethanesulfonyl)imide anion.

<17> The coloring composition as described in any one of <1> to <16>, further comprising:

a bis(trifluoromethanesulfonyl)imide salt.

<18> The coloring composition as described in any one of <1> to <17>, further comprising:

a crosslinking agent.

<19> The coloring composition as described in any one of <1> to <18>, which is used for forming a colored layer of a color filter.

<20> A cured film formed by curing the coloring composition as described in any one of <1> to <19>.

<21> A color filter comprising:

the cured film as described in <20>.

<22> A method for manufacturing a color filter, comprising:

a step of forming a coloring composition layer on a substrate, using the coloring composition as described in any one of <1> to <19>; and a step of forming a pattern for the composition layer by a photolithography method or a dry etching method.

<23> A solid-state imaging device comprising:

the color filter as described in <21>.

<24> An image display device comprising:

the color filter as described in <21>.

<25> A polymer represented by General Formula (TP-7);

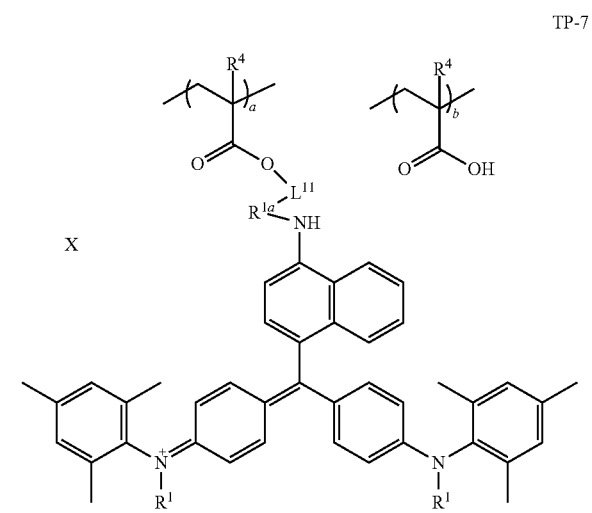

TP-7 in General Formula (TP-7), $R^1$'s each independently represent a hydrogen atom or an alkyl group having 1 to 6 carbon atoms; $R^4$ represents a hydrogen atom or a methyl group; $R^{1a}$ represents an alkylene group or an arylene group; $L^{11}$ represents a single bond or a divalent linking group having 1 to 30 carbon atoms; X represents a compound including a bis(sulfonyl)imide anion, a tris(sulfonyl)methide anion, or a sulfonic acid anion; and a and b each represent the mass ratio of the repeating units, a represents 40 to 88, b represents 12 to 60, and a+b represents 100.

<26> The polymer as described in <25>, in which the polymer represented by General Formula (TP-7) is a polymer represented by General Formula (TP-8);

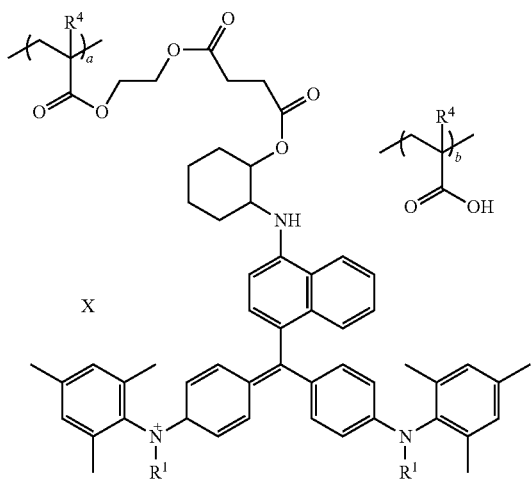

TP-8 in General Formula (TP-8), $R^1$'s each independently represent a hydrogen atom or an alkyl group having 1 to 6 carbon atoms; $R^4$ represents a hydrogen atom or a methyl group; X represents a compound including a bis(sulfonyl) imide anion, a tris(sulfonyl)methide anion, or a sulfonic acid anion; and a and b each represent the mass ratio of the repeating units, a represents 40 to 88, b represents 12 to 60, and a+b represents 100.

According to the present invention, it is possible to provide a coloring composition capable of producing a cured film of a color filter or the like, having excellent heat resistance and solvent resistance. It is also possible to provide a cured film, a color filter, a method for manufacturing a color filter, a solid-state imaging device, an image display device, and a polymer.

DESCRIPTION OF THE PREFERRED EMBODIMENTS

Hereinafter, the contents of the present invention will be described in detail.

Furthermore, in the present specification, "(a value) to (a value)" means a range including the numerical values described before and after "to" as a lower limit value and an upper limit value, respectively.

In the present specification, the total solid content refers to a total mass of the components remaining in a case where a solvent is excluded from the entire composition of a coloring composition.

In regard to the denotation of a group (atomic group) in the present specification, a denotation without specifying whether the group is substituted or unsubstituted implies that the group (atomic group) includes a group (atomic group) having no substituent as well as a group (atomic group) having a substituent. For example, the term "alkyl group" includes not only an alkyl group having no substituent (an unsubstituted alkyl group) but also an alkyl group having a substituent (a substituted alkyl group).

In the present specification, "exposure" includes, unless otherwise specified, not only exposure by light, but also writing by particle rays such as electron beams and ion beams. Further, examples of light used for exposure generally include actinic rays or radiation such as a bright line spectrum of a mercury lamp, far ultraviolet rays represented by an excimer laser, extreme ultraviolet rays (EUV light), X-rays, and electron beams.

In the present specification, "(meth)acrylate" represents either or both of acrylate and methacrylate, "(meth)acryl" represents either or both of acryl and methacryl, and "(meth)acryloyl" represents either or both of acryloyl and methacryloyl.

In the formulae in the present specification, Me represents a methyl group, Et represents an ethyl group, Pr represents a propyl group, Bu represents a butyl group, and Ph represents a phenyl group.

In the present specification, a term "step" includes not only an independent step, but also steps which are not clearly distinguished from other steps if an intended action of the steps is obtained.

<Coloring Composition>

The coloring composition of the present invention includes a polymer TP consisting only of a repeating unit A having a triarylmethane structure which will be described later, and a repeating unit B having an acid group, and a polymerizable compound, in which the polymer TP contains the repeating unit B in the amount of 12% to 60% by mass with respect to all the repeating units of the polymer TP.

By adopting such a configuration, it is possible to provide a coloring composition capable of producing a cured film having excellent heat resistance and solvent resistance. Further, it is also possible to form a film having a good voltage holding ratio. In addition, it is also possible to improve pattern forming properties. A mechanism for obtaining such an effect may be thought to be as follows: for example, in a case where the polymer TP consists only of the repeating unit A and the repeating unit B, and the content of the repeating unit B is within the above range, the solubility of a cured film obtained from the coloring composition in a solvent is lowered, and the compatibility with a polymerizable compound, an alkali-soluble binder, or the like is improved, the polymer TP is hardly eluted from a film in a case where the film is formed, and thus, the solvent resistance and the heat resistance are improved. Hereinafter, the respective components of the coloring composition of the present invention will be described in detail.

<<Polymer TP>>
<<<Repeating Unit A>>>

The polymer TP includes a repeating unit A having a triarylmethane structure.

The repeating unit A is preferably a structure represented by General Formula (A). The repeating unit A is preferably included in the amount of 40% to 88% by mass with respect to all the repeating units of the polymer TP. The lower limit is more preferably 45% by mass or more, more preferably 50% by mass or more, and particularly preferably 55% by mass or more. The upper limit can be set to, for example, 85% by mass or less, or to 80% by mass or less. If the content of the repeating unit A is within the above range, it is easy to form a cured film having excellent solvent resistance and heat resistance from the obtained coloring composition. In addition, the color value of the cured film is improved.

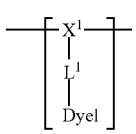

(A)

In General Formula (A), $X^1$ represents the main chain of a repeating unit, $L^1$ represents a single bond or a divalent linking group, and DyeI represents a triarylmethane structure represented by General Formula (TP1) or General Formula (TP2) which will be described later.

In General Formula (A), $X^1$ represents the main chain of a repeating unit, and usually represents a linking group formed by a polymerization reaction. $X^1$ is preferably, for example, a main chain derived from a compound having a (meth)acryl group, a styrene group, a vinyl group, or an ether group. Further, an aspect of a main chain having a cyclic alkylene group is also preferable.

$X^1$ is not particularly limited as long as it is a linking group formed of a known polymerizable monomer, but $X^1$ is preferably a linking group represented by each of (XX-1) to (XX-24), more preferably a (meth)acrylic linking group represented by each of (XX-1) and (XX-2), a styrene-based linking group represented by each of (XX-10) to (XX-17), and a vinyl-based linking group represented by each of (XX-18), (XX-19), and (XX-24), even still more preferably a (meth)acrylic linking group represented by each of (XX-1) and (XX-2), a styrene-based linking group represented by each of (XX-10) to (XX-17), and a vinyl-based linking group represented by (XX-24), and particularly preferably a (meth)acrylic linking group represented by each of (XX-1) and (XX-2), and a styrene-based linking group represented by (XX-11).

In (XX-1) to (XX-24), * represents a linkage to $L^1$ at a site represented by X. Me represents a methyl group. Further, R in (XX-18) and (XX-19) represents a hydrogen atom, an alkyl group having 1 to 5 carbon atoms, or a phenyl group.

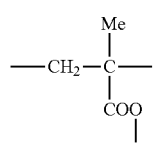
(XX-1)

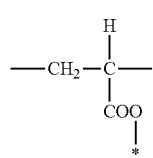
(XX-2)

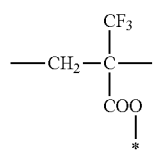
(XX-3)

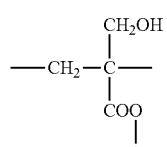
(XX-4)

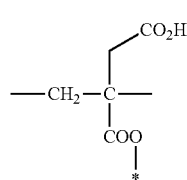
(XX-5)

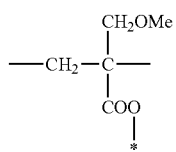
(XX-6)

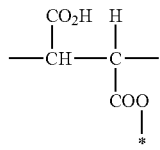
(XX-7)

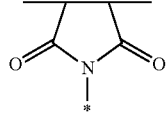
(XX-8)

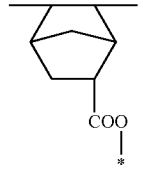
(XX-9)

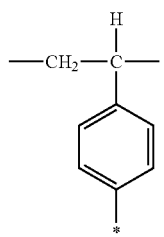
(XX-10)

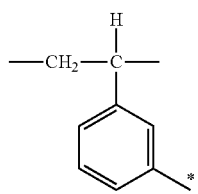
(XX-11)

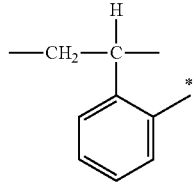
(XX-12)

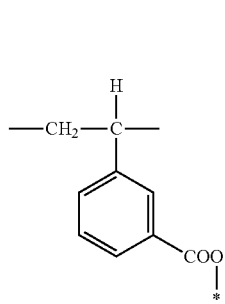
(XX-13)

-continued

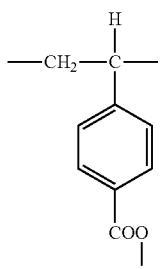
(XX-14)

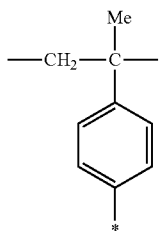
(XX-15)

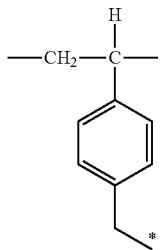
(XX-16)

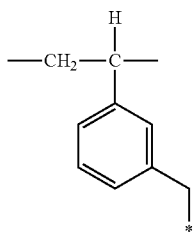
(XX-17)

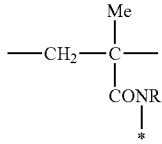
(XX-18)

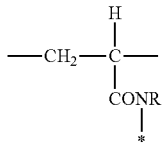
(XX-19)

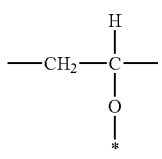
(XX-20)

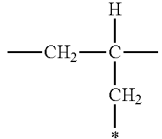
(XX-21)

-continued

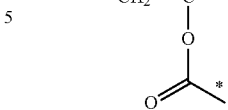
(XX-22)

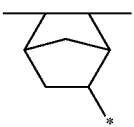
(XX-23)

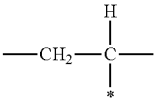
(XX-24)

$L^1$ represents a single bond or a divalent linking group. In a case where $L^1$ represents a divalent linking group, $L^1$ is preferably an alkylene group, an arylene group, a heterocyclic group, —CH=CH—, —O—, —S—, —CO—, —NR—, —CONR—, —COO—, —OCO—, —SO$_2$—, or a linking group formed by combination of two or more of these groups. Here, R's each independently represent a hydrogen atom, an alkyl group, an aryl group, or a heterocyclic group.

The number of carbon atoms in the alkylene group is preferably 1 to 30. The upper limit is more preferably 25 or less, and still more preferably 20 or less. The lower limit is more preferably 2 or more, and still more preferably 3 or more. The alkylene group may be in any one of linear, branched, and cyclic forms.

The number of carbon atoms in the arylene group is preferably 6 to 20, and more preferably 6 to 12.

$L^1$ is preferably an alkylene group, an arylene group, —NH—, —CO—, —O—, —COO—, —OCO—, or a linking group formed by combination of two or more of these groups, more preferably an alkylene group, an arylene group, or a divalent group formed by combination of this group with one or more selected from —O—, —COO—, and —OCO—, and still more preferably an alkylene group, or a linking group in which the alkylene groups are linked through one or more selected from —O—, —COO—, and —OCO—.

The number of atoms constituting the chain connecting $X^1$ and DyeI in $L^1$ is preferably 1 or more, more preferably 2 or more, and still more preferably 3 or more. The upper limit is preferably, for example, 20 or less. According to this aspect, it is possible to effectively suppress a triarylmethane compound with a low molecular weight, which has not been reacted or has been insufficiently reacted, during the synthesis of the polymer TP. For example, in a case of $L^1$ represented by the following structural formula, the number of atoms constituting the chain connecting $X^1$ and DyeI is 10. Further, in the following structural formula, the atoms having numbers denoted therewith are atoms constituting the chain connecting $X^1$ and DyeI.

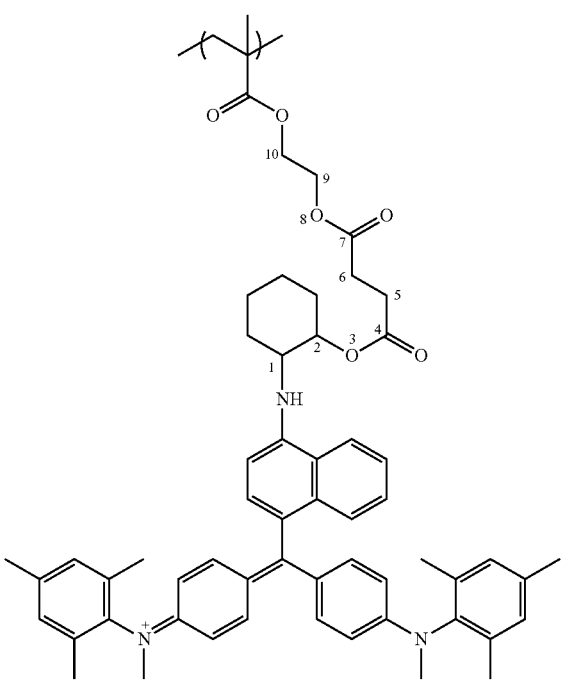

Furthermore, in a case where L represents a single bond, it is preferable that $X^1$ is bonded to any one of $Rtp_1$ to $Rtp_{11}$, $Rtp_{71}$, and $Rtp_{72}$ in General Formulae (TP1) and (TP2), and is bonded to $Rtp_{71}$ or $Rtp_{72}$.

In a case where $L^1$ represents a divalent linking group, it is preferable that $L^1$ is bonded to any one of $Rtp_1$ to $Rtp_{11}$, $Rtp_{71}$, and $Rtp_{72}$ in General Formulae (TP1) and (TP2), and is bonded to $Rtp_{71}$ or $Rtp_{72}$.

<<<<Triarylmethane Structure>>>>

Next, the triarylmethane structure contained in the repeating unit A will be described.

The repeating unit A has at least one triarylmethane structure selected from General Formulae (TP1) and (TP2).

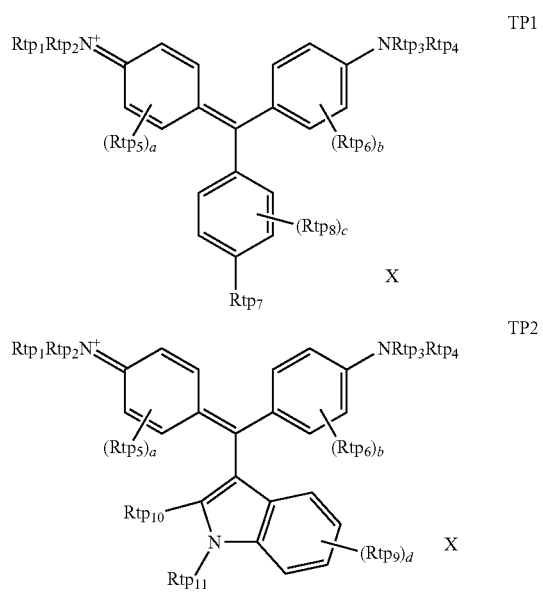

In General Formulae (TP1) and (TP2), $Rtp_1$ to $Rtp_4$ each independently represent a hydrogen atom, an alkyl group, or an aryl group; $Rtp_5$, $Rtp_6$, $Rtp_8$, $Rtp_9$, and $Rtp_{11}$ each independently represent a substituent; $Rtp_7$ represents a hydrogen atom, an alkyl group, an aryl group, or $NRtp_{71}Rtp_{72}$; $Rtp_{71}$ and $Rtp_{72}$ each independently represent a hydrogen atom, an alkyl group, or an aryl group; $Rtp_{10}$ represents a hydrogen atom, an alkyl group, or an aryl group; a, b, c, and d each independently represent an integer of 0 to 4; in a case where a is 2 or more, $Rtp_5$'s may be linked to each other to form a ring; in a case where b is 2 or more, $Rtp_6$'s may be linked to each other to form a ring; in a case where c is 2 or more, $Rtp_5$'s may be linked to each other to form a ring; in a case where d is 2 or more, $Rtp_9$'s may be linked to each other to form a ring; X represents an anion, or X is not present at least one $Rtp_1$ to $Rtp_{11}$, $Rtp_{71}$, or $Rtp_{72}$ includes an anion; and any one of $Rtp_1$ to $Rtp_{11}$, $Rtp_{71}$, and $Rtp_{72}$ has a site for binding to the repeating unit A.

In General Formula (TP1), $Rtp_1$ to $Rtp_4$ each independently represent a hydrogen atom, an alkyl group, or an aryl group. It is preferable that any one of $Rtp_1$ and $Rtp_2$ is an alkyl group, and the other is an aryl group. It is preferable that any one of $Rtp_3$ and $Rtp_4$ is an alkyl group, and the other is an aryl group.

The number of carbon atoms in the alkyl group is preferably 1 to 10, more preferably 1 to 6, still more preferably 1 to 4, and particularly preferably 1 to 3. The alkyl group may be in any one of linear, branched, and cyclic forms, but is preferably linear or branched. The alkyl group may have a substituent, but is preferably unsubstituted. Examples of the substituent which may be contained in the alkyl group include the substituents mentioned in the section of a substituent group A which will be described later.

The number of carbon atoms in the aryl group is preferably 6 to 18, more preferably 6 to 12, and still more preferably 6. The aryl group may be unsubstituted or may have a substituent. It is preferable that the aryl group has a substituent. Examples of the substituent which may be contained in the aryl group include the substituents mentioned in the section of a substituent group A which will be described later.

In General Formula (TP1), $Rtp_7$ represents a hydrogen atom, an alkyl group, an aryl group, or $NRtp_{71}Rtp_{72}$, and is preferably a hydrogen atom or $NRtp_{71}Rtp_{72}$, and more preferably $NRtp_{71}Rtp_{72}$.

The number of carbon atoms in the alkyl group represented by $Rtp_7$ is preferably 1 to 10, more preferably 1 to 6, still more preferably 1 to 4, and particularly preferably 1 to 3. The alkyl group may be in any one of linear, branched, and cyclic forms, but is preferably linear. The alkyl group may be unsubstituted or may have a substituent. Examples of the substituent which may be contained in the alkyl group include the substituents mentioned in the section of a substituent group A which will be described later. The number of carbon atoms in the aryl group represented by $Rtp_7$ is preferably 6 to 18, more preferably 6 to 12, and still more preferably 6.

$Rtp_{71}$ and $Rtp_{72}$ each independently represent a hydrogen atom, an alkyl group, or an aryl group, and is preferably a hydrogen atom or an alkyl group.

The number of carbon atoms in the alkyl group represented by each of $Rtp_{71}$ and $Rtp_{72}$ is preferably 1 to 10, more preferably 1 to 8, and still more preferably 1 to 6. The alkyl group may be in any one of linear, branched, and cyclic forms, but is preferably cyclic. The alkyl group may be unsubstituted or may have a substituent. Examples of the substituent which may be contained in the alkyl group include the substituents mentioned in the section of a substituent group A which will be described later.

The number of carbon atoms in the aryl group represented by $Rtp_{71}$ and $Rtp_{72}$ preferably 6 to 18, more preferably 6 to 12, and still more preferably 6. The aryl group may be unsubstituted or may have a substituent. Examples of the substituent which may be contained in the aryl group include the substituents mentioned in the section of a substituent group A which will be described later.

In General Formula (TP1), $Rtp_5$, $Rtp_6$, and $Rtp_8$ each independently represent a substituent. Examples of the substituent include the substituents mentioned in the section of a substituent group A which will be described later. In particular, a linear or branched alkyl group having 1 to 5 carbon atoms, an alkenyl group having 1 to 5 carbon atoms, an aryl group having 6 to 15 carbon atoms, a carboxyl group, or a sulfo group is preferable, and a linear or branched alkyl group having 1 to 5 carbon atoms, an alkenyl group having 1 to 5 carbon atoms, a phenyl group, or a carboxyl group is more preferable. In particular, $Rtp_5$ and $Rtp_6$ are each independently preferably an alkyl group having 1 to 5 carbon atoms. Further, in a case where c is 2 or more, two alkenyl groups in a plurality of $Rtp_5$'s are preferably bonded to each other to form a ring. The ring is preferably a benzene ring.

In General Formula (TP1), a, b, and c each independently represent an integer of 0 to 4, and in particular, a and b each preferably represent 0 or 1, and more preferably represent 0. c preferably represents 0 to 2.

In General Formula (TP2), $Rtp_1$ to $Rtp_4$ each independently represent a hydrogen atom, an alkyl group, or an aryl group, and have the same definitions as $Rtp_1$ to $Rtp_4$ in General Formula (TP1), and preferred ranges thereof are also the same.

In General Formula (TP2), $Rtp_5$ and $Rtp_6$ each independently represent a substituent, and have the same definitions as $Rtp_5$ and $Rtp_6$, respectively, in General Formula (TP1), and preferred ranges thereof are also the same.

In General Formula (TP2), $Rtp_9$ and $Rtp_{11}$ each independently represent a substituent, and the substituents mentioned in the section of a substituent group A which will be described later can be used.

$Rtp_9$ is preferably an aryl group, more preferably an aryl group having 6 to 12 carbon atoms, and still more preferably a phenyl group.

$Rtp_{11}$ is preferably an alkyl group, more preferably an alkyl group having 1 to 5 carbon atoms, and still more preferably an alkyl group having 1 to 3 carbon atoms. The alkyl group is preferably linear or branched, and more preferably linear.

In General Formula (TP2), $Rtp_{10}$ represents a hydrogen atom, an alkyl group, or an aryl group. In particular, $Rtp_{10}$ is more preferably an aryl group having 6 to 12 carbon atoms, and still more preferably a phenyl group.

In General Formula (TP2), a, b, and d each independently represent an integer of 0 to 4, and in particular, a and b each preferably represent 0 or 1, and are each more preferably 0. d preferably represents 0 to 2, and is more preferably 0.

In General Formulae (TP1) and (TP2), any one of $Rtp_1$ to $Rtp_{11}$, $Rtp_{71}$, and $Rtp_{72}$ has a site for binding to the repeating unit A, and in particular, $Rtp_{71}$ or $Rtp_{72}$ preferably has a site for binding to the repeating unit A.

In General Formulae (TP1) and (TP2), at least one of $Rtp_1$, ..., or $Rtp_{11}$, $Rtp_{71}$, or $Rtp_{72}$ may include an anion.

As the anion, $-SO_3^-$, $-COO^-$, $-PO_4^-$, a bis(sulfonyl)imide anion, a tris(sulfonyl)methide anion, or a tetraarylborate anion is preferable, a bis(sulfonyl)imide anion, a tris(sulfonyl)methide anion, or a tetraarylborate anion is more preferable, and a bis(sulfonyl)imide anion or a tris(sulfonyl)methide anion is still more preferable.

Specific examples of the aspect including an anion include structures in which at least one of $Rtp_1$, ..., or $Rtp_{11}$, $Rtp_{71}$, or $Rtp_{72}$ is substituted with General Formula (P).

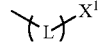

General Formula (P)

In General Formula (P), L represents a single bond or a divalent linking group, and $X^1$ represents an anion.

In General Formula (P), L represents a single bond or a divalent linking group. The divalent linking group preferably represents $-NR^{10}-$, $-O-$, $-SO_2-$, an alkylene group which may include a fluorine atom, an arylene group which may include a fluorine atom, or a group formed by combination of these groups. In particular, the divalent linking group preferably represents a group formed by combination of $-NR^{10}$, $-SO_2-$, and an alkylene group which may include a fluorine atom, or a group formed by combination of $-O-$ and an arylene group which may include a fluorine atom.

In $-NR^{10}-$, $R^{10}$ represents a hydrogen atom or an alkyl group having 1 to 5 carbon atoms, and is preferably a hydrogen atom.

The number of carbon atoms in the alkylene group which may include a fluorine atom is preferably 1 to 10, more preferably 1 to 6, and still more preferably 1 to 3. The alkylene group including a fluorine atom is preferably a perfluoroalkylene group. Specific examples of the alkylene group including a fluorine atom include a difluoromethylene group, a tetrafluoroethylene group, and a hexafluoropropylene group.

The number of carbon atoms in the arylene group which may include a fluorine atom is preferably 6 to 20, more preferably 6 to 14, and still more preferably 6 to 10. Specific examples of the arylene group including a fluorine atom include a tetrafluorophenylene group, a hexafluoro-1-naphthylene group, and a hexafluoro-2-naphthylene group.

In General Formula (P), $X^1$ represents an anion, and is preferably selected from $-SO_3^-$, $-COO^-$, $-PO_4^-$, and at least one selected from a group including the structure represented by General Formula (A1) and a group including the structure represented by General Formula (A2).

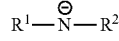

General Formula (A1)

In General Formula (A1), $R^1$ and $R^2$ each independently represent $-SO_2-$ or $-CO-$.

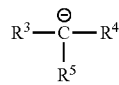

General Formula (A2)

In General Formula (A2), $R^3$ represents $-SO_2-$ or $-CO-$. $R^4$ and $R^5$ each independently represent $-SO_2-$, $-CO-$, or $-CN$.

It is preferable that the group including the structure represented by General Formula (A1) has a fluorine-substituted alkyl group at a terminal of one of $R^1$ and $R^2$ in General Formula (A1), and it is more preferable that one of $R^1$ and $R^2$ is directly bonded to a fluorine-substituted alkyl group. The number of carbon atoms in the fluorine-substituted alkyl group is preferably 1 to 10, more preferably 1 to 6, still more preferably 1 to 3, even still more preferably 1 or 2, and particularly preferably 1. These alkyl groups are each preferably a perfluoroalkyl group. Specific examples of the fluorine-substituted alkyl group include a trifluoromethyl group.

It is preferable that the group including the structure represented by General Formula (A2) has a fluorine-substituted alkyl group at terminals of at least one of $R^3$, . . . , or $R^5$ in General Formula (A2), and it is more preferable that at least one of $R^3$, . . . , or $R^5$ is directly bonded to a fluorine-substituted alkyl group. Further, it is preferable that the group including the structure represented by General Formula (A2) has a fluorine-substituted alkyl group at least two terminals of $R^3$, . . . , or $R^5$, and it is more preferable that at least two of $R^3$, . . . , or $R^5$ are directly bonded to fluorine-substituted alkyl groups. The fluorine-substituted alkyl group has the same definition as that described for the group including the structure represented by General Formula (A1), and a preferred range thereof is also the same.

Other specific examples of $X^1$ include a counter anion A which will be described later. In this case, any one of hydrogen atom or halogen atom constituting the counter anion A is bonded to L in General Formula (P).

In General Formulae (TP1) and (TP2), one portion or two or more portions, which are substituted with General Formula (P), may be present. In a case where two or more portions substituted with General Formula (P) are present, cations in number corresponding to the number of anions, in addition to cations included in the triarylmethane structure, are preferably present in the polymer TP.

In General Formulae (TP1) and (TP2), X represents an anion. In General Formulae (TP1) and (TP2), X may or may not be present.

In General Formulae (TP1) and (TP2), a case where X is present means that X (anion) is present, aside from the molecule of the triarylmethane structure. A case where the anion is present, aside from the molecule of the triarylmethane structure means that the triarylmethane structure and the anion are not bonded via a covalent bond, but are present as another compound. Hereinafter, the anion, aside from the molecule of the triarylmethane structure, is also referred to as a counter anion.

Examples of the counter anion include a fluorine anion, a chlorine anion, a bromine anion, an iodine anion, a cyanide ion, a perchloric acid anion, a borate anion ($BF_4^-$ or the like), $PF_6^-$, and $SbF_6^-$.

Examples of the borate anion include a group represented by $B(R^{10})_4^-$, and examples of $R^{10}$ include a fluorine atom, a cyano group, a fluoroalkyl group, an alkoxy group, and an aryloxy group.

The counter anion may be a compound having an anion moiety. That is, an anion moiety may be included as a part of the structure of a compound. In a case where the anion moiety may be included as a part of the structure of the compound, it may be included in a part of a polymer having a repeating unit or may be included in a so-called low-molecular compound having a molecular weight of 2,000 or less. In a case of the low-molecular compound, an aspect in which at least one of an alkyl group, an aryl group, or a crosslinkable group is included, in addition to an anion moiety, is exemplified. In the present invention, an aspect in which the counter anion is a compound containing a cross-linkable group, and an aspect in which the counter anion includes a polymer including a repeating unit having an anion moiety are preferable.

In a case where the counter anion has a compound having an anion moiety, the anion moiety is preferably at least one selected from $—SO_3^-$, $—COO^-$, $—PO_3^-$, and a structure represented by General Formula (A1), and a structure represented by General Formula (A2).

General Formula (A1)

(In General Formula (A1), $R^1$ and $R^2$ each independently represent $—SO_2—$ or $—CO—$.)

In General Formula (A1), it is preferable that at least one of $R^1$ or $R^2$ represents $—SO_2—$, and it is more preferable that both of $R^1$ and $R^2$ represent $—SO_2—$.

Moreover, General Formula (A1) preferably represents General Formula (A1-1).

General Formula (A1-1)

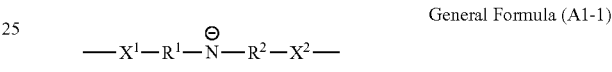

(In General Formula (A1-1), R and $R^2$ each independently represent $—SO_2—$ or $—CO—$. $X^1$ and $X^2$ each independently represent an alkylene group or an arylene group.)

In General Formula (A1-1), $R^1$ and $R^2$ have the same definitions as $R^1$ and $R^2$, respectively, in General Formula (A1), and preferred ranges thereof are also the same.

In a case where $X^1$ represents an alkylene group, the number of carbon atoms in the alkylene group is preferably 1 to 8, and more preferably 1 to 6. In a case where $X^1$ represents an arylene group, the number of carbon atoms in the arylene group is preferably 6 to 18, more preferably 6 to 12, and still more preferably 6. In a case where $X^1$ has a substituent, the substituent is preferably a fluorine atom.

$X^2$ is preferably an alkylene group, an arylene group, or an alkylene group. The number of carbon atoms in the alkylene group is preferably 1 to 8, more preferably 1 to 6, still more preferably 1 to 3, and particularly preferably 1. In a case where $X^2$ has a substituent, the substituent is preferably a fluorine atom.

General Formula (A2)

(In General Formula (A2), $R^3$ represents $—SO_2—$ or $—CO—$. $R^4$ and $R^5$ each independently represent $—SO_2—$, $—CO—$, or $—CN$.)

In General Formula (A2), it is preferable that at least one of $R^3$, . . . , or $R^5$ represents $—SO_2—$, and it is more preferable that at least two of $R^3$, . . . , or $R^5$ represent $—SO_2—$.

In a case where the counter anion is a compound having an anion moiety, specific examples of the anion moiety are $R—SO_3^-$, $R—COO^-$, or $R—PO_4^-$, which includes a case where R is a halogen atom, an alkyl group which may be substituted with a halogen atom, or an aryl group which may be substituted with a halogen atom.

Furthermore, specific examples of a compound including the structure represented by General Formula (A1) include a compound in which $R^1$ is bonded to a halogen atom, an alkyl group which may be substituted with a halogen atom, or an aryl group which may be substituted with a halogen atom.

In addition, specific examples of the compound including the structure represented by General Formula (A2) include a case where $R^4$ and $R^5$ are each a halogen atom, an alkyl group which may be substituted with a halogen atom, or an aryl group which may be substituted with a halogen atom.

In a case where the counter anion is a compound having an anion moiety, the counter anion is preferably a compound including a bis(sulfonyl)imide anion, a compound including a tris(sulfonyl)methide anion, or a compound including a sulfonic acid anion.

The compound including a bis(sulfonyl)imide anion may be a monomer or a polymer. The compound including a bis(sulfonyl)imide anion is preferably represented by General Formula (AN1).

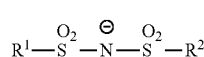

General Formula (AN1)

In General Formula (AN1), $R^1$ and $R^2$ each independently represent an alkyl group or an aryl group. $R^1$ and $R^2$ may be bonded to each other to form a ring.

$R^1$ represents an alkyl group or an aryl group. The alkyl group may be in any one of linear, branched, and cyclic forms. The number of carbon atoms in the alkyl group is preferably 1 to 6, and more preferably 1 to 3. The alkyl group may have a substituent, and the substituent is preferably a fluorine atom. The number of carbon atoms in the alkyl group substituted with a fluorine atom is preferably 1 to 6, and more preferably 1 to 3. In particular, a perfluoroalkyl group is preferable, and a perfluoromethyl group is more preferable.

The number of carbon atoms in the aryl group is preferably 6 to 18, and more preferably 6 to 12. The aryl group is preferably an aryl group substituted with a fluorine atom.

$R^2$ has the same definition as $R^1$, and a preferred range thereof is also the same.

As a specific example of the compound including a bis(sulfonyl)imide anion, a bis(trifluoromethanesulfonyl) imide anion is preferable. By adopting such a configuration, the heat resistance of a cured film obtained from a coloring composition can further be improved.

The compound including a tris(sulfonyl)methide anion is preferably a compound represented by General Formula (AN2).

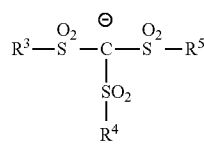

General Formula (AN2)

In General Formula (AN2), $R^3$ to $R^5$ each independently represent an alkyl group or an aryl group.

$R^3$ represents an alkyl group or an aryl group. The alkyl group may be in any one of linear, branched, and cyclic forms. The number of carbon atoms in the alkyl group is preferably 1 to 6, and more preferably 1 to 3. The alkyl group may have a substituent, and the substituent is preferably a fluorine atom. The number of carbon atoms in the alkyl group substituted with a fluorine atom is preferably 1 to 6, and more preferably 1 to 3. In particular, a perfluoroalkyl group is preferable, and a perfluoromethyl group is more preferable.

The number of carbon atoms in the aryl group is preferably 6 to 18, and more preferably 6 to 12. The aryl group is preferably an aryl group substituted with a fluorine atom.

$R^4$ has the same definition as $R^3$, and a preferred range thereof is also the same.

$R^5$ has the same definition as $R^3$, and a preferred range thereof is also the same.

As a specific example of the compound including a tris(sulfonyl)methide anion, a tris(trifluoromethanesulfonyl) methide anion is preferable.

The compound including a sulfonic acid anion is preferably represented by General Formula (AN3).

General Formula (AN3)

In Formula (AN3), R represents an alkyl group or an aryl group. In a case where R represents an alkyl group, an alkyl group substituted with a fluorine atom is preferable. The number of carbon atoms in the alkyl group is preferably 1 to 6, and more preferably 1 to 3. In particular, a perfluoroalkyl group is preferable, and a perfluoromethyl group is more preferable.

In a case where R represents an aryl group, an aryl group substituted with a fluorine atom is preferable. The number of carbon atoms in the aryl group is preferably 6 to 18, and more preferably 6 to 12.

As a specific example of the compound including a sulfonic acid anion, a trifluoromethanesulfonic acid anion is preferable.

Specific examples of the other counter anion include the following ones, but the present invention is not limited thereto. In the present specification, specific examples of the following other counter anions are also referred to as a "counter anion A".

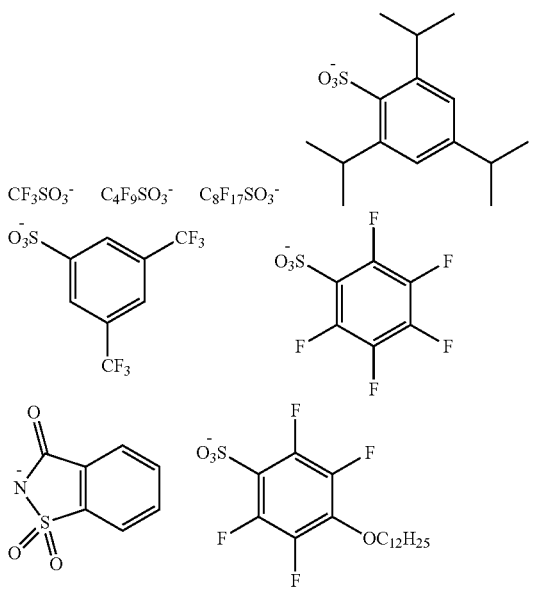

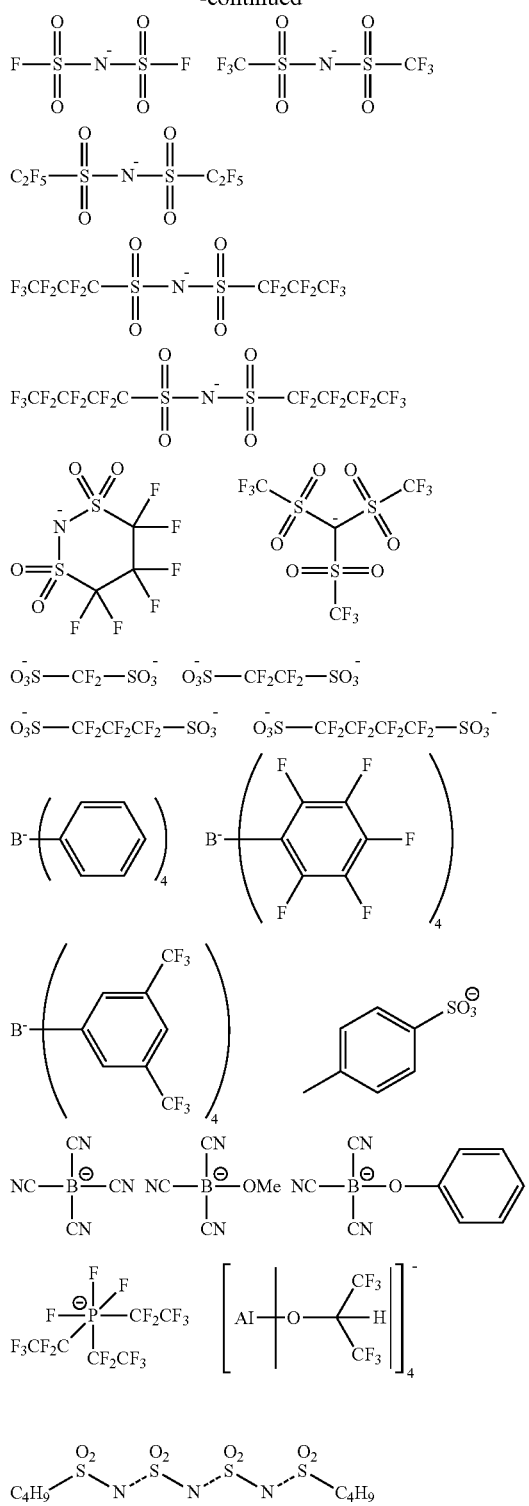

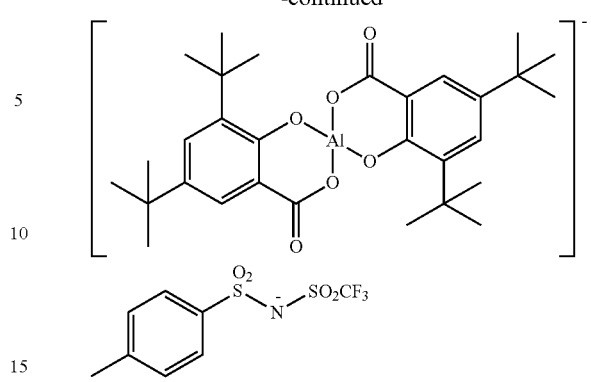

Next, a case where the counter anion is a compound including a crosslinkable group will be described.

Examples of the crosslinkable group include known polymerizable groups which can be crosslinked by a radical, an acid, or heat. Specific examples thereof include a (meth)acryloyl group, a styryl group, a vinyl group, a cyclic ether group, and a group represented by —C—O—R (in which R represents a hydrogen atom or an alkyl group having 1 to 20 carbon atoms), and the crosslinkable group is preferably a (meth)acryloyl group, a styryl group, a vinyl group, or a cyclic ether group, more preferably a (meth)acryloyl group, a styryl group, or a vinyl group, and still more preferably a (meth)acryloyl group or a styryl group.

The number of the crosslinkable groups in the compound including a crosslinkable group is preferably 1 to 3, and more preferably 1.

Moreover, the crosslinkable group and the counter anion may be directly bonded or may also be bonded via a linking group, but they are preferably bonded via a linking group.

Specific preferred examples of a case where the counter anion is a compound including a crosslinkable group include those represented by General Formula (B).

General Formula (B)

$$\begin{array}{c} P \\ | \\ L \\ | \\ \text{anion} \end{array}$$

(In General Formula (B), P represents a crosslinkable group. L represents a single bond or a divalent linking group, anion represents the counter anion.)

In General Formula (B), P represents a crosslinkable group, and examples thereof include the above-mentioned crosslinkable groups.

In General Formula (B), in a case where L represents a divalent linking group, L is preferably an alkylene group having 1 to 30 carbon atoms, an arylene group having 6 to 30 carbon atoms, a heterocyclic linking group, —CH=CH—, —O—, —S—, —C(=O)—, —CO—, —NR—, —CONR—, —OC—, —$SO_2^-$, or a linking group formed by combination of two or more of these groups. Here, R's each independently represent a hydrogen atom, an alkyl group, an aryl group, or a heterocyclic group.

In particular, the linking group represented by L is preferably a linking group formed by combination of two or more of an alkylene group having 1 to 10 carbon atoms, an arylene group having 6 to 12 carbon atoms, —NH—, —CO—, —O—, and —$SO_2$—.

In a case where the counter anion is a compound including a crosslinkable group, the counter anion may have a functional group other than the crosslinkable group. Examples of the functional group other than the crosslinkable group include an acid group. Examples of the acid group include a carboxyl group, a sulfo group, and a phosphoric acid group. In a case where the counter anion has an acid group as the functional group other than the crosslinkable group, the number of the acid groups in the counter anion is preferably 1 to 3, and more preferably 1.

Specific examples of a case where the counter anion is a compound including a crosslinkable group include the structures described in paragraph No. 0083 of WO2015/046285A, the contents of which are incorporated herein by reference.

The molecular weight of the compound including a crosslinkable group is preferably 200 to 2,000, and more preferably 200 to 500.

Next, a case where the counter anion is a polymer (hereinafter also referred to as an anion multimer) including a repeating unit having an anion moiety will be described.

The anion multimer may have an anion moiety in the side chain of the repeating unit, may have an anion moiety in the main chain of the repeating unit, or may have anion moieties in both of the main chain and the side chain of the repeating unit.

The anion multimer is preferably represented by General Formula (C) and/or General Formula (D).

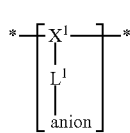

General Formula (C)

(In General Formula (C), $X^1$ represents the main chain of a repeating unit. $L^1$ represents a single bond or a divalent linking group, anion represents an anion moiety.)

In General Formula (C), $X^1$ represents the main chain of a repeating unit, usually represents a linking group formed by a polymerization reaction, and is preferably (meth) acrylic, styrene-based, vinyl-based, or the like. Further, the structure between two *'s becomes a repeating unit.

$L^1$ represents a single bond or a divalent linking group. In a case where $L^1$ represents a divalent linking group, $L^1$ is preferably an alkylene group having 1 to 30 carbon atoms, an arylene group having 6 to 30 carbon atoms, a heterocyclic linking group, —CH=CH—, —O—, —S—, —COO—, —CO—, —NR—, —CONR—, —OCO—, —SO$_2$—, or a linking group formed by combination of two or more of these groups. Here, R's each independently represent a hydrogen atom, an alkyl group, an aryl group, or a heterocyclic group.

$L^1$ is more preferably a single bond, or a divalent linking group formed by combination of two or more of an alkylene group having 1 to 10 carbon atoms, an arylene group having 6 to 12 carbon atoms, —NH—, —CO$_2$—, —O—, and —SO$_2$—.

Among the anion multimers (C), those represented by General Formula (AN4) are preferable.

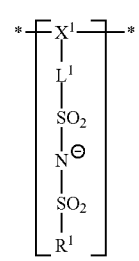

General Formula (AN4)

In Formula (AN4), $X^1$ represents the main chain of a repeating unit. $L^1$ represents a single bond or a divalent linking group. $R^1$ represents an alkyl group or an aryl group.

$X^1$ and $L^1$ have the same definitions as $X^1$ and $L^1$, respectively, in General Formula (C), and preferred ranges thereof are also the same.

$R^1$ represents an alkyl group or an aryl group. The alkyl group may be in any one of linear, branched, and cyclic forms. The number of carbon atoms in the alkyl group is preferably 1 to 6, and more preferably 1 to 3. The alkyl group may have a substituent, and the substituent is preferably a fluorine atom. The number of carbon atoms in the alkyl group substituted with a fluorine atom is preferably 1 to 6, and more preferably 1 to 3. In particular, a perfluoroalkyl group is preferable, and a perfluoromethyl group is more preferable. The number of carbon atoms in the aryl group is preferably 6 to 18, and more preferably 6 to 12. The aryl group is preferably an aryl group substituted with a fluorine atom.

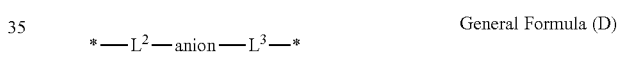

General Formula (D)

(In General Formula (D), $L^2$ and $L^3$ each independently represent a single bond or a divalent linking group, anion represents an anion moiety.)

In General Formula (D), $L^2$ and $L^3$ each independently represent a single bond or a divalent linking group. In a case where $L^2$ and $L^3$ each represent a divalent linking group, $L^2$ and $L^3$ are each preferably an alkylene group having 1 to 30 carbon atoms, an arylene group having 6 to 30 carbon atoms, a heterocyclic linking group, —CH=CH—, —O—, —S—, —CO—, —COO—, —NR—, —CONR—, —OCO—, —SO$_2$—, or a linking group formed by combination of two or more of these groups. Here, R's each independently represent a hydrogen atom, an alkyl group, an aryl group, or a heterocyclic group.

$L^2$ is more preferably an arylene group having 6 to 12 carbon atoms (particularly a phenylene group). In the arylene group having 6 to 12 carbon atoms, at least one of hydrogen atoms is preferably substituted with a fluorine atom.

$L^3$ is more preferably a group formed by combination of an arylene group having 6 to 12 carbon atoms (particularly a phenylene group) with —O—. Further, in the arylene group having 6 to 12 carbon atoms, at least one of hydrogen atoms is preferably substituted with a fluorine atom.

The anion multimer may contain a repeating unit having a polymerizable group. In a case where the repeating unit having a polymerizable group is contained, the amount thereof is, for example, preferably 10 to 50 mol, and more preferably 10 to 30 mol, with respect to 100 mol of all the repeating units.

Furthermore, the anion multimer may contain a repeating unit having an acid group. In a case where the repeating unit having an acid group is contained, the amount thereof is, for example, preferably 10 to 50 mol, and more preferably 10 to 30 mol, with respect to 100 mol of all the repeating units.

The weight-average molecular weight of the anion multimer is preferably 1,000 to 30,000, and more preferably 3,000 to 20,000.

In a case of forming the anion multimer, a chain transfer agent may be added. The chain transfer agent is preferably an alkylmercaptan, preferably an alkylmercaptan having 4 or more carbon atoms, or an alkylmercaptan substituted with a carboxyl group, an ether group, or an ester group.

The content of the halogen ions included in the anion multimer is preferably 10 to 3,000 ppm, more preferably 10 to 2,000 ppm, and still more preferably 10 to 1,000 ppm.

Specific examples of the anion multimer include the structures described in paragraph Nos. 0034 and 0035 of JP2015-030742A, and the structures described in paragraph Nos. 0095 and 0096 of WO2015/046285A, the contents of which are incorporated herein by reference.

As for the triarylmethane structure represented by General Formula (TP1) and the triarylmethane structure represented by General Formula (TP2), the cations thereof are present in the state of being non-localized as follows, and the following structures have the same definitions, all of which are intended to be encompassed by the present invention.

group having 6 to 10 carbon atoms; $Rtp_{71}$ represents an alkyl group or an aryl group; X represents an anion, or X is not present and at least one of $Rtp_{21}$, $Rtp_{22}$, or $Rtp_{71}$ includes an anion; and any one of $Rtp_{21}$, $Rtp_{22}$, and $Rtp_{71}$ has a site for binding to the repeating unit A.

In General Formula (TP3), $Rtp_{21}$ is preferably an alkyl group having 1 to 6 carbon atoms. The alkyl group may be in any one of linear, branched, and cyclic forms, but is preferably linear. The number of carbon atoms in the alkyl group is preferably 1 to 4, and more preferably 1 to 3. Examples of the substituent which may be contained in the alkyl group include the substituents mentioned in the section of a substituent group A which will be described later. By adopting such a configuration, the light resistance of a cured film obtained from the coloring composition can further be improved.

In General Formula (TP3), $Rtp_{22}$ represents an aryl group having 6 to 10 carbon atoms. $Rtp_{22}$ is preferably an aryl group having at least a substituent at an ortho position. Examples of the substituent which may be contained in the aryl group include the substituents mentioned in the section of the substituent group A which will be described later, and

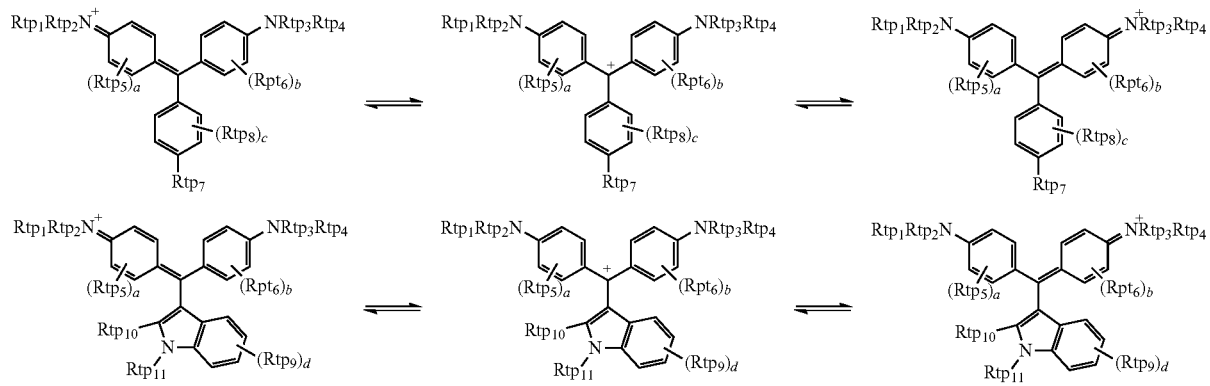

The triarylmethane structure is preferably represented by General Formula (TP3).

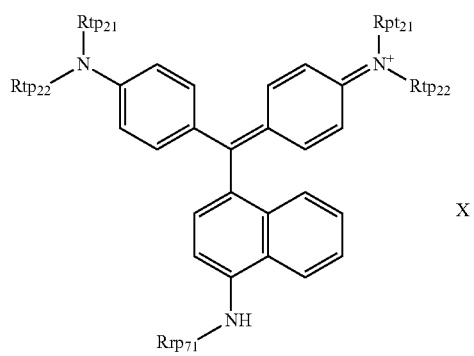

In General Formula (TP3), $Rtp_{21}$'s each independently represent a hydrogen atom or an alkyl group having 1 to 6 carbon atoms; $Rtp_{22}$'s each independently represent an aryl the substituent is preferably an alkyl group having 1 to 3 carbon atoms. By adopting such a configuration, the heat resistance of a cured film obtained from the coloring composition can further be improved.

$Rtp_{71}$ represents an alkyl group or an aryl group, and is preferably alkyl group. The alkyl group may be in any one of linear, branched, and cyclic forms, and is preferably cyclic. The number of carbon atoms in the alkyl group is preferably 1 to 8, and more preferably 1 to 6. The number of carbon atoms in the aryl group is preferably 6 to 12, and more preferably 6 to 10.

Any one of $Rtp_{21}$, $Rtp_{22}$, and $Rtp_{71}$ has a site for binding to the repeating unit A, and $Rtp_{71}$ preferably has a site for binding to the repeating unit.

The triarylmethane structure (TP3) is preferably represented by General Formula (TP3A).

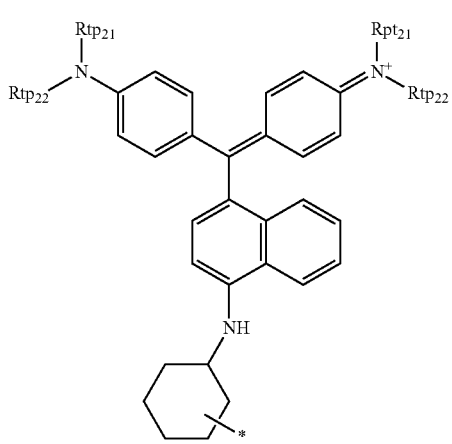

TP3A

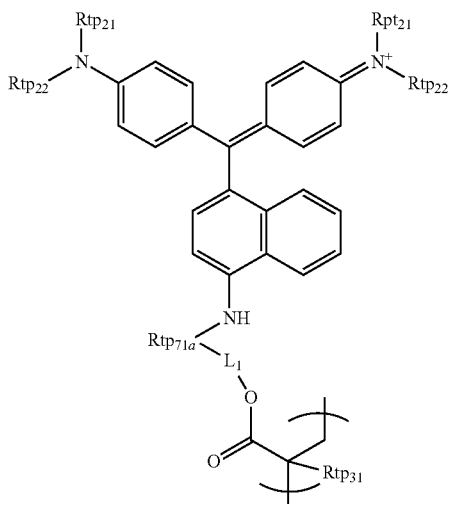

TP3-1

In General Formula (TP3A), $Rtp_{21}$'s each independently represent a hydrogen atom or an alkyl group having 1 to 6 carbon atoms; $Rtp_{22}$'s each independently represent an aryl group having 6 to 10 carbon atoms; X represents an anion, or X is not present and at least one of $Rtp_{21}$ or $Rtp_{22}$ includes an anion; and * represents a site for binding to the repeating unit A.

Detail of $Rtp_{21}$ and $Rtp_{22}$ are the same as those of $Rtp_{21}$ and $Rtp_{22}$, respectively, in General Formula (TP3), and preferred ranges thereof are also the same.

Substituent Group A:

Examples of the substituent include a halogen atom, an alkyl group, an alkenyl group, an alkynyl group, an aryl group, a heterocyclic group, a cyano group, a hydroxyl group, an alkoxy group, an aryloxy group, a silyloxy group, a heterocyclic oxy group, an acyloxy group, a carbamoyloxy group, an amino group (including an alkylamino group and an aniline group), an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imido group, a phosphino group, a phosphinyl group, a phosphinyloxy group, a phosphinylamino group, and a silyl group. With regard to the details of the substituent group A, reference can be made to the description in paragraph Nos. 0174 to 0185 of JP2015-034966A, the contents of which are incorporated herein by reference.

<<<<Preferred Aspect of Repeating Unit A>>>>

The repeating unit A is preferably represented by General Formula (TP3-1).

In General Formula (TP3-1), $Rtp_{21}$'s each independently represent a hydrogen atom or an alkyl group having 1 to 6 carbon atoms; $Rtp_{22}$'s each independently represent an aryl group having 6 to 10 carbon atoms; $Rtp_{71a}$ represents an alkylene group or an arylene group; $L_1$ represents a single bond or a divalent linking group; $Rtp_{31}$ represents a hydrogen atom or a methyl group; and X represents an anion, or X is not present and at least one of $Rtp_{21}$ or $Rtp_{22}$ includes an anion.

$Rtp_{21}$ and $Rtp_{22}$ have the same definitions as $Rtp_{21}$ and $Rtp_{22}$, respectively, in General Formula (TP3), as described above, and preferred ranges thereof are also the same.

$Rtp_{71a}$ represents an alkylene group or an arylene group, and is preferably an alkylene group. The alkylene group may be in any one of linear, branched, and cyclic forms, and is preferably cyclic. The number of carbon atoms in the alkylene group is preferably 1 to 8, and more preferably 1 to 6. The number of carbon atoms in the arylene group is preferably 6 to 12, and more preferably 6 to 10. The alkylene group and the arylene group may each have a substituent or may be unsubstituted, and are preferably unsubstituted. Examples of the substituent include the substituents mentioned in the above-mentioned substituent group A.

$L_1$ represents a single bond or a divalent linking group. $L_1$ has the same definition as $L^1$ in General Formula (A) as described above, and a preferred range thereof is also the same.

In General Formula (TP3-1), the number of atoms constituting a chain connecting the main chain of the repeating unit A with a nitrogen atom to which $Rtp_{71a}$ of the triarylmethane structure is bonded in the "-$Rtp_{71a}$-$L_1$-" moiety is preferably 1 or more, more preferably 2 or more, and still more preferably 3 or more. The upper limit is preferably, for example, 20 or less. According to this aspect, it is possible to suppress the low-molecular triarylmethane compound which has not been reacted or has been insufficiently reacted at the time of the synthesis of the polymer TP. As a result, the heat resistance and the solvent resistance of a cured film obtained from the coloring composition can be improved.

The repeating unit A is preferably represented by General Formula (TP3-2).

TP3-2

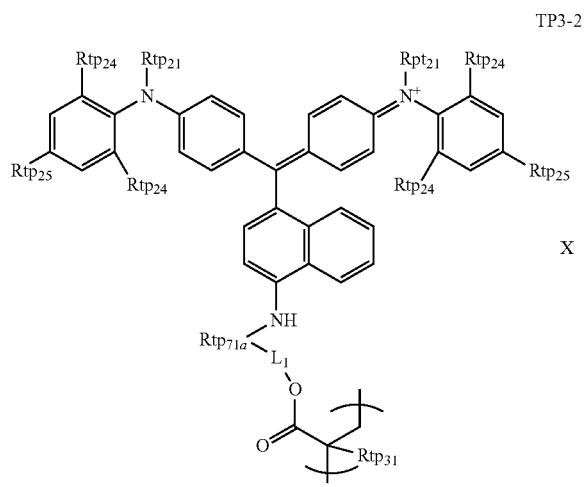

TP3-3

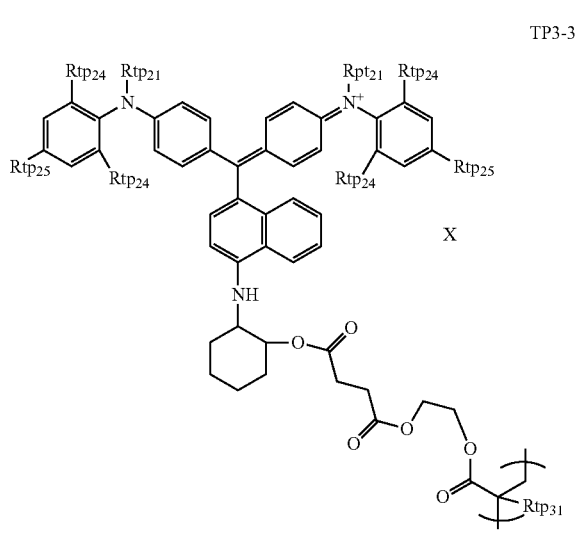

In General Formula (TP3-2), $Rtp_{21}$'s each independently represent a hydrogen atom or an alkyl group having 1 to 6 carbon atoms; $Rtp_{24}$'s each independently represent an alkyl group having 1 to 4 carbon atoms; $Rtp_{25}$'s each independently represent a hydrogen atom or an alkyl group having 1 to 3 carbon atoms; $Rtp_{71a}$ represents an alkylene group or an arylene group; $Rtp_{31}$ represents a hydrogen atom or a methyl group; $L_1$ represents a single bond or a divalent linking group; and X represents an anion, or X is not present and at least one of $Rtp_{21}$, $Rtp_{24}$, or $Rtp_{25}$ includes an anion.

$Rtp_{21}$ has the same definition as $Rtp_{21}$ in General Formula (TP3) as described above, and a preferred range thereof is also the same. $Rtp_{21}$'s are each independently preferably an alkyl group having 1 to 3 carbon atoms. The alkyl group is preferably linear.

$Rtp_{24}$'s each independently represent an alkyl group having 1 to 4 carbon atoms, and are each preferably an alkyl group having 1 or 2 carbon atoms.

$Rtp_{25}$'s each independently represent a hydrogen atom or an alkyl group having 1 to 3 carbon atoms, but in a case where they each represent an alkyl group having 1 to 3 carbon atoms, the number of carbon atoms in the alkyl group is preferably 1 or 2.

$Rtp_{71a}$ has the same definition as $Rtp_{71a}$ in General Formula (TP3-1) as described above, a preferred range thereof is also the same.

$L_1$ has the same definition as $L_1$ in General Formula (TP3-1) as described above, and a preferred range thereof is also the same.

The repeating unit A is preferably represented by General Formula (TP3-3).

In General Formula (TP3-3), $Rtp_{21}$'s each independently represent a hydrogen atom or an alkyl group having 1 to 6 carbon atoms; $Rtp_{24}$'s each independently represent an alkyl group having 1 to 4 carbon atoms; $Rtp_{25}$'s each independently represent a hydrogen atom or an alkyl group having 1 to 3 carbon atoms; $Rtp_{31}$ represents a hydrogen atom or a methyl group; and X represents an anion. $Rtp_{21}$, $Rtp_{24}$, $Rtp_{25}$, and $Rtp_{31}$ in General Formula (TP3-3) have the same definitions as $Rtp_{21}$, $Rtp_{24}$, $Rtp_{25}$, and $Rtp_{31}$, respectively, in General Formula (TP3-2) as described above, and preferred ranges thereof are also the same.

Specific examples of the repeating unit A include the following structures, but the present invention is not limited thereto. Further, specific examples of the repeating unit A also include a repeating unit derived from a monomer having a triarylmethane structure which will be described later. In the following structures, X is an anion.

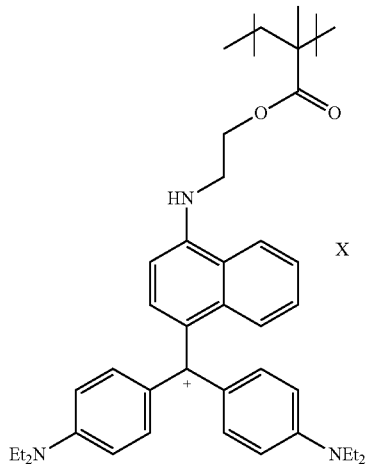

33
-continued
34
-continued
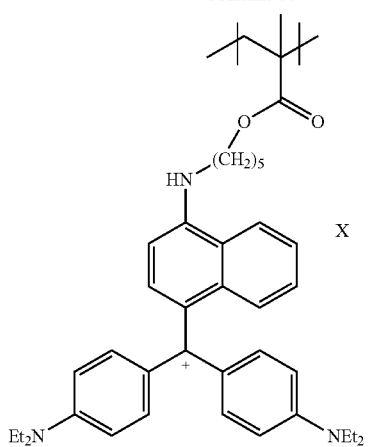
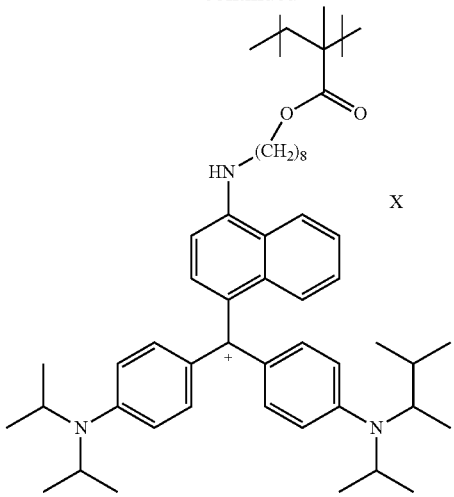
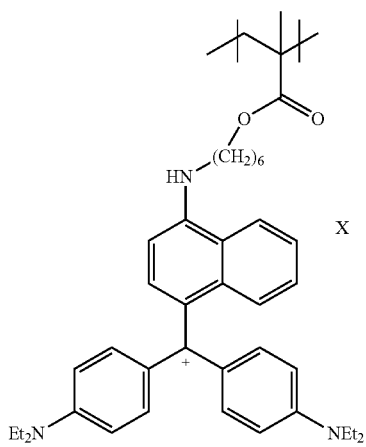
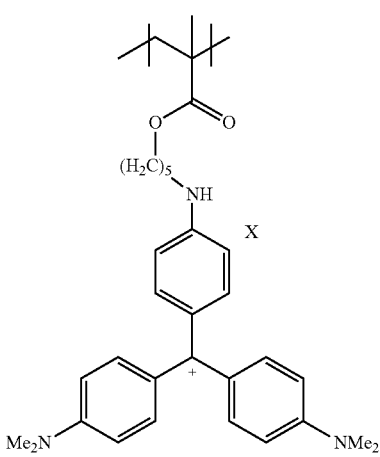
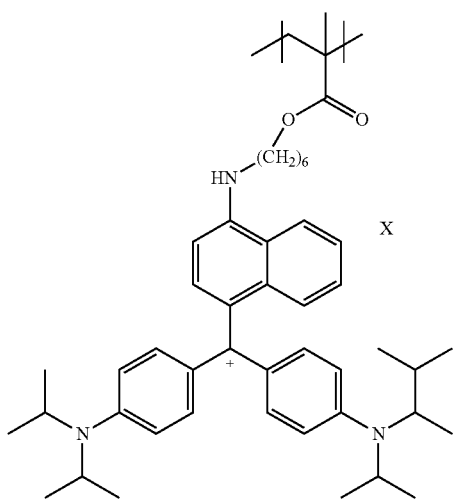
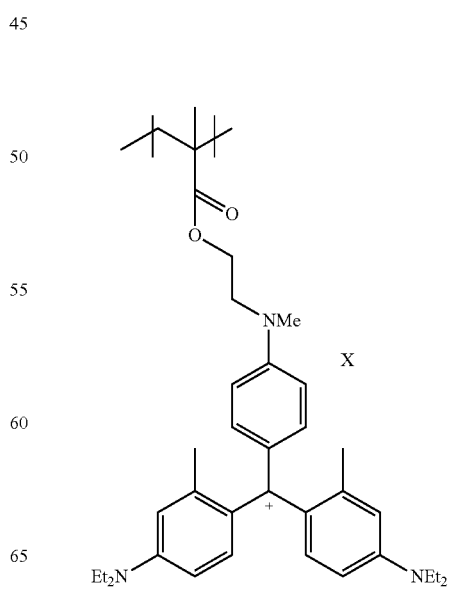

35
-continued
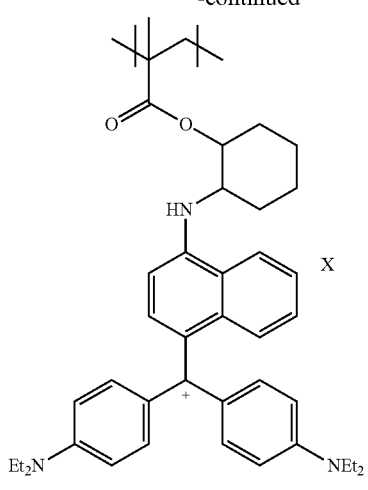
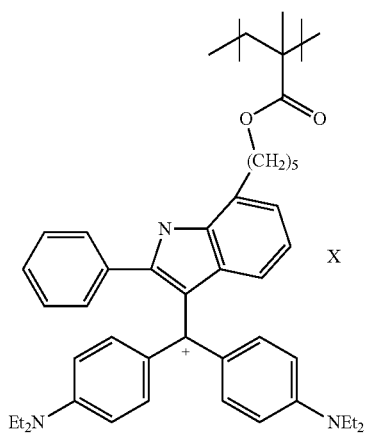
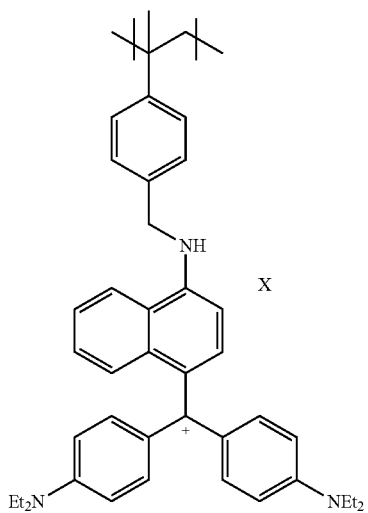
36
-continued
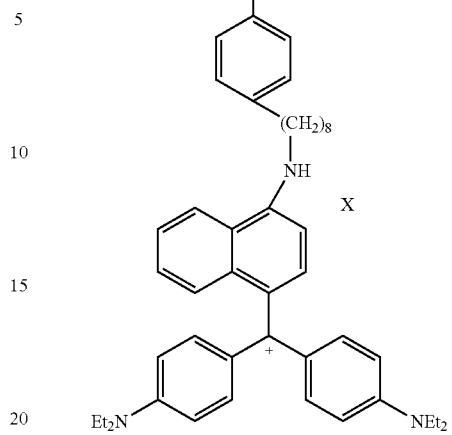
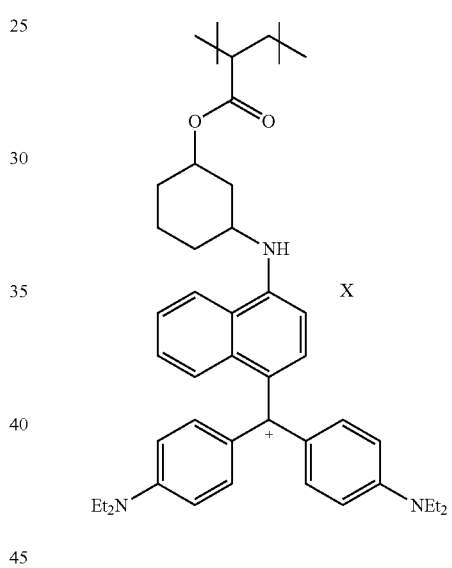
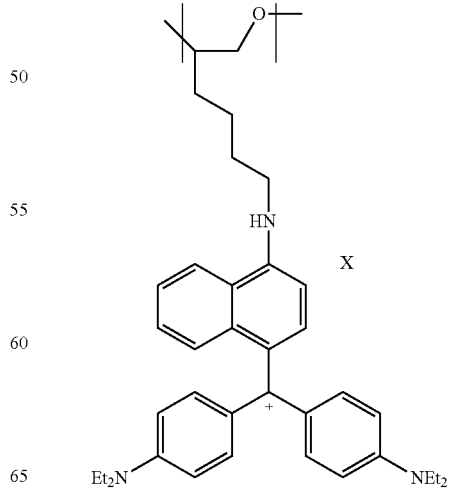

37
-continued
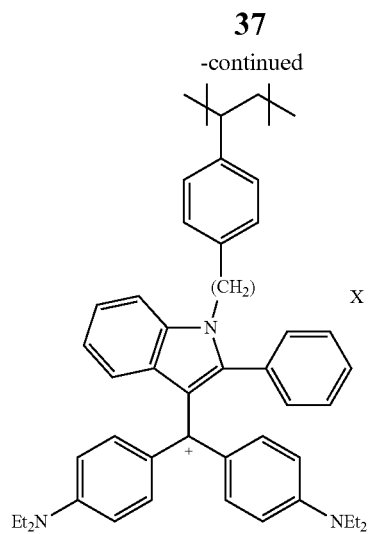
X
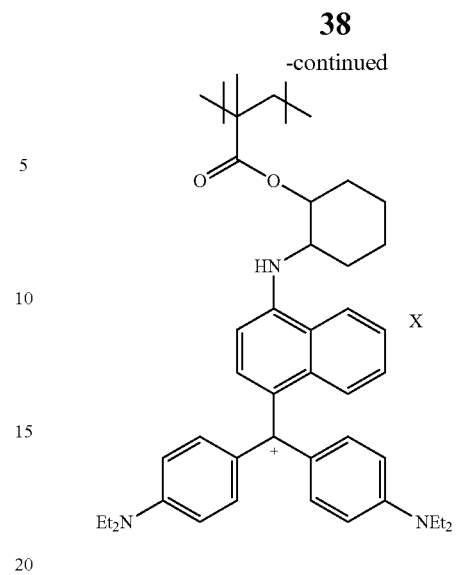
38
-continued
X
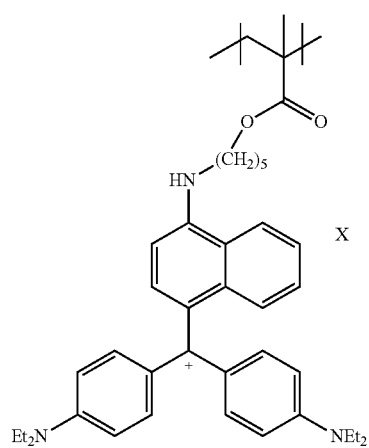
X
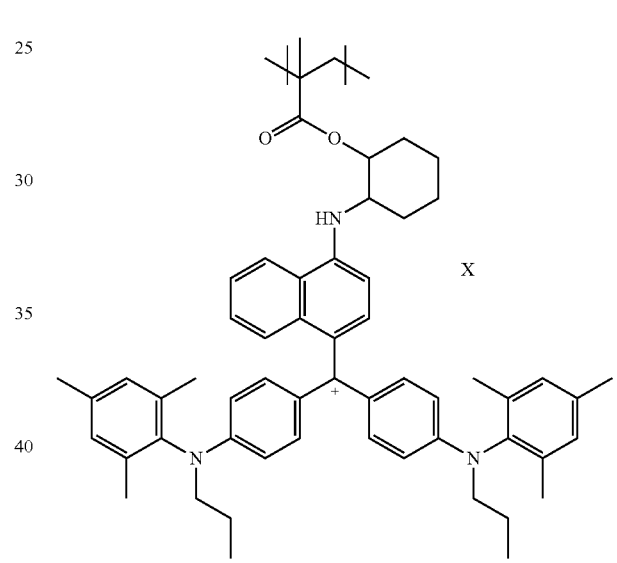
X
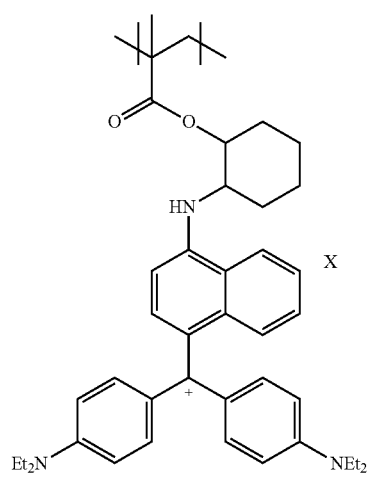
X
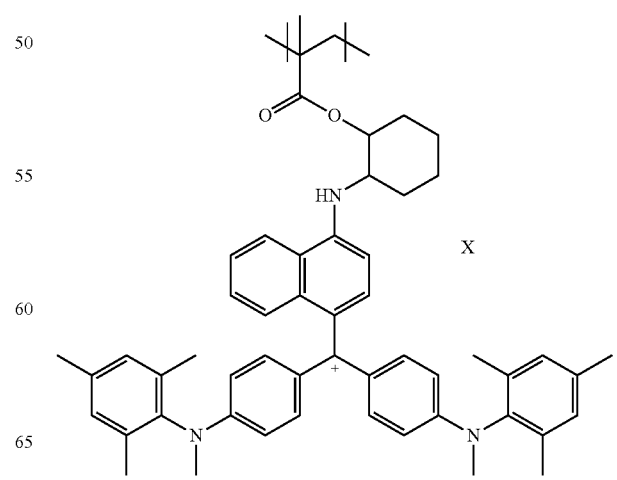
X 39
-continued
40
-continued
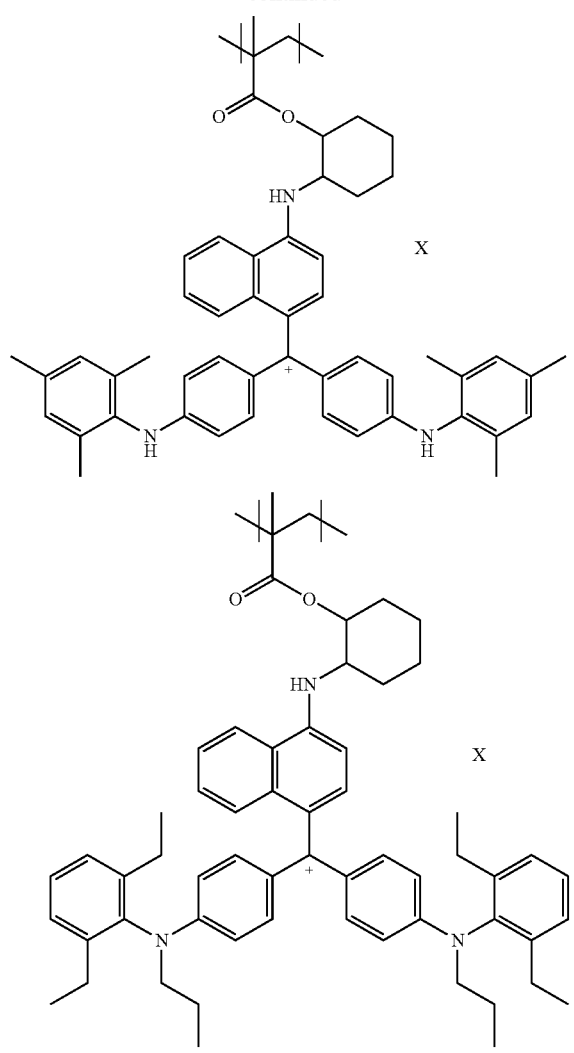
X
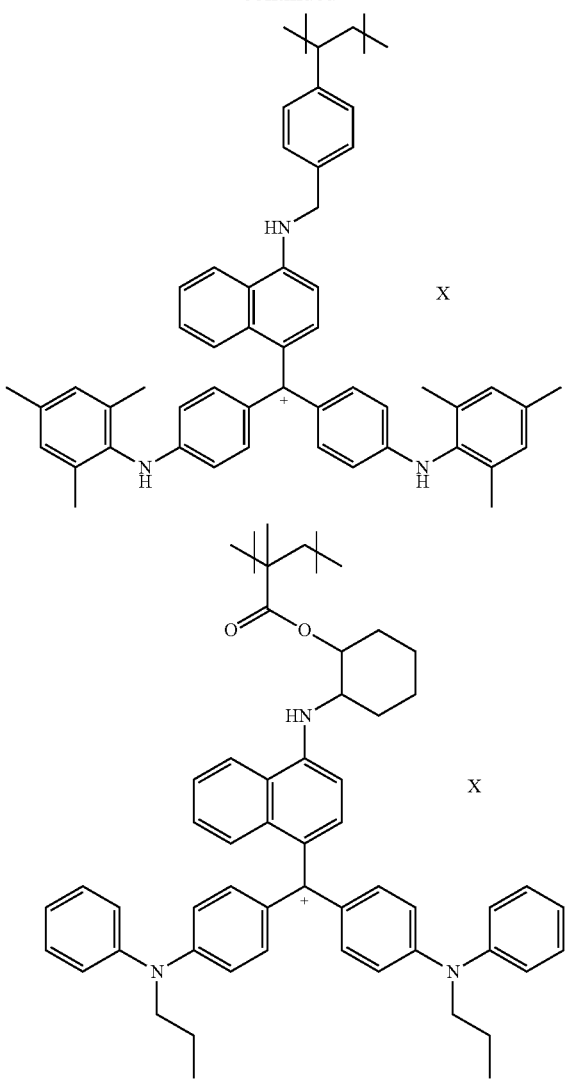
X
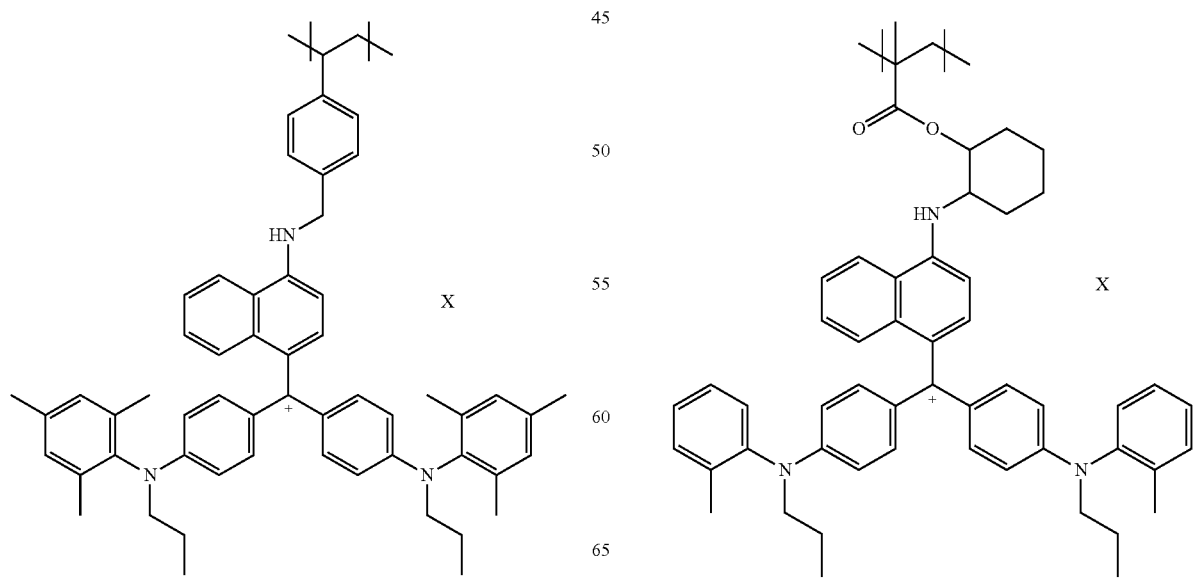
X

41
-continued
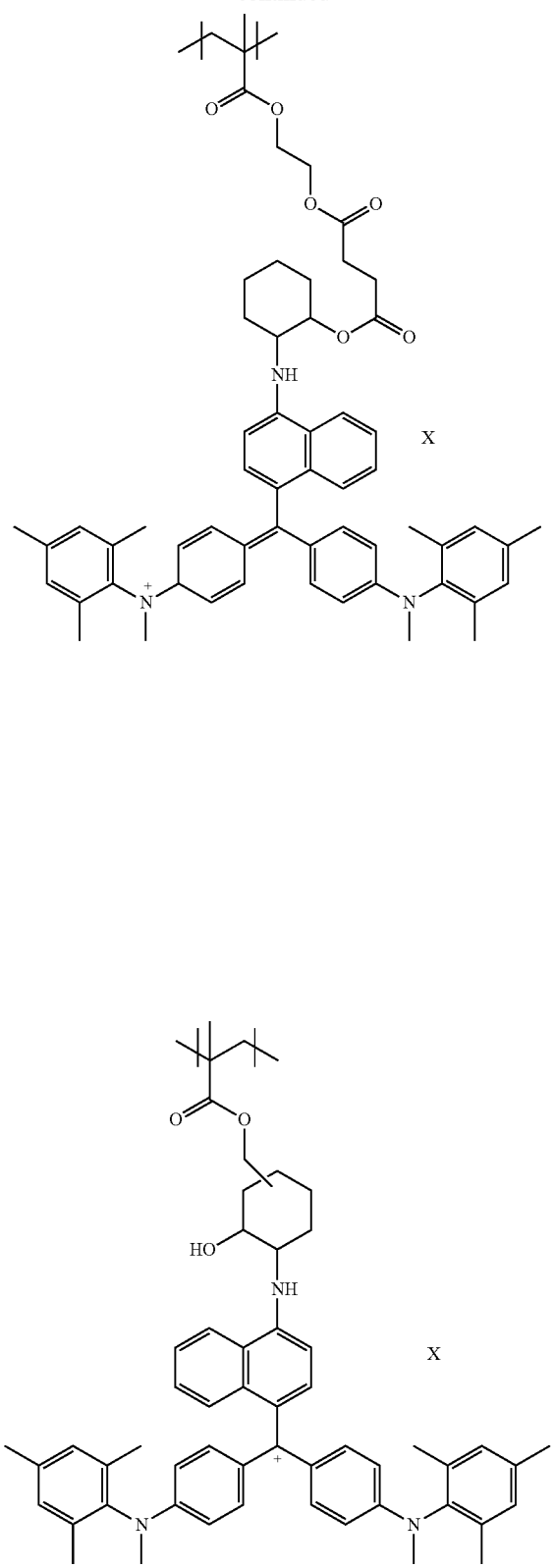
42
-continued
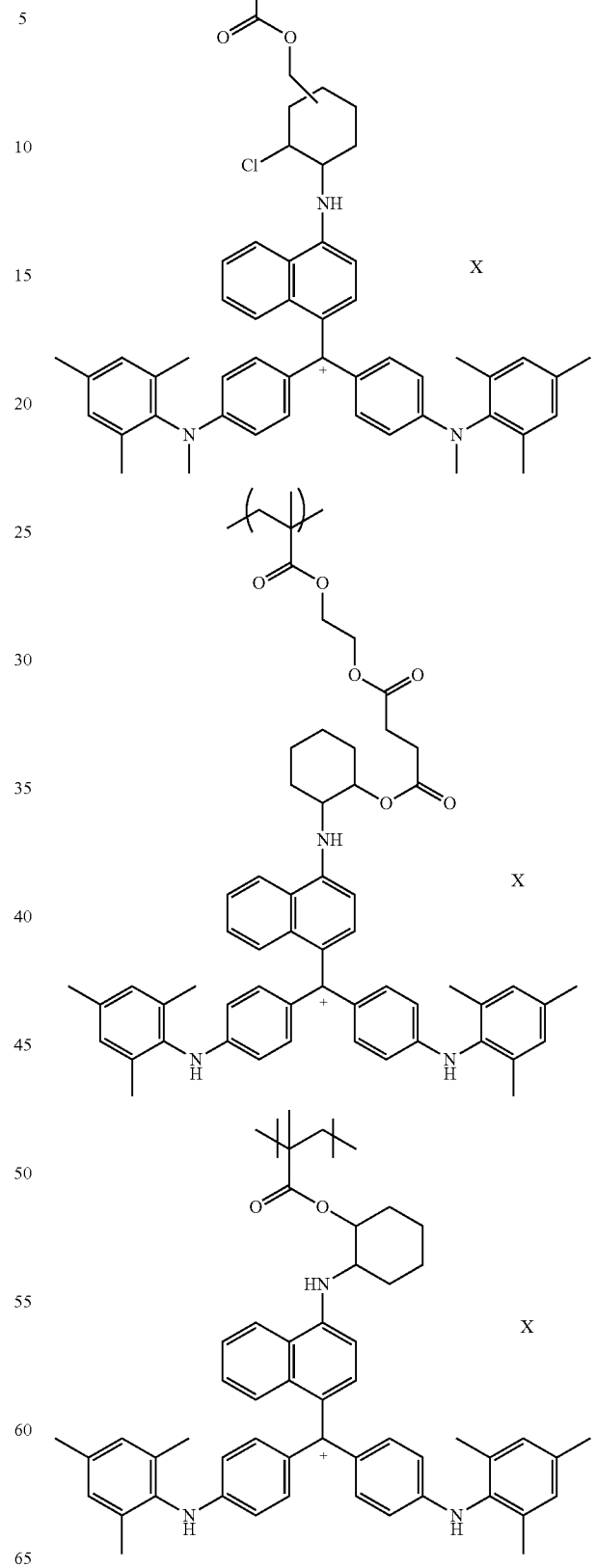

<<<Repeating Unit B>>>

The polymer TP includes a repeating unit B having an acid group. The repeating unit B is preferably included in the amount of 12% to 60% by mass with respect to all the repeating units of the polymer TP. The upper limit is more preferably 55% by mass or less, still more preferably 50% by mass or less, and even still more preferably 45% by mass or less. The lower limit can be set to, for example, 15% by mass or more, or to 20% by mass or more. If the content of the repeating unit B is within the above range, the heat resistance and the solvent resistance of a cured film obtained from the coloring composition are particularly excellent. Further, if the content of the repeating unit B is 12% by mass or more, the heat resistance and the solvent resistance of a cured film obtained from the coloring composition are particularly excellent. Moreover, the voltage holding ratio is also good. Further, if the content of the repeating unit B is 60% by mass or less, the pattern forming properties obtained from the coloring composition are good, and thus, a fine pattern is easily formed.

Examples of the type of the acid group include a carboxyl group, a hydroxyl group, a phosphoric acid group, and a sulfo group. Among these, a carboxyl group is preferable since it is easy to form a cured film having excellent solvent resistance from the coloring composition.

The repeating unit B is preferably a structure represented by General Formula (B).

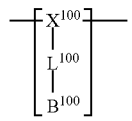

(B)

In General Formula (B), $X^{100}$ represents the main chain of a repeating unit. $L^{100}$ represents a single bond or a divalent linking group. $B^{100}$ represents an acid group.

Examples of the main chain of the repeating unit represented by $X^{100}$ include the structures described in $X^1$ of the General Formula (A) of the repeating unit A, and a preferred range thereof is also the same.

$L^{100}$ represents a single bond or a divalent linking group. Preferred examples of the divalent linking group include an alkylene group, an arylene group, a heterocyclic group, —CH=CH—, —O—, —S—, —CO—, —NR—, —CONR—, —COO—, —OCO—, —SO$_2$—, and a linking group formed by combination of two or more of these groups. Here, R's each independently represent a hydrogen atom, an alkyl group, an aryl group, or a heterocyclic group. Examples of details of the divalent linking group include the divalent linking groups described in $L^1$ of General Formula (A) of the repeating unit A. $L^{100}$ is preferably a single bond.

$B^{100}$ represents an acid group. Example of the acid group include a carboxyl group, a hydroxyl group, a phosphoric acid group, and a sulfo group, and the acid group is preferably a carboxyl group.

The repeating unit B is preferably represented by General Formula (B-1).

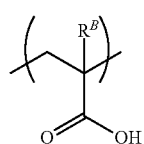

(B-1)

In General Formula (B-1), $R^B$ represents a hydrogen atom or a methyl group.

Specific examples of the repeating unit B include the following ones. However, the present invention is not limited thereto.

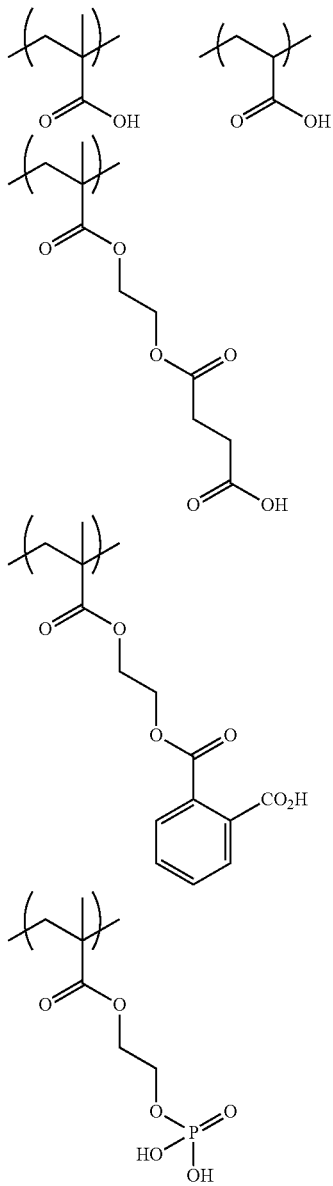

The polymer TP of the present invention is a polymer which does not substantially include repeating units other than the repeating unit A having a triarylmethane structure and the repeating unit B having an acid group. Further, in the present invention, the expression, "the polymer TP does not substantially include other repeating units" means that the repeating units other than the repeating units A and B included in the polymer TP are only impurities included in the raw material monomers of the polymer TP, or repeating units generated from the side reaction during the synthesis. For example, the content of the other repeating units is preferably 1% by mass or less, more preferably 0.1% by mass or less, and still more preferably 0.01% by mass or less, with respect to all the repeating units of the polymer TP, and even still preferably, the other repeating units are not contained.

In the present invention, the weight-average molecular weight of the polymer TP is preferably from 5,000 to 500,000. The lower limit is more preferably 7,000 or more, still more preferably 10,000 or more, and most preferably 20,000 or more. The upper limit is more preferably 200,000 or less, still more preferably 100,000 or less, even still more preferably 70,000 or less, and most preferably 40,000 or less. That is, the weight-average molecular weight of the polymer TP is particularly preferably 10,000 to 70,000, and most preferably 20,000 to 40,000. By adjusting the weight-average molecular weight of the polymer TP to the above-mentioned range, the heat resistance and the solvent resistance of a cured film obtained from the coloring composition are good. Further, the voltage characteristics can be improved.

The number-average molecular weight of the polymer TP is preferably 2,000 to 500,000. The lower limit is more preferably 5,000 or more, still more preferably 7,000 or more, even still more preferably 9,000 or more, and most preferably 10,000 or more. The upper limit is more preferably 100,000 or less, still more preferably 50,000 or less, and particularly preferably 40,000 or less.

The dispersity (weight-average molecular weight/number-average molecular weight) of the polymer TP is preferably 1.0 to 5.0. The upper limit is more preferably 4.0 or less, still more preferably 3.5 or less, and particularly preferably 2.0 or less.

Furthermore, in the present invention, the weight-average molecular weight and the number-average molecular weight of the polymer TP are each a value in terms of a polymethacrylic acid by gel permeation chromatography (GPC) measurement, and specifically a value obtained with HLC-8220GPC (manufactured by Tosoh Corporation), in which three columns, TSKgel SuperAW4000, SuperAW3000, and SuperAW2500 (manufactured by Tosoh Corporation, 7.8 mm (inner diameter)×30 cm), are connected in series, under the measurement condition of a 5 mmol/L sodium trifluoroacetate-containing trifluoroethanol solution as a developing solvent, a flow rate of 0.35 mL/min, a sample injection amount of 20 μL, and a measurement temperature of 40° C., with an ultraviolet detector.

The polymer TP is preferably a polymer represented by General Formula (TP-7), and more preferably a polymer represented by General Formula (TP-8).

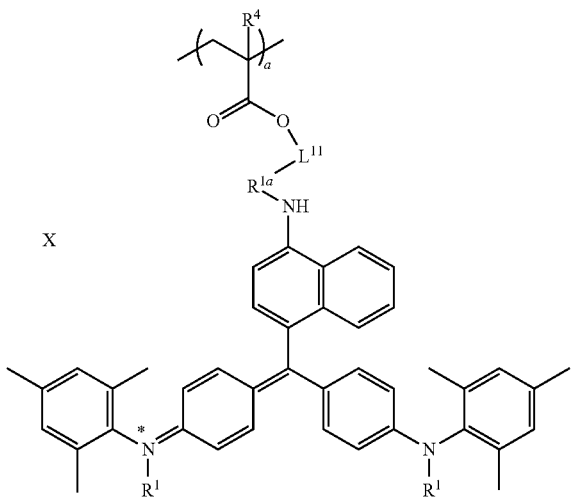

TP-7

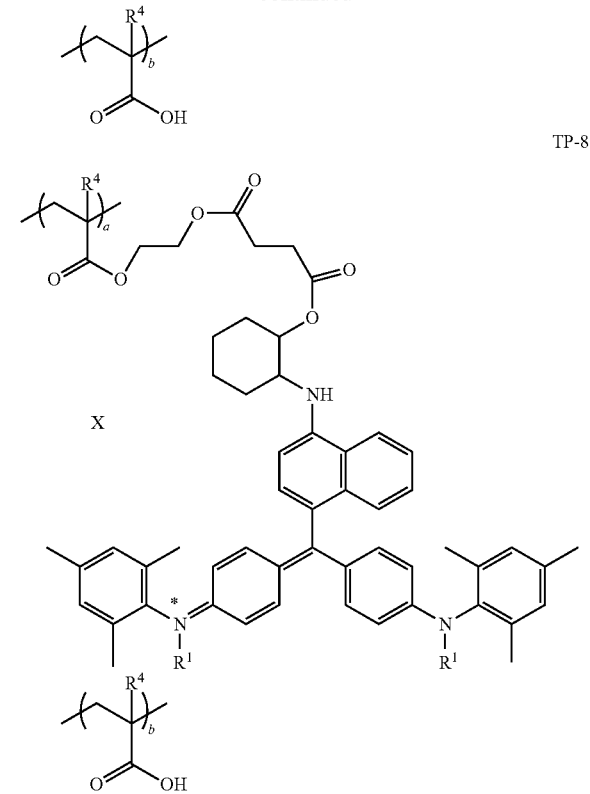

TP-8

In General Formula (TP-7), $R^1$'s each independently represent a hydrogen atom or an alkyl group having 1 to 6 carbon atoms; $R^4$ represents a hydrogen atom or a methyl group; $R^{1a}$ represents an alkylene group or an arylene group; $L^1$ represents a single bond or a divalent linking group having 1 to 30 carbon atoms; X represents a compound including a bis(sulfonyl)imide anion, a tris(sulfonyl)methide anion, or a sulfonic acid anion; and a and b each represent the mass ratio of the repeating units, a represents 40 to 88, b represents 12 to 60, and a+b represents 100.

In General Formula (TP-8), $R^1$'s each independently represent a hydrogen atom or an alkyl group having 1 to 6 carbon atoms; $R^4$ represents a hydrogen atom or a methyl group; X represents a compound including a bis(sulfonyl)imide anion, a tris(sulfonyl)methide anion, or a sulfonic acid anion; and a and b each represent the mass ratio of the repeating units, a represents 40 to 88, b represents 12 to 60, and a+b represents 100.

$R^1$'s each independently represent a hydrogen atom or an alkyl group having 1 to 6 carbon atoms, and are each preferably an alkyl group having 1 to 6 carbon atoms. The number of carbon atoms in the alkyl group is more preferably 1 to 3. The alkyl group is preferably linear.

$R^4$ represents a hydrogen atom or a methyl group, and is preferably a methyl group.

$R^{1a}$ represents an alkylene group or an arylene group, and is preferably an alkylene group. The alkylene group may be in any one of linear, branched, and cyclic forms, and is preferably cyclic. The number of carbon atoms in the alkylene group is preferably 1 to 8, and more preferably 1 to 6. The number of carbon atoms in the arylene group is preferably 6 to 12, and more preferably 6 to 10. The alkylene group and the arylene group may each have a substituent or may be unsubstituted, and they are preferably unsubstituted. Examples of the substituent include the substituents mentioned in the above-mentioned substituent group A.

$L^{11}$ represents a single bond or a divalent linking group having 1 to 30 carbon atoms. Examples of the divalent linking group include an alkylene group having 1 to 30 carbon atoms, an arylene group having 6 to 12 carbon atoms, and a group formed by combination of these with one selected from —CO—, —OCO—, —O—, —NH—, and —SO$_2$—. The divalent linking group is preferably an alkylene group, or a linking group in which alkylene groups are linked via one or more selected from —O—, —COO—, and —OCO—.

In General Formula (TP-7), the number of atoms constituting a chain connecting the main chain of the repeating unit A with a nitrogen atom to which $R^{1a}$ of the triarylmethane structure is bonded in the "-$L^{11}$-$R^{1a}$—" moiety is preferably 1 or more, more preferably 2 or more, and still more preferably 3 or more. The upper limit is preferably, for example, 20 or less.

X represents a compound including a bis(sulfonyl)imide anion, a tris(sulfonyl)methide anion, or a sulfonic acid anion, and is preferably a compound including a bis(sulfonyl)imide anion.

The compound including a bis(sulfonyl)imide anion may be either a monomer or a multimer. The compound including a bis(sulfonyl)imide anion is preferably the compound represented by General Formula (AN1) as described above.

The compound including a tris(sulfonyl)methide anion is preferably the compound represented by General Formula (AN2) as described above.

The compound including a sulfonic acid anion is preferably the compound represented by General Formula (AN3) as described above.

a and b each represent the mass ratio of the repeating units, a represents 40 to 88, b represents 12 to 60, and a+b represents 100. The lower limit of a is preferably 45 or more, more preferably 50 or more, and still more preferably 55 or more. The upper limit of a can be set to, for example, 85 or less, or to 80 or less. The upper limit of b is preferably 55 or less, more preferably 50 or less, and still more preferably 45 or less. The lower limit of b can be set to, for example, 15 or more, or to 20 or more.

Specific examples of the polymer TP in the present invention are shown below, but are not limited thereto.

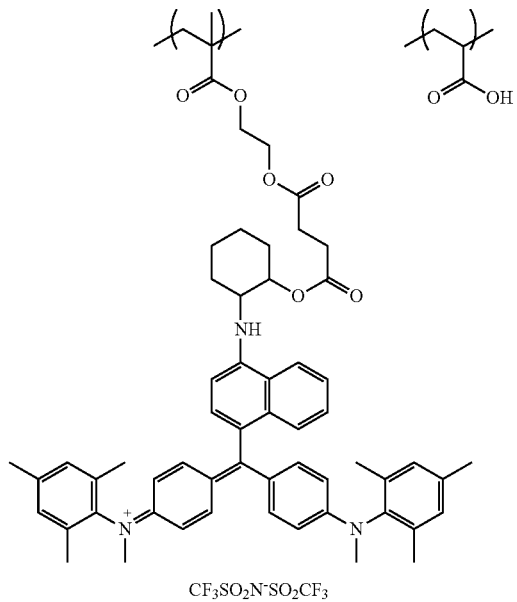

(P-2)

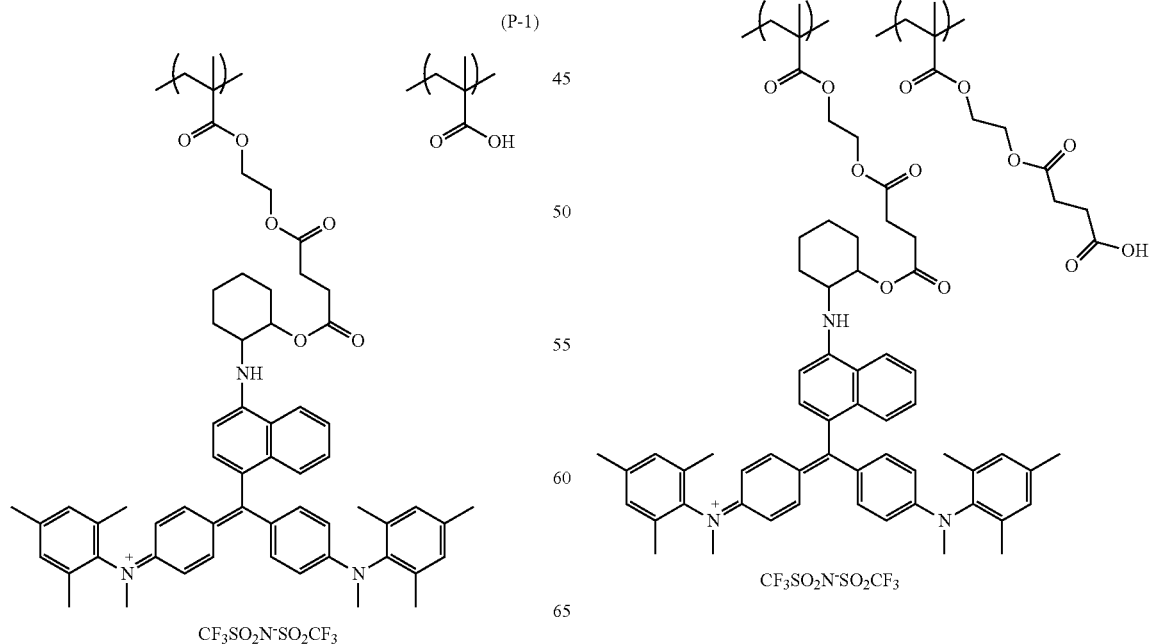

(P-1)

(P-3)

(P-4)
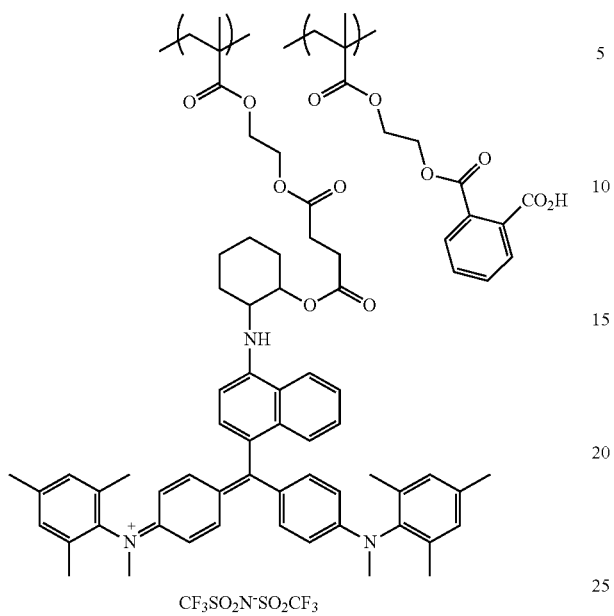
(P-6)
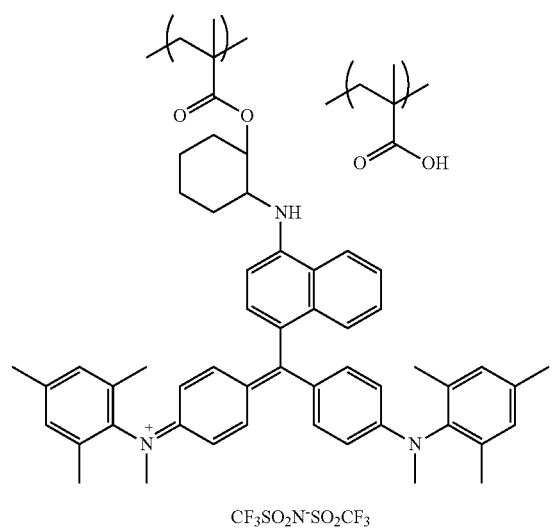
(P-5)
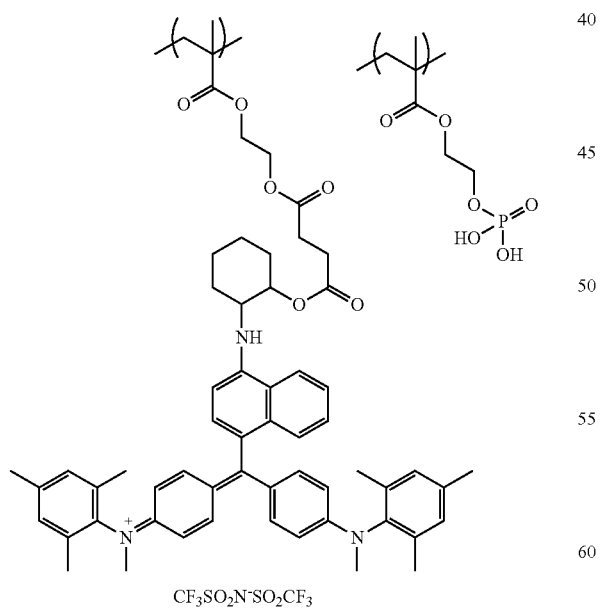
(P-7)
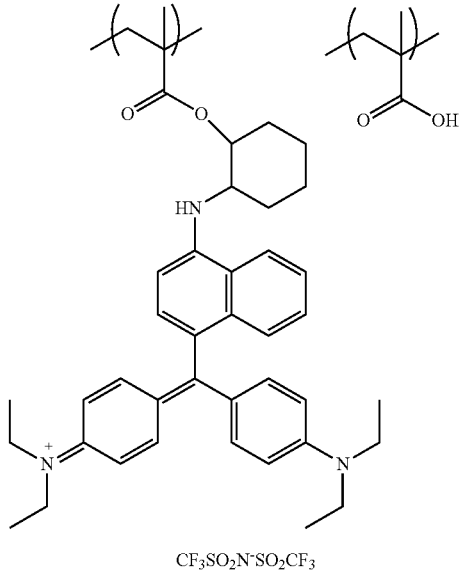

(P-8)
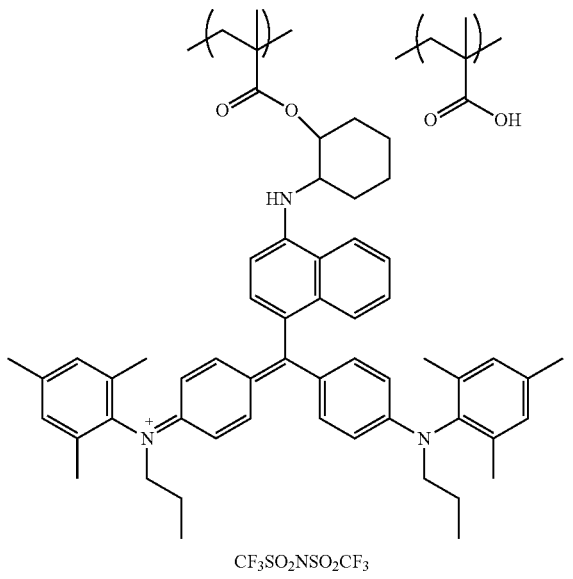
(P-10)
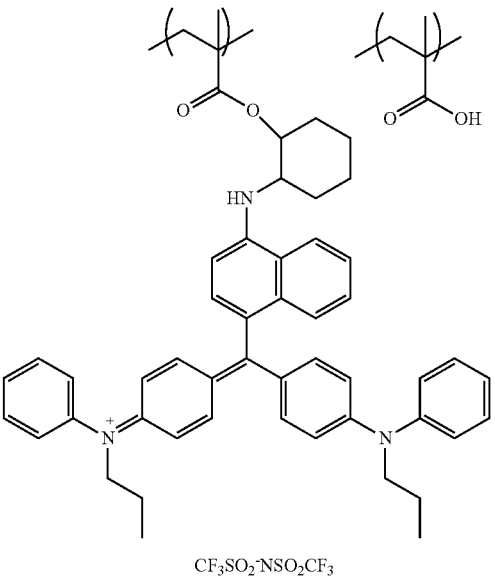
(P-9)
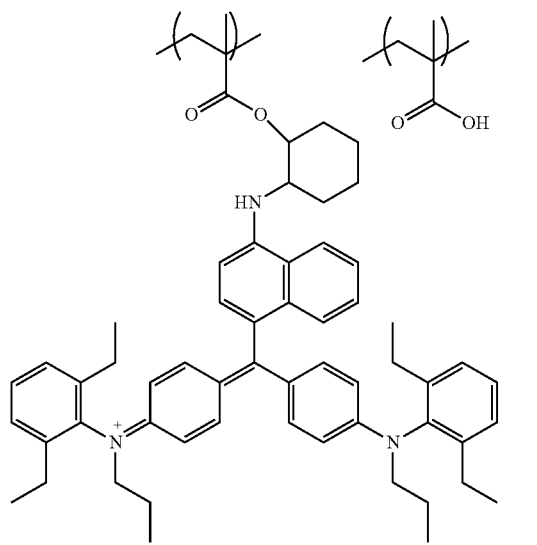
(P-11)

(P-12)
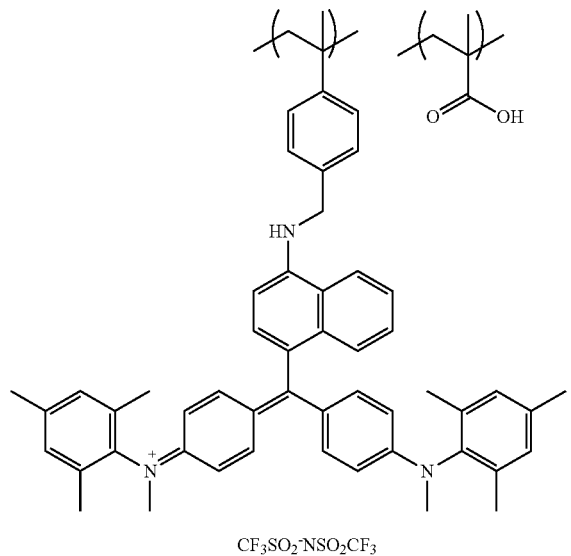
(P-14)
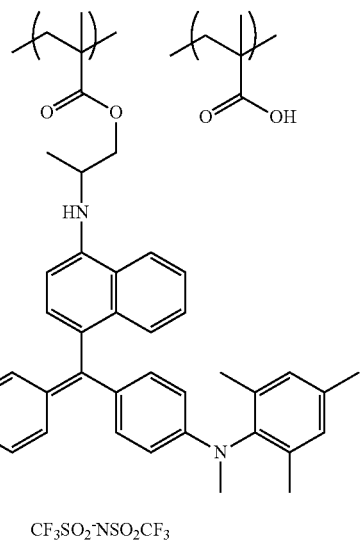
(P-13)
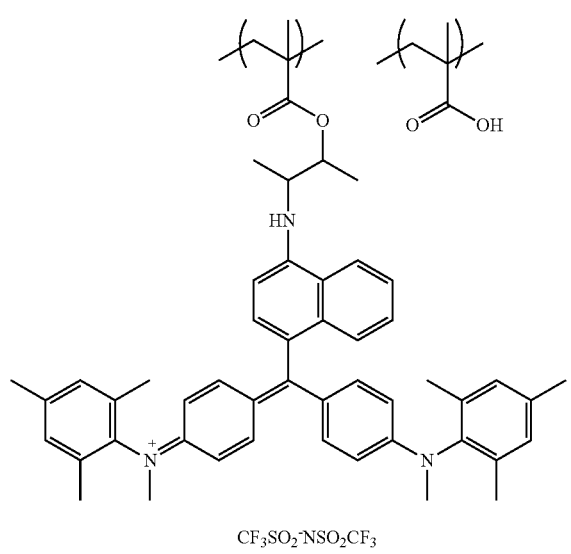
(P-15)
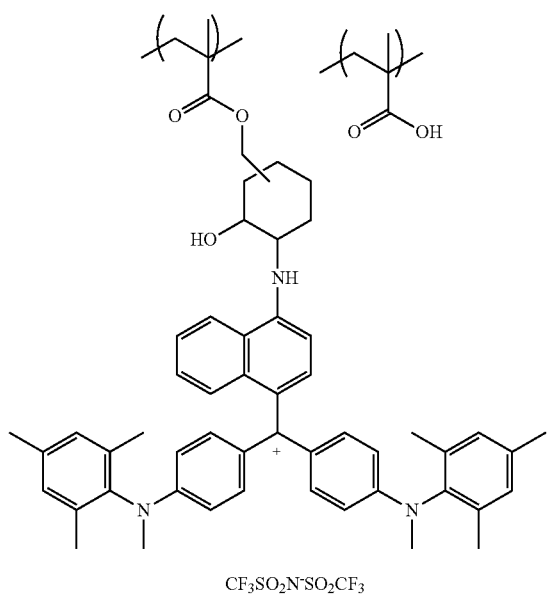

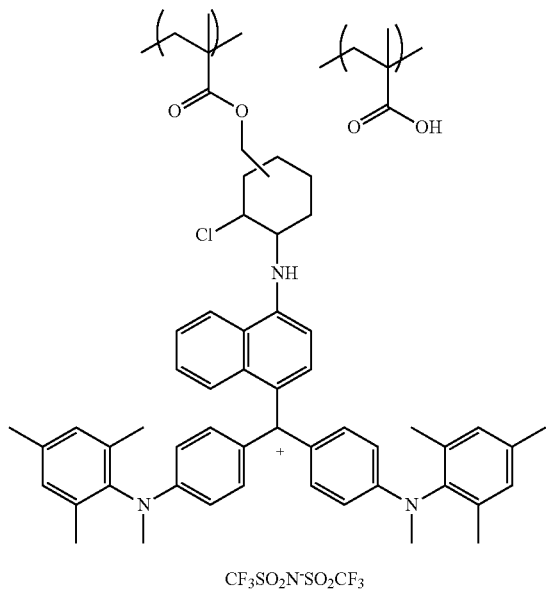

(P-16)

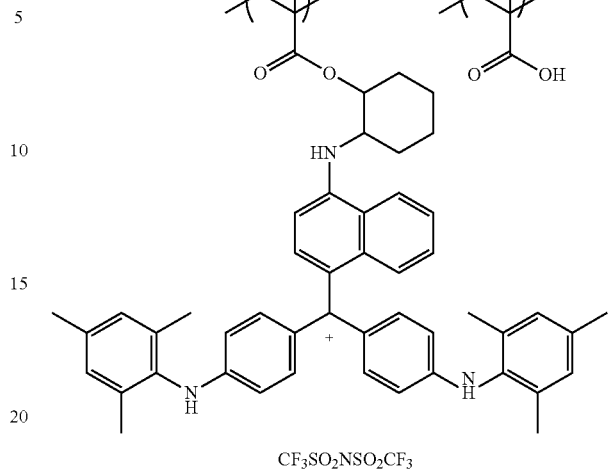

(P-18)

<Method for Producing Polymer TP>

The polymer TP of the present invention can be produced by polymerizing raw material monomers including at least a triarylmethane monomer having a triarylmethane structure represented by at least one selected from General Formulae (TP1a) and (TP2a), and a monomer having an acid group.

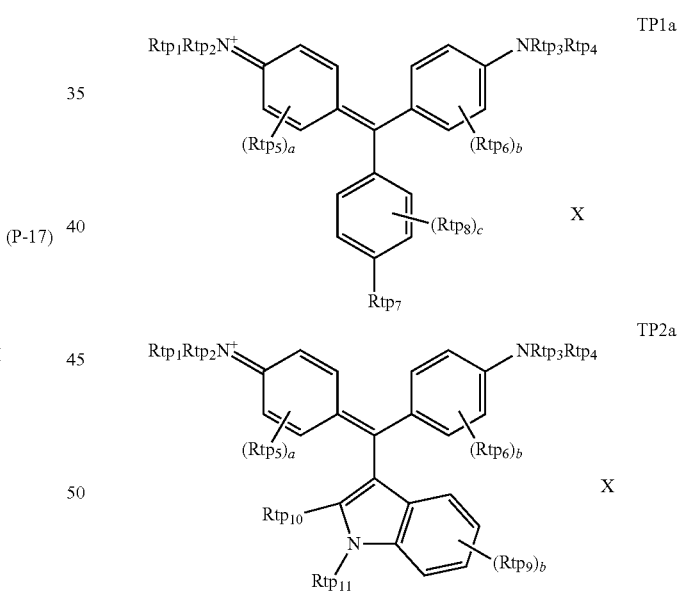

(P-17)

In General Formulae (TP1a) and (TP2a), $Rtp_1$ to $Rtp_4$ each independently represent a hydrogen atom, an alkyl group, or an aryl group; $Rtp_5$, $Rtp_6$, $Rtp_8$, $Rtp_9$, and $Rtp_{11}$ each independently represent a substituent; $Rtp_7$ represents a hydrogen atom, an alkyl group, an aryl group, or $NRtp_{71}Rtp_{72}$; $Rtp_{71}$ and $Rtp_{72}$ each independently represent a hydrogen atom, an alkyl group, or an aryl group; $Rtp_{10}$ represents a hydrogen atom, an alkyl group, or an aryl group; a, b, c, and d each independently represent an integer of 0 to 4; in a case where a is 2 or more, $Rtp_5$'s may be linked to each other to form a ring; in a case where b is 2 or more, $Rtp_6$'s may be linked to each other to form a ring; in a case where c is 2 or more, $Rtp_5$'s may be linked to each other to form a ring; in a case where d is 2 or more, $Rtp_9$'s may be linked to each other to form a ring; and X represents an anion, or X is not present and at least one of $Rtp_1, \ldots$, or $Rtp_{11}$, $Rtp_{71}$, or $Rtp_{72}$ includes an anion.

Examples of $Rtp_1$ to $Rtp_{11}$, $Rtp_{71}$, $Rtp_{72}$, and X include the structures described as $Rtp_1$ to $Rtp_{11}$, $Rtp_{71}$, $Rtp_{72}$, and X in General Formulae (TP1) and (TP2), and preferred ranges thereof are also the same.

Specific examples of the cation structure of the triarylmethane monomer are shown below.

D-30
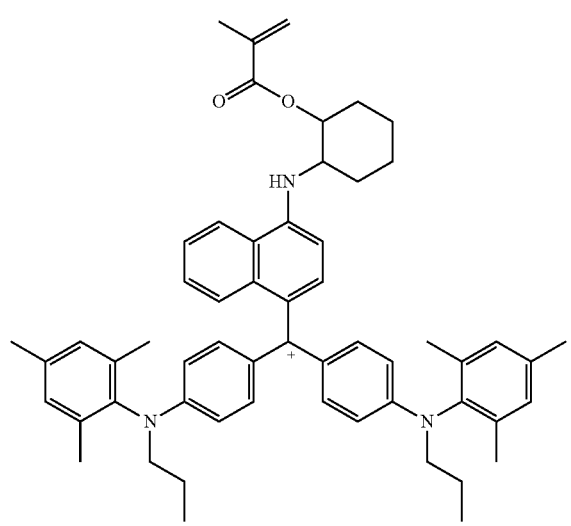

D-31
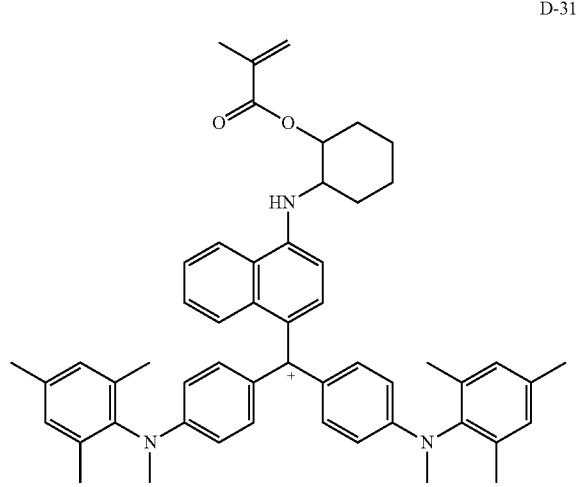

D-32
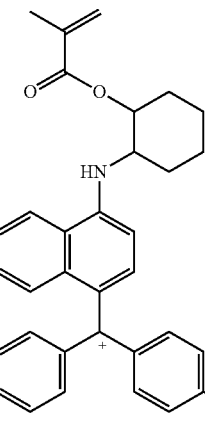

D-33
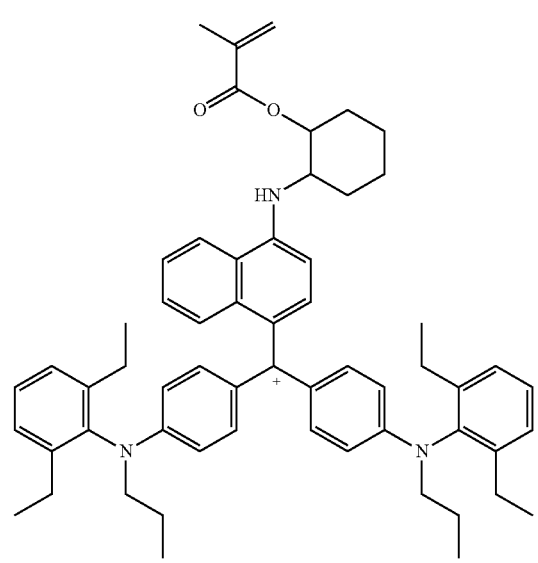

D-34
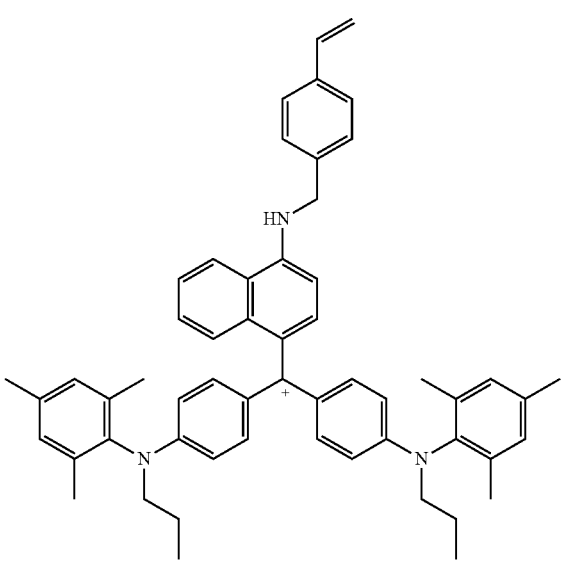

-continued
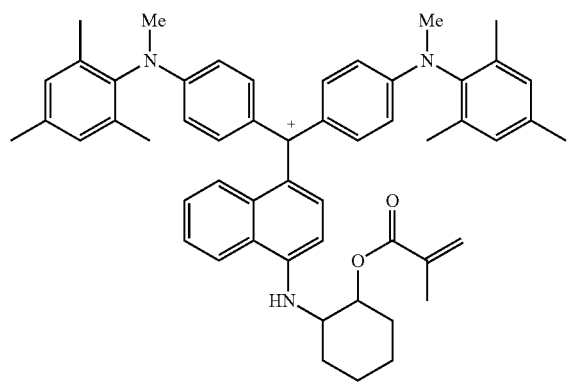
D-A1
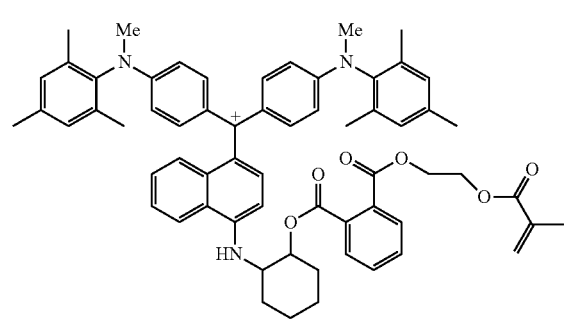
D-A2
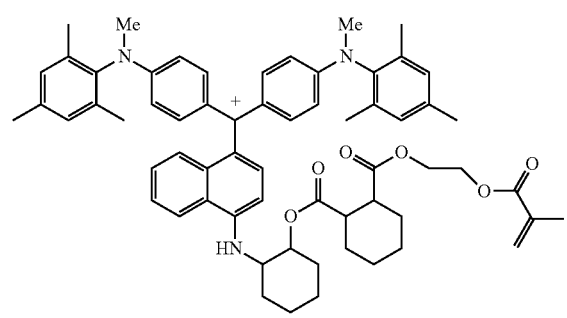
D-A3
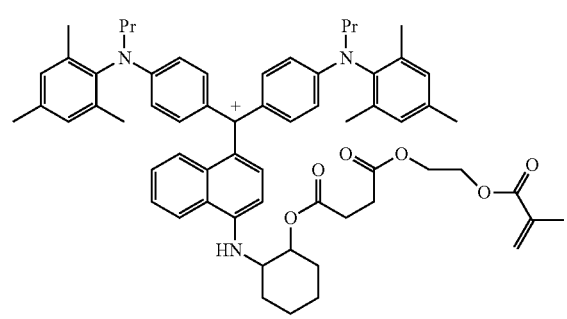
D-A4
-continued
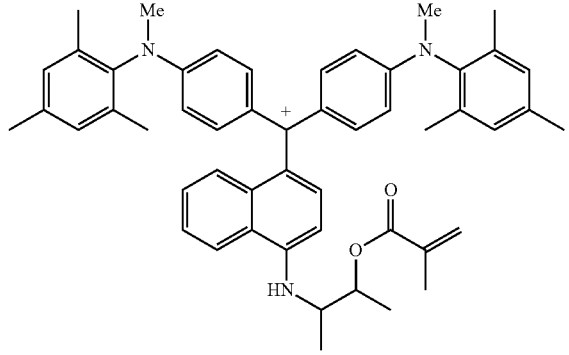
D-A5
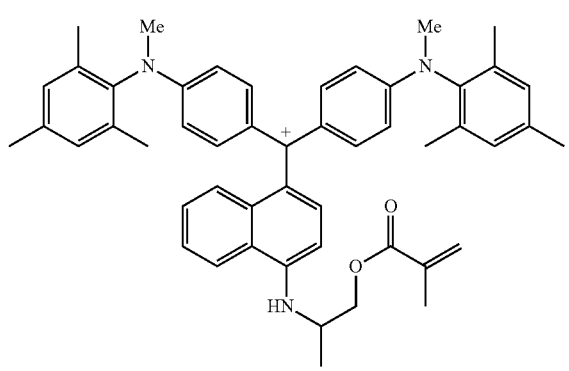
D-A6
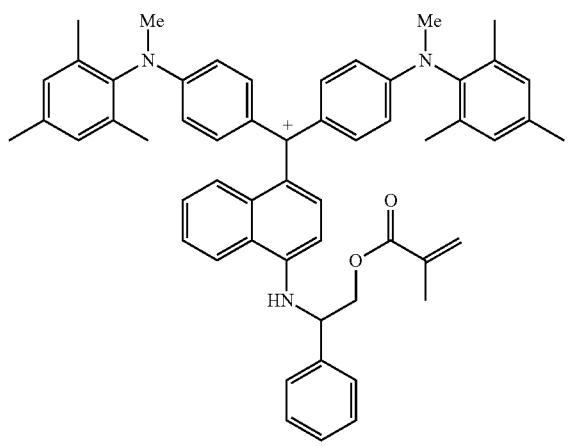
D-A7
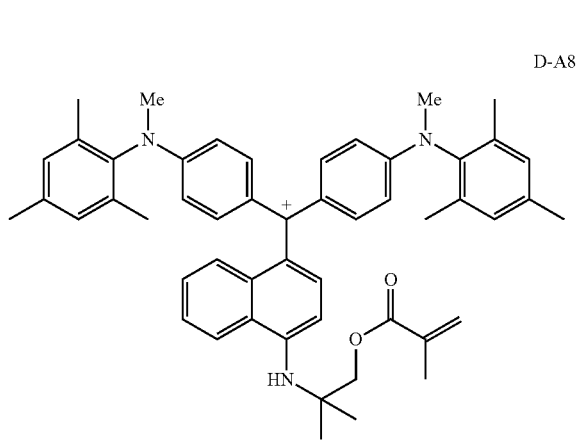
D-A8

-continued

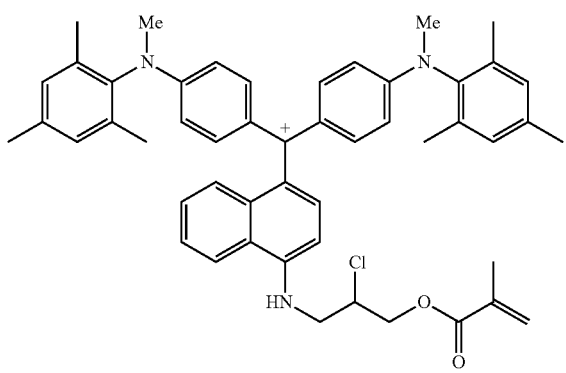

D-A9

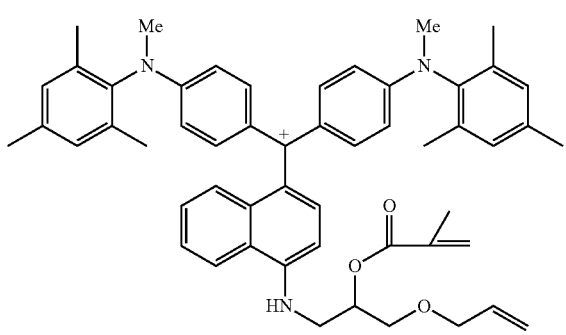

D-A10

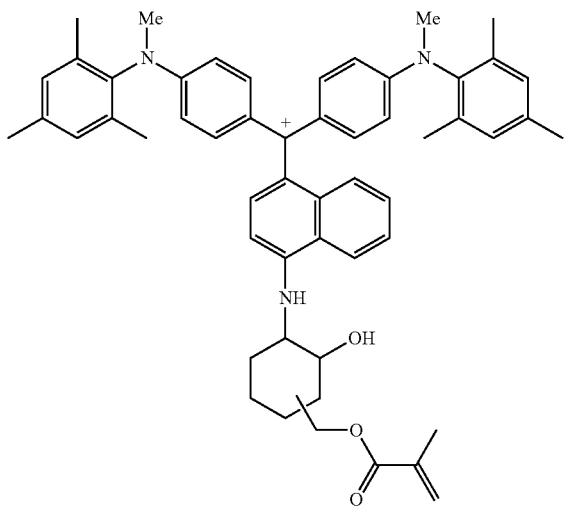

D-A11

-continued

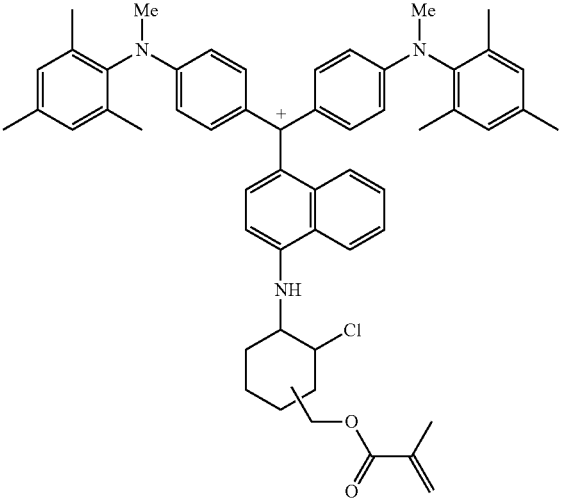

D-A12

As for the polymerization condition, for example, in a case of using 2,2'-azobis(2,4-dimethylvaleronitrile) as a initiator, the polymerization is preferably carried out at a polymerization temperature of 40° C. to 90° C., and more preferably carried out at a polymerization temperature of 50° C. to 70° C. In addition, in a case of using 2,2'-azobis(2-methylpropionate) as an initiator, the polymerization is preferably carried out at a polymerization temperature of 70° C. to 95° C., and more preferably carried out at a polymerization temperature of 75° C. to 90° C.

The polymerization is preferably carried out in a solution containing the above-mentioned raw material monomer in the total proportion of 30% to 60% by mass. The content of the raw material monomer in the solution is more preferably 35% to 55% by mass, and still more preferably 40% to 55% by mass. If the content of the raw material monomer is within the above range, it is possible to make the polymerization of the triarylmethane monomer easily proceed. As a result, the content of the compound A which will be described later in the polymer TP can be reduced.

Examples of the solvent for use in the preparation of the reaction solution of the raw material monomer include the solvents which can be contained in the coloring composition which will be described later.

During the polymerization, a chain transfer agent may be added. As the chain transfer agent, an alkylmercaptan is preferable, and an alkylmercaptan having 4 or more carbon atoms or an alkylmercaptan substituted with a carboxyl group, an ether group, or an ester group is more preferable. In particular, from the viewpoint of off odor, dodecylmercaptan or dipentaerythritol hexa-3-mercaptopropionate is preferable, and from the viewpoint of promoting developability, thiomalic acid or mercaptopropionic acid is preferable.

After finishing the polymerization, a purification treatment may also be carried out. Thus, the content of the compound A which will be described later can be reduced.

For the coloring composition of the present invention, the content of the polymer TP is preferably 10% to 60% by mass, and more preferably 10% to 40% by mass, with respect to the total solid content of the coloring composition of the present invention.

<<Compound A Having Triarylmethane Structure Other than Polymer TP>>

The coloring composition of the present invention may contain a compound A having a triarylmethane structure other than the polymer TP. The weight-average molecular weight of the compound A is preferably less than 5,000.

The content of the compound A is preferably 20 parts by mass or less, more preferably 10 parts by mass or less, still more preferably 5 parts by mass or less, and particularly preferably 1 parts by mass or less, with respect to 100 parts by mass of the total amount of the polymer TP and the compound A. The lower limit can be set to 0.1 parts by mass or more. Incidentally, the compound A cannot also be substantially contained. Further, according to the expression, "the compound A cannot also be substantially contained", for example, the content of the compound A is preferably 0.1 parts by mass or less, and more preferably 0.01 parts by mass or less, with respect to 100 parts by mass of the total amount of the polymer TP and the compound A, and still more preferably, the compound A is not contained. By setting the content of the compound A to 20 parts by mass or less, the polymer TP can be effectively suppressed from being eluted from a cured film obtained from the coloring composition, and as a result, the solvent resistance or the heat resistance of the cured film can be improved.

The compound A is a compound having a triarylmethane structure, and means unreacted substances such as the raw material monomer having a triarylmethane structure, used for the synthesis of the polymer TP, impurities containing the raw material monomer having no polymerizable group, or the like.

Furthermore, the weight-average molecular weight of the compound A is a value in terms of a polymethacrylic acid by gel permeation chromatography (GPC) measurement, and specifically a value measured under the conditions described in the polymer TP as described above. The content of the compound A can be measured by detection with ultraviolet rays, using GPC measurement.

<<Other Coloring Compounds>>

The coloring composition of the present invention may include one kind or two or more kinds of coloring compounds other than the above-mentioned polymer TP and the compound A. As such other coloring compounds, a dye compound, a pigment compound, and a dispersion thereof can be blended.

In a case where the pigment compound is blended as a dispersion, the preparation can be carried out in accordance with the description in JP1997-197118A (JP-H09-197118A) and JP2000-239544A.

Examples of the dye compound include an azo-based dye compound (for example, Solvent Yellow 162), an anthraquinone-based dye compound (for example, the anthraquinone compounds described in JP2001-10881A), a phthalocyanine-based dye compound (for example, the phthalocyanine-based compound described in US2008/0076044A1), a methine dye, a xanthene dye (for example, JP2010-32999A), and a dipyrromethene metal complex compound (for example, JP2012-237985A).

Examples of the pigment compound include perylene, perylene, quinacridone, quinacridonequinone, anthraquinone, anthathrone, benzimidazolone, condensed disazo, disazo, azo, indanthrone, phthalocyanine, dioxazine, aminoanthraquinone, diketopyrrolopyrrole, indigo, thioindigo, isoindoline, isoindolinone, pyranthrone, and isoviolanthrone. More specific examples of the pigment compound include perylene-compound pigments such as Pigment•Red 190, Pigment•Red 224, Pigment•Violet 29; perynone-compound pigments such as Pigment•Orange 43 and Pigment•Red 194; quinacridone-compound pigments such as Pigment•Violet 19, Pigment•Violet 42, Pigment•Red 122, Pigment•Red 192, Pigment•Red 202, Pigment•Red 207, and Pigment•Red 209; quinacridonequinone-compound pigments such as Pigment•Red 206, Pigment•Orange 48, and Pigment•Orange 49; anthraquinone-compound pigments such as Pigment•Yellow 147; anthathrone-compound pigments such as Pigment•Red 168; benzimidazolone-compound pigments such as Pigment•Brown 25, Pigment•Violet 32, Pigment•Orange 36, Pigment•Yellow 120, Pigment•Yellow 180, Pigment•Yellow 181, Pigment•Orange 62, and Pigment•Red 185; condensed disazo-compound pigments such as Pigment•Yellow 93, Pigment•Yellow 94, Pigment•Yellow 95, Pigment•Yellow 128, Pigment•Yellow 166, Pigment•Orange 34, Pigment•Orange 13, Pigment•Orange 31, Pigment•Red 144, Pigment•Red 166, Pigment•Red 220, Pigment•Red 221, Pigment•Red 242, Pigment•Red 248, Pigment•Red 262, and Pigment•Brown 23; disazo-compound pigments such as Pigment•Yellow 13, Pigment•Yellow 83, and Pigment•Yellow 188; azo-compound pigments such as Pigment•Red 187, Pigment•Red 170, Pigment•Yellow 74, Pigment•Yellow 150, Pigment•Red 48, Pigment•Red 53, Pigment•Orange 64, and Pigment•Red 247; indanthrone-compound pigments such as Pigment•Blue 60; phthalocyanine-compound pigments such as Pigment•Green 7, Pigment•Green 36, Pigment•Green 37, Pigment•Green 58, Pigment•Blue 16, Pigment•Blue 75, and Pigment•Blue 15; dioxazine-compound pigments such as Pigment•Violet 23 and Pigment•Violet 37; aminoanthraquinone-compound pigments such as Pigment•Red 177; diketopyrrolopyrrole-compound pigments such as Pigment•Red 254, Pigment•Red 255, Pigment•Red 264, Pigment•Red 272, Pigment•Orange 71, and Pigment•Orange 73; thioindigo-compound pigments such as Pigment•Red 88; isoindoline-compound pigments such as Pigment•Yellow 139 and Pigment•Orange 66; isoindolinone-compound pigments such as Pigment•Yellow 109 and Pigment•Orange 61; pyranthrone-compound pigments such as Pigment•Orange 40 and Pigment•Red 216; and isoviolanthrone-compound pigments such as Pigment•Violet 31.

In the present invention, green to cyan color materials are preferable, and phthalocyanine-compound pigments such as Pigment•Green 7, Pigment•Green 36, Pigment•Green 37, Pigment•Green 58, Pigment•Blue 16, Pigment•Blue 75, and Pigment•Blue 15; dioxazine-compound pigments such as Pigment•Violet 23 and Pigment•Violet 37; aminoanthraquinone-compound pigments such as Pigment•Red 177; diketopyrrolopyrrole-compound pigments such as Pigment•Red 254, Pigment•Red 255, Pigment•Red 264, Pigment•Red 272, Pigment•Orange 71, and Pigment•Orange 73; thioindigo-compound pigments such as Pigment•Red 88; isoindoline-compound pigments such as Pigment•Yellow 139 and Pigment•Orange 66; isoindolinone-compound pigments such as Pigment•Yellow 109 and a Pigment•Orange 61; pyranthrone-compound pigments such as Pigment•Orange 40 and Pigment•Red 216; or isoviolanthrone-compound pigments such as Pigment•Violet 31 are more preferable.

Particularly, other examples of the coloring compounds preferably include at least one selected from a xanthene compound, a dipyrromethene-based metal complex compound, an oxazine compound, and a phthalocyanine compound, and more preferably include at least one selected from a xanthene compound and a dipyrromethene-based metal complex compound.

(Xanthene Compound)

The xanthene compound is a compound having a xanthene skeleton in the molecule. Examples of the xanthene compound include Color Index (C. I.) Acid Red 51 (the descriptions of C. I. Acid Red are hereinafter omitted while only the numbers thereof are described, with the others shall be the same), 52, 87, 92, 94, 289, and 388, C. I. Acid Violet 9, 30, and 102, C. I. Basic Red 1 (Rhodamine 6G), 2, 3, 4, and 8, C. I. Basic Red 10 (Rhodamine B), 11, C. I. Basic Violet 10, 11, and 25, C. I. Solvent Red 218, C. I. Mordant Red 27, C. I. Reactive Red 36 (Rose Bengal B), Sulforhodamine G, the xanthene compounds described in JP2010-32999A, and the xanthene compounds described in JP4492760B.

As the xanthene compound, a compound represented by Formula (1a) (hereinafter also referred to as a "compound (1a)" in some cases) is preferably included. The compound (1a) may be a tautomer. In a case of using the compound (1a), the content of the compound (1a) in the xanthene compound is preferably 50% by mass or more, more preferably 70% by mass or more, and still more preferably 90% by mass or more. In particular, it is preferable that as the xanthene compound, only the compound (1a) is used.

Formula (1a)

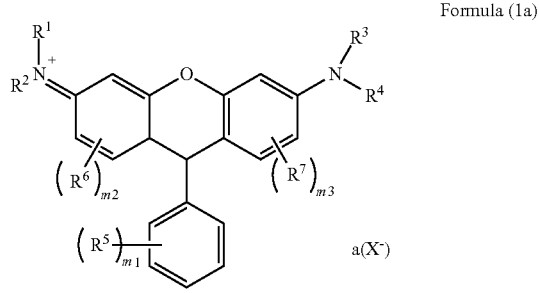

In Formula (1a), $R^1$ to $R^4$ each independently represent a hydrogen atom, a monovalent saturated hydrocarbon group having 1 to 20 carbon atoms, which may have a substituent, or a monovalent aromatic hydrocarbon group having 6 to 10 carbon atoms, which may have a substituent, in which —$CH_2$— contained in the saturated hydrocarbon group may be substituted with —O—, —CO—, or —$NR^{11}$—;

$R^1$ and $R^2$ may be bonded to each other to form a ring including a nitrogen atom, and $R^3$ and $R^4$ may be bonded to each other to form a ring including a nitrogen atom;

$R^5$ represents —OH, —$SO_3^-$, —$SO_3H$, —$SO_3^-$—$Z^+$, —$CO_2H$, —$CO_2^-Z^+$, —$CO_2R^8$, —$SO_3R$, or —$SO_2NR^9R^{10}$;

$R^6$ and $R^7$ each independently represent an alkyl group having 1 to 6 carbon atoms;

m1 represents an integer of 0 to 5. In a case where m1 is 2 or more, a plurality of $R^5$'s may be the same as or different from each other;

m2 and m3 each independently represent an integer of 0 to 3. In a case where m2 and m3 are each independently 2 or 3, a plurality of $R^6$'s and $R^7$'s may be each independently the same as or different from each other;

a represents 0 or 1; and in a case where a represents 0, any one group of $R^1$ to $R^7$ has an anion;

$X^-$ represents an anion;

$Z^+$ represents $N^+(R^{11})_4$, $Na^+$, or $K^+$, and four $R^{11}$'s may be the same as or different from each other;

$R^8$ represents a monovalent saturated hydrocarbon group having 1 to 20 carbon atoms, and the hydrogen atom included in the saturated hydrocarbon group may be substituted with a halogen atom;

$R^9$ and $R^{10}$ each independently represent a hydrogen atom or a monovalent saturated hydrocarbon group having 1 to 20 carbon atoms, in which —$CH_2$— included in the saturated hydrocarbon group may be substituted with —O—, —CO—, —NH—, or —$NR^8$—, and $R^9$ and $R^{10}$ may be bonded to each other to form a 3- to 10-membered heterocycle containing a nitrogen atom; and $R^{11}$ represents a hydrogen atom, a monovalent saturated hydrocarbon group having 1 to 20 carbon atoms, or an aralkyl group having 7 to 10 carbon atoms.

With regard to details of Formula (1a), reference can be made to the descriptions in paragraph Nos. 0133 to 0152 of WO2015/046285A, the contents of which are incorporated herein by reference. Specific examples of the compound (1a) include the compounds represented by Formulae (1-1) to (1-43) described in paragraph Nos. 0149 to 0152 of WO2015/046285A, the contents of which are incorporated herein by reference.

As the xanthene compound, a commercially available xanthene dye (for example, "Chugai Aminol Fast Pink R-H/C" manufactured by Chugai Kasei K. K, "Rhodamin 6G" manufactured by Taoka Chemical Co., Ltd.) can be used. Further, it also can be synthesized using a commercially available xanthene dye as a starting raw material with reference to JP2010-32999A, the contents of which are incorporated herein by reference.

(Dipyrromethene-Based Metal Complex Compound)

Examples of the dipyrromethene-based metal complex compound include a compound in which a compound represented by Formula (I) is coordinated with a metal atom or a metal compound.

Formula (I)

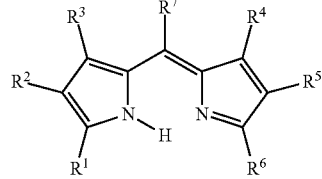

In Formula (I), $R^1$ to $R^6$ each independently represent a hydrogen atom or a substituent, and $R^7$ represents a hydrogen atom, a halogen atom, an alkyl group, an aryl group, or a heterocyclic group.

Examples of the substituent include the above-mentioned substituent group A. In a case where the substituent can further be substituted, it may further be substituted with any one of the above-mentioned substituents. Further, in a case where two or more substituents are contained, the substituents may be the same as or different from each other.

In Formula (I), $R^1$ and $R^2$, $R^2$ and $R^3$, $R^4$ and $R^5$, and $R^5$ and $R^6$ may be each independently bonded to each other to form a 5-, 6-, or 7-membered ring. Examples of the ring thus formed include a saturated ring and an unsaturated ring. Examples of the 5-, 6-, or 7-membered saturated ring or unsaturated ring include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

Furthermore, in a case where the 5-, 6-, or 7-membered ring thus formed is a group which can further be substituted, it may be substituted with any one of the substituent group A, and in a case where the 5-, 6-, or 7-membered ring thus formed is substituted with 2 or more substituents, the substituents may be the same as or different from each other.

With regard to details of Formula (I), reference can be made to the description in paragraph Nos. 0159 to 0170 of WO2015/046285A, the contents of which are incorporated herein by reference.

With regard to preferred aspects of the dipyrromethene-based metal complex compound in which a compound represented by Formula (I) is coordinated with a metal atom or a metal compound, reference can be made to the description of the complex compound represented by Formula (I-1), (1-2), or (1-3) described in paragraph Nos. 0153 to 0176 of JP2012-237985A, the contents of which are incorporated herein by reference.

Specific examples of the dipyrromethene-based metal complex compound, reference can be made to the description in paragraph Nos. 0179 to 0186 of JP2012-237985A, the contents of which are incorporated herein by reference.

In a case where the coloring composition of the present invention contains other coloring compounds, the content of such other coloring compounds is preferably 0.5% to 70% by mass, with respect to the total solid content of the coloring composition of the present invention. Further, the other coloring compounds are preferably added to the coloring composition such that the absorption strength ratio (absorption at 450 nm/absorption at 650 nm) is in the range of 0.95 to 1.05.

<<Polymerizable Compound>>

The coloring composition of the present invention contains a polymerizable compound. Examples of the polymerizable compound include an addition-polymerizable compound having at least one ethylenically unsaturated double bond. Further, the polymerizable compound in the present invention is a component other than the above-mentioned polymer TP.

Specifically, the polymerizable compound is selected from the compounds having at least one ethylenically unsaturated bond, and preferably two or more ethylenically unsaturated bonds at terminals. Such compound groups are widely known in the industrial field of the relevant art and can be used in the present invention without particular limitation. These may be in any type of chemical forms such as a monomer, a prepolymer, that is, a dimer, a trimer, an oligomer, a mixture thereof, and a (co)polymer thereof, with the monomer being preferable.

The molecular weight of the polymerizable compound is preferably 100 to 3,000. The upper limit is more preferably 2,000 or less, and still more preferably 1,500 or less. The lower limit is more preferably 150 or more, and still more preferably 250 or more. The polymerizable compound is preferably a tri- to pentadeca-functional (meth)acrylate compound, and more preferably a tri- to hexa-functional (meth)acrylate compound.

Examples of the monomer and a (co)polymer thereof include unsaturated carboxylic acid (for example, acrylic acid, methacrylic acid, itaconic acid, crotonic acid, isocrotonic acid, and maleic acid), esters and amides thereof, and (co)polymers thereof, and preferably esters of an unsaturated carboxylic acid with an aliphatic polyhydric alcohol compound, amides of an unsaturated carboxylic acid with an aliphatic polyhydric amine compound, and (co)polymers thereof. Further, addition reaction products of an unsaturated carboxylic ester or amide having a nucleophilic substituent such as a hydroxyl group, an amino group, or a mercapto group with a monofunctional or polyfunctional isocyanate or epoxy, and dehydration condensation reaction products with a monofunctional or polyfunctional carboxylic acids are suitably used. Furthermore, addition reaction products of an unsaturated carboxylic ester or amide having an electrophilic substituent such as an isocyanate group and an epoxy group with a monofunctional or polyfunctional alcohol, amine or thiol, and substitution reaction products of an unsaturated carboxylic ester or amide having a splitting-off substituent such as a halogen atom and a tosyloxy group with a monofunctional or polyfunctional alcohol, amine, or thiol are also suitably used. In addition, as other examples, the compound group in which the above-described unsaturated carboxylic acid is substituted by unsaturated phosphonic acid, styrene, vinyl ether, or the like may also be used.

With regard to specific examples of these compounds, reference can be made to paragraph Nos. 0156 to 0159 of JP2014-208808A, the contents of which are incorporated herein by reference.

Incidentally, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), and a structure in which the (meth)acryloyl groups are bonded to each other via an ethylene glycol or a propylene glycol residue are also preferable. Oligomer types thereof can also be used.

The structure, the use form, namely, sole use or combination use, the amount added, and the details in use method of the polymerizable compound can be arbitrarily in accordance with the final performance design of the coloring composition. For example, from the viewpoint of sensitivity, structures having a large content of unsaturated groups per molecule are preferable, and in many cases, bifunctional or higher functional compounds are preferable. Further, from the viewpoint of increasing the strength of the cured film, trifunctional or higher functional compounds are preferable and a method of using the compound in combination with a different polymerizable group different in the function number (for example, an acrylic ester, a methacrylic ester, a styrene compound, and a vinyl ether compound) to control both the sensitivity and the strength is also effective. In addition, the selection and use method of the polymerizable compound affect the compatibility and dispersibility with other components (for example, a photopolymerization initiator, a colorant (pigment), and a binder polymer) in the photosensitive layer and these are important factors. For example, by using a low purity compound or using two or more compounds in combination, the compatibility can be improved in some cases, and further, for the purpose of improving the adhesive property of a hard surface of a substrate or the like, a specific structure may be selected in some cases.

From the viewpoint of obtaining the effects of the present invention more effectively, the content of the polymerizable compound in the total solid content of the coloring composition is preferably 10% to 80% by mass, more preferably 15% to 75% by mass, and particularly preferably 20% to 60% by mass.

The composition of the present invention may include one kind or two or more kinds of polymerizable compounds. In a case where the composition includes two or more kinds of polymerizable compounds, the total sum is preferably within the above range.

<<Photopolymerization Initiator>>

The coloring composition of the present invention preferably contains a photopolymerization initiator. The photopolymerization initiator is not particularly limited as long as it is used to polymerize the polymerizable compound, and is preferably selected from the viewpoints of characteristics, initiation efficiency, absorption wavelength, availability, cost, and the like.

Examples of the photopolymerization initiator include an active halogen compound such as halomethyloxadiazole compounds and halomethyl-s-triazine compounds, 3-aryl-substituted coumarin compounds, lophine dimers, benzophenone compounds, acetophenone compounds, and derivatives thereof, cyclopentadiene-benzene-iron complexes and salts thereof, and oxime compounds. Specific examples of the photopolymerization initiator include those described in the paragraph Nos. 0070 to 0077 of JP2004-295116A. Among these, oxime compounds or biimidazole-based compounds are preferable in view of a rapid polymerization reaction and the like.

The oxime-based compound (hereinafter also referred to as an "oxime-based photopolymerization initiator") is not particularly limited, and examples thereof include the oxime-based compounds described in JP2000-80068A, WO02/100903A1, JP2001-233842A, and the like.

With regard to the specific examples of the oxime-based compound, reference can be made to the descriptions in paragraph No. 0053 of JP2013-182215A, the contents of which are incorporated herein by reference.

Moreover, in the present invention, a compound represented by General Formula (1) or (2) is more preferable as the oxime compound from the viewpoints of sensitivity, temporal stability, and coloration during post-heating.

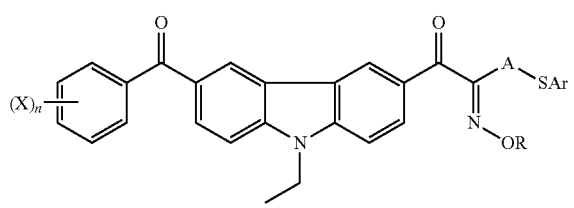

(1)

(In General Formula (1), R and X each represent a monovalent substituent, A represents a divalent organic group, Ar represents an aryl group, and n represents an integer of 1 to 5.)

As R, an acyl group is preferable, and specifically, an acetyl group, a propionyl group, a benzoyl group, and a toluyl group are preferable, in a view of high sensitivity.

As A, an unsubstituted alkylene group, an alkylene group substituted by an alkyl group (for example, a methyl group, an ethyl group, a tert-butyl group, and a dodecyl group), an alkylene group substituted by an alkenyl group (for example, a vinyl group and an allyl group), or an alkylene group substituted by an aryl group (for example, a phenyl group, a p-tolyl group, a xylyl group, a cumenyl group, a naphthyl group, an anthryl group, a phenanthryl group, and a styryl group) is preferable, in views of increasing sensitivity and suppressing coloration due to heating over time.

As Ar, a substituted or unsubstituted phenyl group is preferable in views of increasing sensitivity and suppressing coloration due to heating over time. In a case of a substituted phenyl group, the substituent is preferably a halogen atom such as a fluorine atom, a chlorine atom, a bromine atom, and an iodine atom.

As X, an alkyl group, an aryl group, an alkenyl group, an alkynyl group, an alkoxy group, an aryloxy group, an alkylthioxy group, an arylthioxy group, or an amino group is preferable in a view of improving solubility in a solvent and absorption efficiency in a long wavelength range. Further, n in General Formula (1) is preferably an integer of 1 or 2.

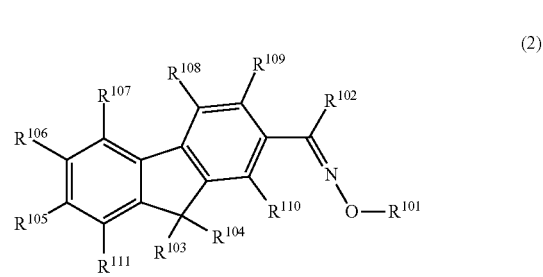

(2)

In General Formula (2), $R^{101}$ represents an alkyl group, an alkanoyl group, an alkenoyl group, an aryloyl group, an alkoxycarbonyl group, an aryloxycarbonyl group, a heterocyclic oxycarbonyl group, a heteroaryloxycarbonyl group, an alkylthiocarbonyl group, an arylthiocarbonyl group, a heterocyclic thiocarbonyl group, or —CO—CO—Rf. Rf represents a carbocyclic aromatic ring or a heterocyclic aromatic ring.

$R^{102}$ represents an alkyl group, an aryl group, or a heterocyclic group, and these may be substituted.

$R^{103}$ and $R^{104}$ each independently represent an alkyl group, an aryl group, or a heterocyclic group, and these groups may be substituted with a halogen atom, an alkyl group, an aryl group, an alkoxy group, an alkylcarbonyl group, or the like.

$R^{105}$ to $R^{111}$ each independently represent a hydrogen atom, a halogen atom, an alkyl group, an aryl group, a heterocyclic group, an alkoxy group, an aryloyl group, a heteroaryloyl group, an alkylthio group, an aryloylthio group, an alkylcarbonyl group, an arylcarbonyl group, a heteroarylcarbonyl group, an alkoxycarbonyl group, an aryloxycarbonyl group, a heterocyclic oxycarbonyl group, a nitro group, an amino group, a sulfonic acid group, a hydroxyl group, a carboxyl group, an amido group, a carbamoyl group, or a cyano group.

It is preferable that one or two members out of $R^{105}$ to $R^{111}$ are an electron-withdrawing substituent, that is, a nitro group, a cyano group, an alkylcarbonyl group, or an arylcarbonyl group since a coloring composition having higher curability is obtained.

Specific examples of the compound having a fluorene structure represented by General Formula (2) include the compounds described in paragraph Nos. 0087 and 0088 of JP2014-177502A, the contents of which are incorporated herein by reference.

The compound having a fluorene structure represented by General Formula (2) can be synthesized in accordance with, for example, the synthetic method described in WO2014-050738A.

As the commercially available product of the oxime-based photopolymerization initiator, IRGACURE-OXE01

(manufactured by BASF Corporation), IRGACURE-OXE02 (manufactured by BASF Corporation), TR-PBG-304 (manufactured by Changzhou Tronly New Electronic Materials Co., Ltd.), ADEKA ARKLS NCI-831 (manufactured by ADEKA Corporation), ADEKA ARKLS NCI-930 (manufactured by ADEKA Corporation), or the like can be used.

With regard to specific examples of the biimidazole-based compound, reference can be made to the descriptions in paragraph Nos. 0061 to 0070 of JP2013-182213A, the contents of which are incorporated herein by reference.

Furthermore, for the coloring composition of the present invention, other known photopolymerization initiators described in paragraph No. 0079 of JP2004-295116A may be used, in addition to the photopolymerization initiator.

In the present invention, as the photopolymerization initiator, an oxime compound having a fluorine atom can also be used. Specific examples of the oxime compound having a fluorine atom include the compounds described in JP2010-262028A, the compounds 24, and 36 to 40 described in JP2014-500852A, and the compounds (C-3) described in JP2013-164471A, the contents of which are incorporated herein by reference.

The content of the photopolymerization initiator is preferably 0.1% to 20% by mass, more preferably 0.5% to 19% by mass, and particularly preferably 1% to 18% by mass, with respect to the total solid content of the coloring composition, from the viewpoint of obtaining the effects of the present invention more effectively.

The composition of the present invention may include one kind or two or more kinds of the photopolymerization initiator. In a case where the composition includes two or more kinds of the photopolymerization initiator, the total sum thereof is preferably within the above range.

<<Organic Solvent>>

The coloring composition of the present invention preferably contains an organic solvent.

Basically, the organic solvent is not particularly limited as long as the solubility of the respective components or the coatability at a time of forming into a coloring composition, and in particular, it is preferably selected in consideration of the solubility, the coatability, and the safety of a binder.

As the organic solvent, esters, ethers, ketones, or aromatic hydrocarbons are used, and specifically, those described in paragraph Nos. 0161 and 0162 of JP2012-032754A are exemplified.

From the viewpoint of the solubility of the respective components, or the like, it is preferable that the organic solvents are used as a mixture of two or more kinds thereof. In this case, a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

The content of the organic solvent in the coloring composition is an amount such that the total solid concentration in the coloring composition preferably becomes 10% to 80% by mass, and more preferably becomes 15% to 60% by mass.

The coloring composition of the present invention may include one kind or two or more kinds of the organic solvent. In a case where the coloring composition includes two or more kinds of the organic solvent, the total sum thereof is preferably within the above range.

<<Alkali-Soluble Binder>>

The coloring composition of the present invention preferably includes an alkali-soluble binder. The alkali-soluble binder is not particularly limited as long as it is alkali-soluble, and it can be preferably selected from the viewpoints of heat resistance, developability, availability, and the like.

A preferred alkali-soluble binder is a high-molecular weight organic linear polymer, which is soluble in an organic solvent and developable with a weakly alkaline aqueous solution. Examples of such a high-molecular weight organic linear polymer include polymers having a carboxylic acid in the side chain, such as the methacrylic acid copolymers, the acrylic acid copolymers, the itaconic acid copolymers, the crotonic acid copolymers, the maleic acid copolymers, the partially esterified maleic acid copolymers, and the like, described in JP1984-44615A (JP-S59-44615A), JP1979-34327B (JP-S54-34327B), JP1983-12577B (JP-S58-12577B), JP1979-25957B (JP-S54-25957B), JP1984-53836A (JP-S59-53836A), and JP1984-71048A (JP-S59-71048A), as well as acidic cellulose derivatives having a carboxylic acid in the side chain.

Besides the above-mentioned binders, adducts of polymers having hydroxyl groups with acid anhydrides, polyhydroxystyrene-based resins, polysiloxane-based resins, poly(2-hydroxyethyl (meth)acrylate), polyvinyl pyrrolidone, polyethylene oxides, polyvinyl alcohols, and the like are also useful as the alkali-soluble binder in the present invention. The high-molecular weight organic linear polymer may be a copolymer with a hydrophilic monomer. Examples thereof include alkoxyalkyl (meth)acrylates, hydroxyalkyl (meth)acrylates, glycerol (meth)acrylates, (meth)acrylamides, N-methylolacrylamides, secondary or tertiary alkylacrylamides, dialkylaminoalkyl (meth)acrylates, morpholine (meth)acrylates, N-vinylpyrrolidone, N-vinylcaprolactam, vinylimidazole, vinyltriazole, methyl (meth)acrylates, ethyl (meth)acrylates, branched or linear propyl (meth)acrylates, branched or linear butyl (meth)acrylates, and phenoxyhydroxy propyl (meth)acrylates. Other examples of the hydrophilic monomer include monomers including a tetrahydrofurfuryl group, a phosphoric acid group, a phosphoric ester group, a quaternary ammonium salt group, an ethyleneoxy chain, a propyleneoxy chain, a sulfo group, and a group derived from a salt thereof, or a morpholinoethyl group.

Copolymers of maleimide and ethylene oxide, represented by Formulae (b1) and (b2) can also be preferably used as the alkali-soluble binder.

Formula (b1)

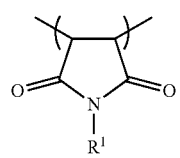

(b1)

(In Formula (b1), $R^1$ represents a hydrogen atom, an aryl group, or an alkyl group.)

In a case where $R^1$ represents an alkyl group, examples of the alkyl group include a linear alkyl group having 1 to 10 carbon atoms, a branched alkyl group having 3 to 10 carbon atoms, and a cyclic alkyl group having carbon atoms 5 to 20.

The alkyl group may have a substituent, and examples of the substituent which may be introduced into the alkyl group include a phenyl group, a carbonyl group, an alkoxy group, a hydroxyl group, and an amino group.

In a case where $R^1$ represents an aryl group, examples of the aryl group include an aryl group having a monocyclic structure, an aryl group having a polycyclic structure, an aryl group having a condensed structure, and heteroaryl group including a hetero atom. More specific examples thereof include a phenyl group, a naphthyl group, a biphenyl group, a benzoimidazolyl group, a pyridyl group, and a furyl group.

The aryl group may have a substituent, and examples of the substituent which may be introduced into the aryl group include alkyl groups such as a methyl group, an ethyl group, a tert-butyl group, and a cyclohexyl group, alkoxy groups such as a methoxy group, a carboxyl group, a hydroxyl group, an amino group, a nitro group, a chloro group, and a bromo group.

Formula (b2)

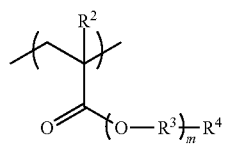

(b2)

(In Formula (b2), $R^2$ represents a hydrogen atom or a methyl group. $R^3$ represents an alkylene group having 2 or 3 carbon atoms, $R^4$ represents a hydrogen atom, an aryl group, or an alkyl group, and m represents an integer of 1 to 15.)

In a case where $R^4$ represents an alkyl group, examples of the alkyl group include a linear alkyl group having 1 to 20 carbon atoms, a branched alkyl group having 3 to 20 carbon atoms, and a cyclic alkyl group having carbon atoms 5 to 20.

The alkyl group may have a substituent, and examples of the substituent which may be introduced into the alkyl group include a phenyl group, a carbonyl group, and an alkoxy group.

In a case where $R^4$ represents an aryl group, examples of the aryl group include an aryl group having a monocyclic structure, an aryl group having a polycyclic structure, an aryl group having a condensed structure, and a heteroaryl group having a hetero atom. More specific examples thereof include a phenyl group, a naphthyl group, an anthranyl group, a biphenyl group, a benzoimidazolyl group, an indolyl group, an imidazolyl group, an oxazolyl group, a carbazolyl group, a pyridyl group, and a furyl group.

The aryl group may have a substituent, and examples of the substituent which may be introduced into the aryl group include a nonyl group, an alkyl groups such as a methyl group, an ethyl group, a tert-butyl group, and a cyclohexyl group, an alkoxy groups such as a methoxy group, a carboxyl group, a hydroxyl group, an amino group, a nitro group, a chloro group, and a bromo group.

Furthermore, in order to improve the crosslinking efficiency, the alkali-soluble binder may have a polymerizable group in the side chain, and polymers containing, for example, an allyl group, a (meth)acryl group, an allyloxyalkyl group, or the like in the side chain are also useful. Examples of the polymer containing a polymerizable group include KS RESIST-106 (manufactured by Osaka Organic Chemical Industry Ltd.) and CYCLOMER P series (manufactured by Daicel Company Ltd.), which are commercially available products. In addition, in order to enhance the strength of a cured film, alcohol-soluble nylon, polyether formed of 2,2-bis-(4-hydroxyphenyl)-propane and epichlorohydrin, and the like are also useful.

Among these various alkali-soluble binders, from the viewpoint of heat resistance, a polyhydroxystyrene-based resin, a polysiloxane-based resin, an acrylic resin, an acrylamide-based resin, and an acryl/acrylamide copolymer resin are preferable, and from the viewpoint of controlling developability, an acrylic resin, an acrylamide-based resin, and an acryl/acrylamide copolymer resin are preferred.

In particular, a copolymer having a repeating unit represented by General Formula (2) and an acidic group is preferable, and more preferred examples of the copolymer include a copolymer having a structural unit represented by General Formula (3), in addition to a repeating unit represented by General Formula (2) and the acidic group.

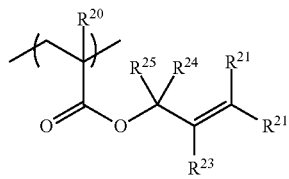

(2)

(In General Formula (2), $R^{20}$ represents a hydrogen atom or a methyl group, and $R^{21}$ to $R^{25}$ each independently represent a hydrogen atom, a halogen atom, a cyano group, an alkyl group, or an aryl group.)

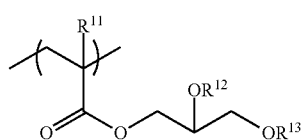

(3)

(In General Formula (3), $R^{11}$ represents a hydrogen atom or a methyl group. $R^{12}$ and $R^{13}$ each independently represent a hydrogen atom or a carbonyl group having 3 to 20 carbon atoms, including an unsaturated double bond as a partial structure, and both of $R^{12}$ and $R^{13}$ is a hydrogen atom in no case. In a case where at least one of $R^{12}$ or $R^{13}$ represents a carbonyl group having 3 to 20 carbon atoms, including an unsaturated double bond as a partial structure, it may further include a carboxyl group as a partial structure.)

As the acrylic resin, a copolymer formed of monomers selected from benzyl (meth)acrylate, (meth)acrylic acid, hydroxyethyl (meth)acrylate, (meth)acrylamide, and the like, and KS RESIST-106 manufactured by Osaka Organic Chemical Industry Ltd.), CYCLOMER P series (manufactured by Daicel Company Ltd.), and the like, which are commercially available products, are preferable.

Furthermore, the alkali-soluble binder may include a structural unit derived from a compound represented by Formula (X).

Formula (X)

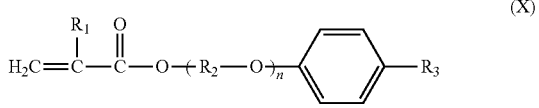

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may include a benzene ring, and n represents an integer of 1 to 15.

In Formula (X), the number of carbon atoms in the alkylene group of $R_2$ is preferably 2 to 3. Further, the number of carbon atoms in the alkyl group of $R_3$ is 1 to 20 and is preferably 1 to 10, and the alkyl group of $R_3$ may include a benzene ring. Examples of the alkyl group including a benzene ring, represented by $R_3$, include a benzyl group and a 2-phenyl(iso)propyl group.

The alkali-soluble binder preferably has a weight-average molecular weight (a value in terms of polystyrene as measured by a GPC method) of 1,000 to 200,000, more preferably 2,000 to 100,000, and particularly preferably 5,000 to 50,000, from the viewpoints of developability, liquid viscosity, and the like.

The acid value of the alkali-soluble binder is preferably 10 to 1,000 mgKOH/g, more preferably 50 to 300 mgKOH/g, still more preferably 50 to 200 mgKOH/g, and particularly preferably 105 to 200 mgKOH/g.

The content of the alkali-soluble binder is preferably 10% to 80% by mass, and more preferably 20% to 60% by mass, with respect to the total solid content of the coloring composition.

The coloring composition of the present invention may include one kind or two or more kinds of the alkali-soluble binder. In a case where the composition includes two or more kinds of the alkali-soluble binder, the total sum thereof is preferably within the above range.

<Dispersant>

The coloring composition of the present invention preferably includes a dispersant. In particular, in a case where the coloring composition of the present invention includes a pigment, it preferably includes a dispersant. Further, the dispersant can also be used as a binder. The dispersant is preferably a resin having an adsorptive group onto the main chain structure of the polymer compound. The adsorptive group of the dispersant preferably includes at least one of an acidic adsorptive group or a basic adsorptive group.

Examples of the acidic adsorptive group include a carboxyl group, a phosphoric acid group, and a sulfonic acid group. Examples of the basic adsorptive group include an amino group, an alkylamino group, an imidazole group, an oxazole group, a pyridine group, and a morpholino group. Examples of the alkyl group corresponding to an alkyl moiety of the alkylamino group include a linear or branched alkyl group having 1 to 10 carbon atoms, and preferably a linear or branched alkyl group having 1 to 4 carbon atoms, such as a methyl group, an ethyl group, an n-propyl group, an isopropyl group, an n-butyl group, an isobutyl group, and a tert-butyl group. Further, for example, a cyclic alkyl group having 3 to 10 carbon atoms, and preferably a cyclic alkyl group having 3 to 6 carbon atoms, such as a cyclopropyl group and a cyclobutyl group, can also be used.

In a case where the adsorptive group of the dispersant is an acidic adsorptive group, the acid value of the dispersant is preferably 10 to 100 mgKOH/g, more preferably 10 to 80 mgKOH/g, still more preferably 10 to 60 mgKOH/g, and particularly preferably 10 to 55 mgKOH/g. In a case where the adsorptive group of the dispersant is a basic adsorptive group, the amine value of the dispersant is preferably 3 to 100 mgKOH/g, more preferably 10 to 100 mgKOH/g, still more preferably 10 to 80 mgKOH/g, even still more preferably 10 to 50 mgKOH/g, and particularly preferably 10 to 40 mgKOH/g. In a case where the dispersant has both of an acidic adsorptive group and a basic adsorptive group, the acid value and the amine value of the dispersant are each preferably within the above ranges. In this case, the ratio of the acid value to the amine value, that is, acid value:amine value is preferably 1:1 to 1:10, more preferably 1:1 to 1:5, and particularly preferably 1:1 to 1:3.

Examples of the main chain structure of the polymer compound include addition-polymerization-based polymers, such as vinyl-based polymers such as polystyrene, polymethacrylic ester, polyacrylic ester, vinyl polyalkylate, polyacrylamide, polyacrylonitrile, polyvinyl chloride, and polyvinyl alcohol, polyolefin-based polymers such as polyethylene, polypropylene, and polyisobutylene, and diene-based polymers such as polybutadiene and polyisoprene, and condensation-based polymers such as a polyester, a polyamide, a polyether, a polyurethane resin, an epoxy resin, and a melamine resin. In addition, the structure of the polymer compound formed by the polymerization may be any one of a random polymer, a block polymer, and a graft polymer.

It is preferable that the acidic adsorptive group, the basic adsorptive group, or the both adsorptive groups are bonded to the above-mentioned polymer compound as a substituent.

The dispersant having the acidic adsorptive group, the basic adsorptive group, or the both adsorptive groups may be synthesized, but a commercially available dispersant may also be used. Examples of the commercially available dispersant include Disperbyk 182, 161, 162, 163, 2155, 2164, and 9077 manufactured by BYK Chemie as an amine-based dispersant, Disperbyk 190 and 191 manufactured by BYK Chemie as a carboxylic acid-based dispersant, and Disperbyk 110 and 111 manufactured by BYK Chemie as a phosphoric acid-based dispersant. Further, other examples of the commercially available dispersant include SOLSPERSE 13240, 20000, 24000, 26000, and 28000 manufactured by Avecia Ltd.

The content of the dispersant is preferably 0.5% to 30% by mass, and more preferably 1.0% to 20% by mass, with respect to the total solid content of the coloring composition of the present invention. Further, the mass ratio of the pigment to the dispersant included in the coloring composition is preferably 1:5 to 5:1, and more preferably 1:3 to 1:1. Further, the mass ratio of the compound having a triarylmethane structure to the dispersant, included in the coloring composition, is preferably 10:1 to 1:1, and more preferably 5:1 to 1:1.

<<Crosslinking Agent>>

The coloring composition of the present invention may further include a crosslinking agent.

The crosslinking agent is not particularly limited as long as it can cure a film by a crosslinking reaction, and examples thereof include (a) a compound having an epoxy group or an oxetanyl group, (b) a melamine compound, a guanamine compound, a glycoluril compound, or a urea compound, which is substituted with at least one substituent selected from a methylol group, an alkoxymethyl group, and an acyloxymethyl group, and (c) a phenol compound, a naphthol compound, or a hydroxyanthracene compound, which is substituted with at least one substituent selected from a methylol group, an alkoxymethyl group, and an acyloxymethyl group. Among these, the compound having an epoxy group or an oxetanyl group is preferable, and the compound having an epoxy group is more preferable.

With regard to details of specific examples and the like of the crosslinking agent, reference can be made to the descriptions in paragraph Nos. 0134 to 0147 of JP2004-295116A, the contents of which are incorporated herein by reference.

Examples of the compound having an epoxy group or an oxetanyl group include a polymer having an epoxy group in the side chain, such as a monomer or oligomer having two or more epoxy groups in the molecule. Examples thereof include a bisphenol A type epoxy resin, a bisphenol F type epoxy resin, a phenol novolac type epoxy resin, a cresol novolac type epoxy resin, and an aliphatic epoxy resin. Further, other examples thereof include a mono- or polyfunctional glycidyl ether compound, with the polyfunctional aliphatic glycidyl ether compound being preferable.

The weight-average molecular weight of the compound having an epoxy group or an oxetanyl group is preferably 500 to 5,000,000, and more preferably 1,000 to 500,000.

With regard to a commercially available product of the compound, reference can be made to the description in, for example, paragraph No. 0191 of JP2012-155288A, or the like, the contents of which are incorporated herein by reference. Further, examples thereof include polyfunctional aliphatic glycidyl ether compounds such as DENACOL EX-212L, EX-214L, EX-216L, EX-321L, and EX-850L (all manufactured by Nagase ChemteX Corporation). These are low-chlorine products, but EX-212, EX-214, EX-216, EX-321, EX-850, and the like which are not low-chlorine products can also be used. In addition, other examples include ADEKA RESIN EP-4000S, ADEKA RESIN EP-4003S, ADEKA RESIN EP-4010S, ADEKA RESIN EP-4011S, NC-2000, NC-3000, NC-7300, XD-1000, EPPN-501, and EPPN-502 (all manufactured by ADEKA Corporation), and JER1031S, CELLOXIDE 2021P, CELLOXIDE 2081, CELLOXIDE 2083, CELLOXIDE 2085, EHPE 3150, EPOLEAD PB 3600, EPOLEAD PB 4700, CYCLOMER P ACA 200M, CYCLOMER ACA 230AA, CYCLOMER ACA Z250, CYCLOMER ACA Z251, CYCLOMER ACA Z300, and CYCLOMER ACA Z320 (all manufactured by Daicel Corporation). Further, examples of a commercially available product of the phenol novolac type epoxy resin include JER-157S65, JER-152, JER-154, and JER-157S70 (all manufactured by Mitsubishi Chemical Corporation). In addition, as specific examples of the polymer having an oxetanyl group in the side chain and the polymerizable monomer or oligomer having two or more oxetanyl groups in the molecule, ARON OXETHANE OXT-121, OXT-221, OX-SQ, and PNOX (all manufactured by TOAGOSEI Co., Ltd.) can be used.

In the coloring composition of the present invention contains a crosslinking agent, the content of the crosslinking agent is preferably 0.01% to 50% by mass, and more preferably 0.5% to 30% by mass, with respect to the total solid content of the coloring composition.

<<Surfactant>>

The coloring composition of the present invention may include a surfactant. The surfactant may be any one of a non-ionic surfactant, a cationic surfactant, and an anionic surfactant, but a surfactant having an ethylene oxide structure and a fluorine-based surfactant is preferable. In particular, a surfactant having an ethylene oxide structure, which has an HLB value in the range of 9.2 to 15.5, or the fluorine-based surfactant described in JP1990-54202A (JP-H02-54202A) is preferable.

The fluorine content in the fluorine-based surfactant is suitably 3% to 40% by mass. The lower limit is more preferably 5% by mass or more, and still more preferably 7% by mass or more. The upper limit is more preferably 30% by mass or less, and still more preferably 25% by mass or less. In a case where the fluorine content is within the above-mentioned range, it is effective in terms of the evenness of the thickness of the coating film or liquid saving properties at a time of applying the coloring composition, and the solubility of the surfactant is also good.

Specific examples of the fluorine-based surfactant include the surfactants described in paragraph Nos. 0060 to 0064 of JP2014-41318A (paragraph Nos. 0060 to 0064 of the corresponding WO2014/17669A), or the like, the contents of which are incorporated herein. Examples of a commercially available product of the fluorine-based surfactant include MEGAFACE F-171, MEGAFACE F-172, MEGAFACE F-173, MEGAFACE F-176, MEGAFACE F-177, MEGAFACE F-141, MEGAFACE F-142, MEGAFACE F-143, MEGAFACE F-144, MEGAFACE R30, MEGAFACE F-437, MEGAFACE F-475, MEGAFACE F-479, MEGAFACE F-482, MEGAFACE F-554, and MEGAFACE F-780 (all manufactured by DIC Corporation), FLUORAD FC430, FLUORAD FC431, and FLUORAD FC171 (all manufactured by Sumitomo 3M), and SURFLON S-382, SURFLON SC-101, SURFLON SC-103, SURFLON SC-104, SURFLON SC-105, SURFLON SC1068, SURFLON SC-381, SURFLON SC-383, SURFLON S-393, and SURFLON KH-40 (all manufactured by ASAHI GLASS Co., Ltd.).

Furthermore, the following compound is also exemplified as the fluorine-based surfactant used in the present invention.

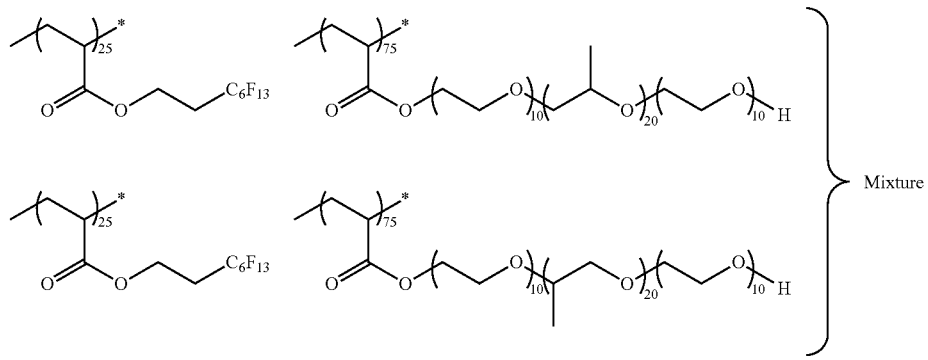

The weight-average molecular weight of the compound is preferably 3,000 to 50,000, and is, for example, 14,000. Further, a fluorine-containing polymer having an ethylenically unsaturated group in the side chain can also be used as a fluorine-based surfactant. Specific examples thereof include the compounds described in paragraph Nos. 0050 to 0090 and paragraph Nos. 0289 to 0295 of JP2010-164965A, such as MEGAFACE RS-101, RS-102, RS-718K, and the like manufactured by DIC Corporation.

In a case where the coloring composition of the present invention contains a surfactant, the content of the surfactant is preferably 0.0001% to 2.0% by mass, and more preferably 0.005% to 1.0% by mass, with respect to the total solid content of the coloring composition.

The composition of the present invention may include one kind or two or more kinds of the surfactant. In a case where the composition includes two or more kinds of the surfactant, the total sum thereof is preferably within the above range.

<<Curing Accelerator>>

The coloring composition of the present invention may contain a compound which functions as a curing accelerator.

As the curing accelerator, for example, at least one compound selected from the group consisting of an aromatic amine compound, a tertiary amine compound, an amine salt, a phosphonium salt, an amidine salt, an amide compound, a thiol compound, a block isocyanate compound, and an imidazole ring-containing compound can be used.

The low-temperature curing of the coloring composition can be realized more effectively by incorporating the curing accelerator into the coloring composition. Further, the storage stability of the coloring composition can also be further improved.

Examples of a commercially available product of the curing accelerator include KARENZ MT Series (manufactured by Showa Denko K. K.) such as KARENZ MTBD-1.

In the present invention, the curing accelerator can be used singly or as a mixture of two or more kinds thereof. The content of the curing accelerator is preferably 0.01 to 20 parts by mass, and particularly preferably 0.1 to 10 parts by mass, with respect to 100 parts by mass of the polymerizable compound.

<<Antioxidant>>

The coloring composition of the present invention can contain an antioxidant. Examples of the antioxidant include a phenolic compound, a phosphorous ester compound, and a thioether compound. Preferred examples thereof include a phenolic compound having a molecular weight of 500 or more, a phosphorous ester compound having a molecular weight of 500 or more, and a thioether compound having a molecular weight of 500 or more. These may be used as a mixture of two or more kinds thereof. As the phenol compound, any phenol compounds known as a phenol-based antioxidant can be used. Preferred examples of the phenol compounds include a hindered phenol compound. In particular, a compound having a substituent group at a site (ortho position) adjacent to the phenolic hydroxyl group is preferable. The above-mentioned substituent is preferably a substituted or unsubstituted alkyl group having 1 to 22 carbon atoms, and more preferably a methyl group, an ethyl group, a propionyl group, an isopropionyl group, a butyl group, an isobutyl group, a tert-butyl group, a pentyl group, an isopentyl group, a tert-pentyl group, a hexyl group, an octyl group, an isooctyl group, or a 2-ethylhexyl group. Further, a compound having a phenol group and a phosphorous ester group in the same molecule is also preferable. In addition, as the antioxidant, a phosphorus-based antioxidant can also be suitably used. Examples of the phosphorus-based antioxidant include tris[2-[[2,4,8,10-tetrakis(1, 1-dimethylethyl)dibenzo[d,f][1,3,2]dioxaphosphepin-6-yl]oxy] ethyl]amine, tris[2-[(4,6,9,11-tetra-tert-butyldibenzo[d,f][1, 3,2]dioxaphosphepin-2-yl)oxy]ethyl]amine, and ethyl bis(2, 4-di-tert-butyl-6-methylphenyl)phosphite. These are easily available as a commercially available product, and examples thereof include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (manufactured by ADEKA Corporation). The content of the antioxidant is preferably 0.01% to 20% by mass, and more preferably 0.3% to 15% by mass, with respect to the total solid content of the coloring composition. The antioxidant may be of one kind or two or more kinds thereof. In a case where two or more kinds of the antioxidant are used, the total sum thereof is preferably within the above range.

<<Bis(Trifluoromethanesulfonyl)Imide Salt>>

The coloring composition of the present invention may further include a bis(trifluoromethanesulfonyl)imide salt. By incorporation of the bis(trifluoromethanesulfonyl)imide salt, it is possible to improve the heat resistance of a cured film obtained from the coloring composition. Examples of the bis(trifluoromethanesulfonyl)imide salt include potassium bis(trifluoromethanesulfonyl)imide, sodium bis(trifluoromethanesulfonyl)imide, and lithium bis(trifluoromethanesulfonyl)imide. The content of the bis(trifluoromethanesulfonyl)imide salt is preferably 0.1 to 2 mol, and more preferably 0.3 to 0.8 mol, per mol of the repeating unit A having a triarylmethane structure which the polymer TP has. The bis(trifluoromethanesulfonyl)imide salt may be added during or after the polymerization of the polymer TP, or during the production of the coloring composition.

<<Other Components>>

The coloring composition of the present invention may further include various additives such as a dye stabilizer, an anti-reducing agent, an acid generator, a filler, an ultraviolet absorbent, an aggregation inhibitor, a sensitizer, and a light stabilizer, as desired. With respect to the dye stabilizer, the anti-reducing agent, or the acid generator, reference can be made to the description in paragraph Nos. 0223 to 0228 of WO2015/046285A, the contents of which are incorporated herein by reference.

<Method for Preparing Coloring Composition>

The coloring composition of the present invention is prepared by mixing the respective components with optional components, as desired.

Furthermore, in the preparation of the coloring composition, the respective components constituting the coloring composition may be blended at once or the respective components may be dissolved/dispersed in solvents and then sequentially blended. Further, the order of introduction and operating conditions during the blending are not particularly limited. For example, all the components may be dissolved/dispersed in a solvent simultaneously to prepare a composition, or as desired, two or more solutions/dispersion liquids may be appropriately prepared from the respective components and mixed during the use (during the application) to prepare a composition.

It is preferable that the coloring composition of the present invention is filtered using a filter for the purpose of removing impurities or reducing deficits, for example. Filters that have been used in the related art for filtration uses and the like may be used without particular limitation. Examples of the filter include filters formed of a fluorine resin such as polytetrafluoroethylene (PTFE), a polyamide-based resin such as Nylon-6 and Nylon-6,6, and a polyolefin resin (including a high-density or ultrahigh-molecular-weight polyolefin resin) such as polyethylene and polypropylene (PP). Among these materials, polypropylene (including high-density polypropylene) is preferable.

The pore diameter of the filter is suitably approximately 0.01 to 7.0 µm, preferably approximately 0.01 to 3.0 µm, and more preferably approximately 0.05 to 0.5 µm. By setting the pore diameter to this range, it is possible to reliably remove fine impurities which interfere with preparation of a uniform and smooth coloring composition in a subsequent step.

In a case where a filter is used, other filters may be used in combination therewith. At that time, filtering at a first filter may be carried out only once or two or more times.

In addition, first filters having different pore diameters within the aforementioned range may be combined. As the pore diameter herein, reference may be made to nominal values of a filter manufacturer. A commercially available filter may be selected from various filters provided by, for example, Pall Corporation, Advantec Toyo Kaisha, Ltd., Nihon Entegris K.K. (former Nippon Microlith Co., Ltd.), Kitz Micro Filter Corporation, or the like.

As a second filter, a filter formed of a material which is the same as the material for the aforementioned first filter and the like can be used.

For example, the filtering at the first filter may be carried out with only the dispersion liquid, and the other components may be mixed and then the filtering of the second filter may be carried out.

The coloring composition of the present invention can form a cured film having an excellent hue and an excellent contrast, and therefore, they can be suitably used for forming a colored layer (for forming colored pixels) of a color filter or the like in an image display device or a solid-state imaging device, or for manufacturing an ink for printing, an ink for ink jet printing, a paint, and the like.

<Cured Film, Color Filter, and Method for Manufacturing Color Filter>

The cured film of the present invention is formed by curing the coloring composition of the present invention. This cured film is preferably used in a color filter.

The color filter of the present invention may be formed by any method that allows formation of a cured colored region (colored pattern) by applying the coloring composition of the present invention onto a substrate.

In a case of producing a color filter for a solid-state imaging device using the coloring composition of the present invention, the manufacturing method described in paragraphs 0359 to 0371 of JP2011-252065A can also be employed.

The method for manufacturing a color filter of the present invention includes a step of applying the coloring composition of the present invention onto a substrate to form a coloring composition layer, and a step of patterning the coloring composition layer formed by a photolithography method or a dry etching method.

The pattern forming method may be either a pattern forming method using a photolithography method or a pattern forming method using a dry etching method. Further, in a case where a color filter obtained by forming a cured film (colored pattern) colored in a plurality of colors is produced, all the colored patterns may be used in a photolithography method or a dry etching method to form a pattern, or the first color (the first layer) may be used in a dry etching method to form a pattern, and the second or later colors (from the second layer) may be used in a photolithography method to form a pattern.

Pattern formation using a photolithography method preferably includes a step of forming a coloring composition layer on a substrate using a coloring composition, a step of exposing the coloring composition layer in the pattern shape, a step of removing unexposed areas in the coloring composition layer by development to form a pattern. The pattern formation may also be provided with, as desired, a step of baking the coloring composition layer (pre-baking step) and a step of baking the developed pattern (post-baking step).

Furthermore, pattern formation using a dry etching method includes a step of forming a coloring composition layer on a substrate using a coloring composition, followed by curing, thereby forming a colored layer, a step of forming a photoresist layer on the colored layer, a step of patterning the photoresist layer by exposure and development to obtain a resist pattern, and a step of dry-etching the colored layer using the resist pattern as an etching mask to form a pattern. Hereinafter, the respective steps will be described.

<<Coloring Composition Layer Forming Step>>

In the coloring composition layer forming step, the coloring composition of the present invention is applied onto a substrate to form a coloring composition layer.

Examples of the substrate include non-alkali glass, sodium glass, Pyrex (registered trademark) glass, quartz glass, and these glasses having a transparent conductive layer deposited thereon, each of which is for use in liquid crystal display devices or the like, or substrates for photoelectric conversion elements for use in solid-state imaging device and the like, such as a silicon substrate and a plastic substrate. Incidentally, a black matrix separating pixels or a transparent resin layer for promoting adhesion or for other purposes may be formed on these substrates. Further, an undercoat layer may be provided on the substrate, as desired, to improve adhesion to the overlying layers or to prevent diffusion of substances or to smoothen the surface.

In addition, the plastic substrate preferably has a gas barrier layer and/or a solvent-resistant layer on the surface.

Alternatively, a driving substrate on which is mounted a thin-film transistor (TFT) for a thin-film transistor (TFT) type color liquid crystal display device (hereinafter also referred to as a "driving substrate for TFT type liquid crystals") can be used as a substrate, and a colored pattern formed by using the coloring composition of the present invention can also be formed on the driving substrate to manufacture a color filter.

Examples of the substrates in a driving substrate for TFT type liquid crystals include glass, silicon, polycarbonate, polyester, aromatic polyamide, polyamideimide, and polyimide. These substrates may have undergone an appropriate pretreatment such as a chemical treatment with a silane coupling agent or the like, a plasma treatment, ion plating, sputtering, a gas phase reaction, and vacuum vapor deposition, as desired. For example, a driving substrate for TFT type liquid crystals on which a passivation layer such as a silicon nitride film has been formed on the surface of the substrate can be used.

As a method for applying the coloring composition, coating is preferable, and the coating is preferably carried out using a coating method such as spin coating, slit coating, cast coating, roll coating, bar coating, and ink jet coating.

The coloring composition layer formed on the substrate is preferably dried (pre-baked). The pre-baking can be carried out using a hot plate, an oven, or the like, under the conditions of a temperature range of 50° C. to 140° C., and preferably 70° C. to 110° C. for 10 seconds to 300 seconds. Incidentally, the pre-baking may be used in combination a high-frequency treatment or the like. The high-frequency treatment can also be used singly. As desired, a vacuum treatment can also be carried out before the pre-baking. The conditions for vacuum drying are a degree of vacuum of preferably 13 to 133 Pa, and more preferably 26 to 66.5 Pa.

The thickness of the coloring composition layer formed by the coloring composition is appropriately selected depending on purposes. In a case of a color filter for an image display device, the thickness is preferably in the range of 0.2 to 5.0 m, more preferably in the range of 1.0 to 4.0 m, and the most preferably in the range of 1.5 to 3.5 µm. In addition, in a case of a color filter for a solid-state imaging device, the thickness is preferably in the range of 0.2 to 5.0 µm, more preferably in the range of 0.3 to 2.5 µm, and most preferably in the range of 0.3 to 1.5 µm. Incidentally, the thickness of the coloring composition layer is the thickness of the film after pre-baking.

(Pattern Formation by Photolithography Method)

<<Exposing Step>>

Subsequently, in the method for manufacturing a color filter of the present invention, a film including the coloring composition formed on the substrate as described above (coloring composition layer) is subjected to exposure through, for example, a photomask. As the light or radiation which can be applied for the exposure, a g-ray, an h-ray, an i-ray, a j-ray, an KrF light, or an ArF light is preferable, and an i-ray is particularly preferable. In a case where the i-ray is used for irradiation, it is preferably irradiated at an exposure dose of 100 mJ/cm$^2$ to 10,000 mJ/cm$^2$.

Furthermore, as other exposure light source, a mercury lamps at an ultra high pressure, a high pressure, a medium pressure, and a low pressure, chemical lamps, carbon arc lamps, xenon lamps, metal halide lamps, various visible light and ultraviolet laser light sources, fluorescent lamps, tungsten lamps, solar light, or the like can also be used.

In the exposure method using a laser light source, an ultraviolet laser is preferably used as a light source. As irradiation light, an ultraviolet laser having a wavelength in the range of 300 nm to 380 nm is preferable, and an ultraviolet laser having a wavelength in the range of 300 nm to 360 nm is more preferable since it conforms to the photosensitive wavelength to which the resist is sensitive. Specifically, relatively inexpensive lasers with a particularly high output can be suitably used, including solid-state lasers such as the third harmonic generation (355 nm) of Nd:YAG laser (yttrium aluminum garnet) or excimer lasers XeCl (308 nm) and XeF (353 nm).

The exposure dose of the exposure target (pattern) is in the range of 1 mJ/cm$^2$ to 100 mJ/cm$^2$, and more preferably in the range of 1 mJ/cm$^2$ to 50 mJ/cm$^2$. The exposure doses in these ranges are preferable in terms of productivity in pattern formation.

The exposure apparatus is not particularly limited, but commercially available products such as Callisto (manufactured by V-Technology Co., Ltd.), EGIS (manufactured by V-Technology Co., Ltd.), DF2200G (manufactured by DAINIPPON SCREEN MFG. CO., LTD.), or the like can be used. Further, other apparatuses than those described above may also be suitably used.

In a case where a color filter for a liquid crystal display device is manufactured, exposure primarily using an h-ray or an i-ray by a proximity exposure system or a mirror projection exposure system is preferably used. Further, in a case where a color filter for a solid-state imaging device is manufactured, it is preferable to primarily use an i-ray in a stepper exposure system. In addition, the photomask used for manufacturing a color filter using a driving substrate for TFT liquid crystals has a pattern for forming a pixel (colored pattern) as well as a pattern for forming grooves such as a through-hole.

The coloring composition layer exposed as described above may be heated. In addition, exposure can also be carried out under a stream of nitrogen gas in the chamber in order to suppress oxidative discoloration of coloring materials in the coloring composition layer.

<<Developing Step>>

Subsequently, the coloring composition layer after the exposure is subjected to development with a developer. Thus, a negative or positive colored pattern (resist pattern) can be formed. In the developing step, uncured areas of the exposed coating layer are eluted in the developer while only cured areas remain on the substrate.

Any developer can be used so far as it dissolves the coating layer of the coloring composition (coloring composition layer) in uncured areas while it does not dissolve cured areas. For example, a combination of various organic solvents or an aqueous alkaline solution can be used.

Examples of the organic solvents used for development include those already described as solvents that can be used to prepare the coloring compositions of the present invention.

Examples of the aqueous alkaline solution include an aqueous alkaline solution in which an alkaline compound such as tetraethylammonium hydroxide, tetrapropylammonium hydroxide, tetrabutylammonium hydroxide, trimethylbenzylammonium hydroxide, benzyltrimethylammonium hydroxide, sodium hydroxide, potassium hydroxide, sodium carbonate, sodium hydrogen carbonate, sodium silicate, sodium metasilicate, aqueous ammonia, ethylamine, diethylamine, dimethylethanolamine, tetramethylammonium hydroxide, corrin, pyrrole, piperidine, or 1,8-diazabicyclo-[5.4.0]-7-undecene is dissolved at a concentration of 0.001% by mass to 10% by mass, and preferably 0.01% by mass to 1% by mass. In a case where the developer is an aqueous alkaline solution, the alkaline concentration is adjusted such that the pH preferably becomes 11 to 13, and more preferably becomes 11.5 to 12.5.

The aqueous alkaline solution may contain an appropriate amount of a water-soluble organic solvent such as methanol and ethanol, a surfactant, and the like.

The developing temperature is preferably 20° C. to 30° C., and the developing time is preferably 20 to 90 seconds.

Any development method can be used, such as a dipping mode, a shower mode, a spray mode, or the like of the development method, which may be combined with a swing mode, a spin mode, an ultrasonic mode, or the like. Uneven development can also be prevented by wetting the surface to be developed with water or the like before it contacts the developer. Further, development can also be carried out while the substrate is inclined.

In addition, puddle development is also used for manufacturing a color filter for a solid-state imaging device.

After the development treatment, a rinsing treatment for removing an excess of the developer by washing is preferably carried out. The rinsing treatment is typically carried out using pure water, but alternatively, it may also be carried out using pure water during final washing while using recycled pure water during initial washing to save water, or by washing the substrate inclined, or by washing in combination with ultrasonic irradiation.

After the development, followed by drying, a heating treatment (post-baking) can also be carried out. The post-baking is a heating treatment after the development so as to achieve complete film curing. In a case of carrying out the post-baking, the heating temperature is preferably 100° C. to 300° C., more preferably 150° C. to 250° C., and still more preferably 200° C. to 250° C. The heating time is preferably 10 minutes to 120 minutes. This heating treatment (post-baking) can be carried out on the developed coated film by a continuous or batch operation using a heating means such as a hot plate, a convection oven (hot-air circulation dryer), or a high-frequency heater under the above conditions.

In the method for manufacturing a color filter of the present invention, the colored pattern (pixels) formed by using the coloring composition can be post-exposed by irradiation with ultraviolet rays.

In addition, post-exposure can also be used in combination with post-baking. For example, it is preferable that the post-baking is carried out after the post-exposure is carried out.

The colored pattern obtained as described above constitutes pixels in the color filter. In the manufacture of the color filter having pixels in a plurality of colors, the respective steps may be repeated to suit a desired number of colors.

In addition, at a time when each of formation, exposure, and development of a monochromatic coloring composition layer is finished (per color), the post-exposure and/or the post-baking treatment may be carried out, or at a time when all of formation, exposure, and development of the coloring composition layer in a desired number of colors are finished, the post-exposure and/or post-baking treatment may be carried out at once.

A color filter having cured films (colored patterns) colored in a plurality of colors formed therein can be manufactured by sequentially repeating each of the above steps for each color to suit a desired number of hues.

(Pattern Formation by Dry Etching Method)

Furthermore, the coloring composition of the present invention can also be applied to a method for manufacturing a color filter, which includes a dry etching step. One example of such the manufacturing method may be a method including a step of forming a colored layer using the coloring composition of the present invention, a step of forming a photoresist layer on the colored layer, a step of patterning the photoresist layer by performing exposure and development to obtain a resist pattern, and a step of dry-etching the colored layer using a resist pattern as an etching mask.

The color filter obtained by the method for manufacturing a color filter of the present invention (the color filter of the present invention) has a good hue and a good contrast, and excellent heat resistance and solvent resistance. In addition, it also has an excellent voltage holding ratio.

The color filter of the present invention can be used in an image display device or a solid-state imaging device, and is particularly suitable for applications in a liquid crystal display device. In a case where the color filter is used in the liquid crystal display device, it is possible to achieve the display of an image having excellent spectral characteristics and contrast while accomplishing a good hue.

The applications of the coloring composition of the present invention have been described above, mainly with reference to applications in forming colored patterns in a color filter, but the coloring composition can also be applied for forming black matrices that separate the color patterns (pixels) constituting a color filter.

Black matrices on a substrate can be formed by the respective steps of coating, exposure, and development using a coloring composition containing a processed pigment of a black pigment such as carbon black and titanium black, optionally followed by post-baking.

<Image Display Device>

The image display device of the present invention is configured to include the color filter of the present invention. Examples of the image display device include a liquid crystal display device and an organic electroluminescence (organic EL) display device. In particular, the image display device is suitable for the applications of a liquid crystal display device. A liquid crystal display device including the color filter of the present invention is capable of displaying a high-quality image having a good hue and excellent display characteristics in a display image.

The definition of the image display devices or details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention is particularly effective for a liquid crystal display device using a color thin film transistor (TFT) system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching driving system such as in-plane switching (IPS) and a pixel division system such as multi-domain vertical alignment (MVA), or to super-twist nematic (STN), twisted nematic (TN), vertical alignment (VA), on-chip spacer (OCS), fringe field switching (FFS), reflective optically compensated bend (R-OCB), and the like.

In addition, the color filter of the present invention can be provided to a color-filter on array (COA) system which is a bright and high-definition system.

If the color filter of the present invention is used in an image display device, high contrast can be realized when the color filter is combined with a three-wavelength tube of a cold cathode fluorescent diode known in the related art. In addition, if a light-emitting diode light source of LED in red, green, and blue is used as a backlight, an image display device having high brightness, high color purity, and good color reproducibility can be provided.

<Solid-State Imaging Device>

The solid-state imaging device of the present invention includes the above-mentioned color filter of the present invention. The configuration of the solid-state imaging device of the present invention is not particularly limited as long as it includes the color filter of the present invention and functions as a solid-state imaging device, but examples thereof include the configurations as follows.

The solid-state imaging device has a configuration in which a plurality of photodiodes forming a light-receiving area of the solid-state imaging device (a CCD image sensor, a CMOS image sensor, and the like), and a transmission electrode including polysilicone and the like are provided on a support; a light-shielding film including tungsten and the like, which has openings corresponding to only light-receiving portions of the photodiodes, is provided on the photodiodes and the transmission electrode; a device-protecting film including silicone nitride and the like, which is formed on the light-shielding film so as to cover the entire surface of the light-shielding film and the light-receiving portions of the photodiodes is included; and the color filter for a solid-state imaging device of the present invention is provided on the device-protecting film.

In addition, the solid-state imaging device may also be configured such that it has a light-collecting unit (for example, a microlens, which is the same hereinafter) on a device-protecting film and under a color filter (on the side closer to a supporter) or has a light-collecting unit on a color filter.

EXAMPLES

Hereinafter, the present invention will be described in more detail with reference to Examples. The materials, amounts used, ratios, the treatment specifications, the treatment orders, and the like shown in Examples below can be appropriately modified as long as the gist of the present invention is not impaired. Thus, the scope of the present invention is not limited to the specific examples shown below. Further, "%" and "part(s)" are based on mass unless otherwise specified.

<Measurement Method (GPC Measurement) for Weight-Average Molecular Weight (Mw) of Polymer TP>

The Mw of the polymer TP is a value in terms of a polymethacrylic acid in a gel permeation chromatography (GPC) measurement with HLC-8220GPC (manufactured by Tosoh Corporation), in which three columns, TSKgel SuperAW4000, SuperAW3000, and SuperAW2500 (manufactured by Tosoh Corporation, 7.8 mm (inner diameter)×30 cm), connected in series, were used as a column, under the measurement conditions of a 5 mmol/L sodium trifluoroacetate-containing trifluoroethanol solution as a developing solvent, a flow rate of 0.35 mL/min, a sample injection amount of 20 µL, and a measurement temperature of 40° C., and an ultraviolet ray detector was used.

<Content of Compound with Weight-Average Molecular Weight of Less than 5,000, Having Triarylmethane Structure>

The content (% by area) of the polymer TP with a weight-average molecular weight of less than 5,000 was calculated through estimation from data obtained by GPC measurement.

Synthesis Example 1

(Synthesis of TAM 1)

TAM 1 was synthesized by the following route.

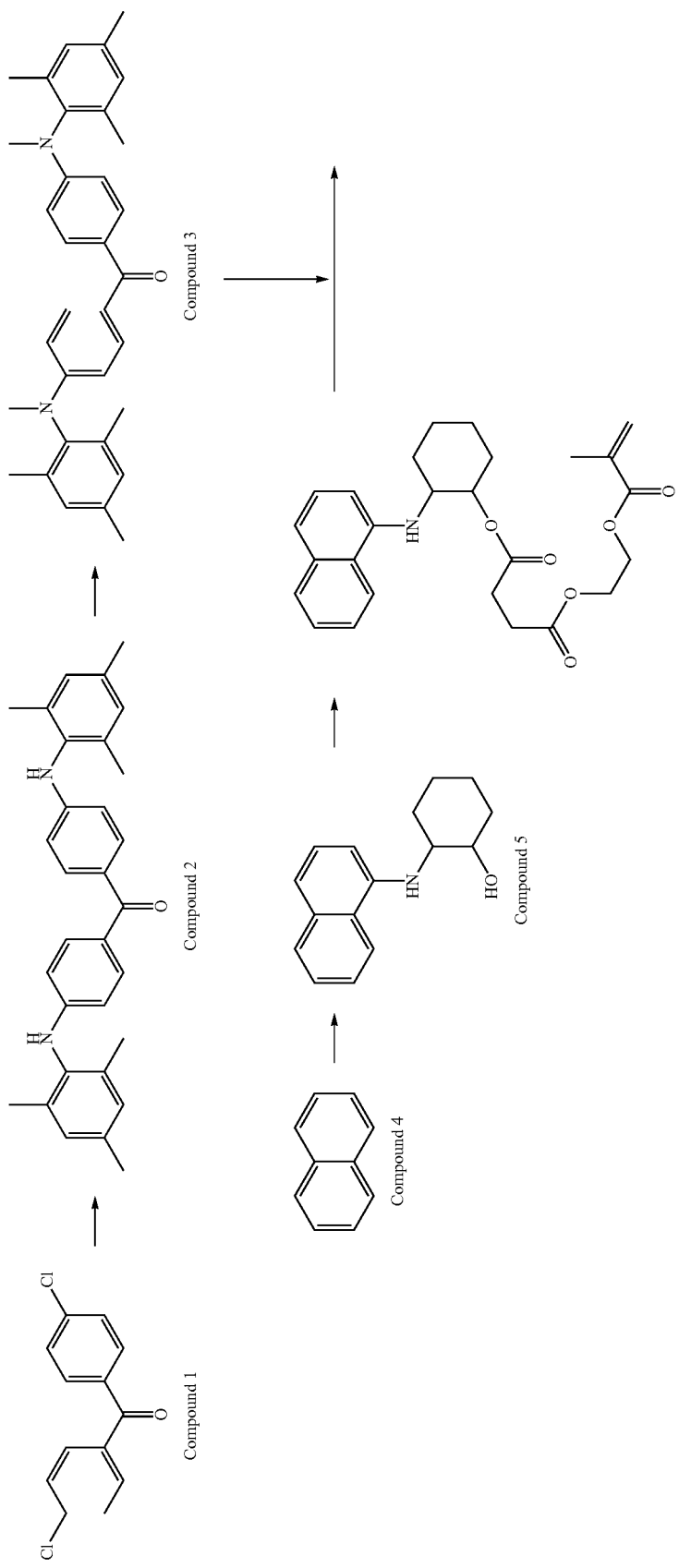

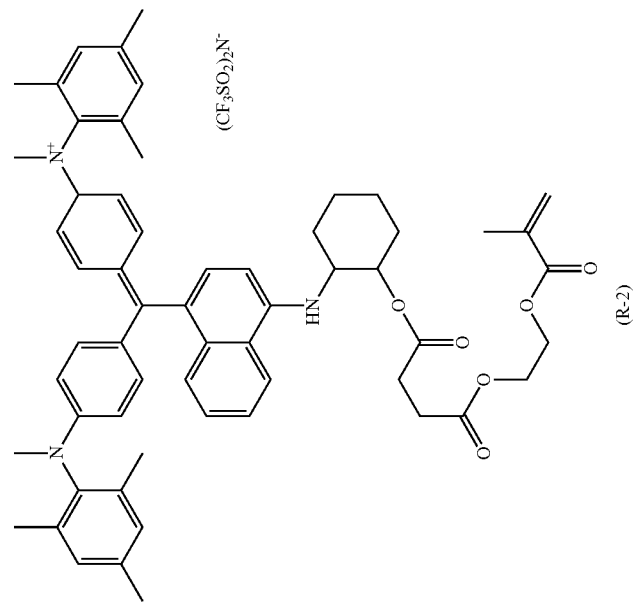
(R-2)

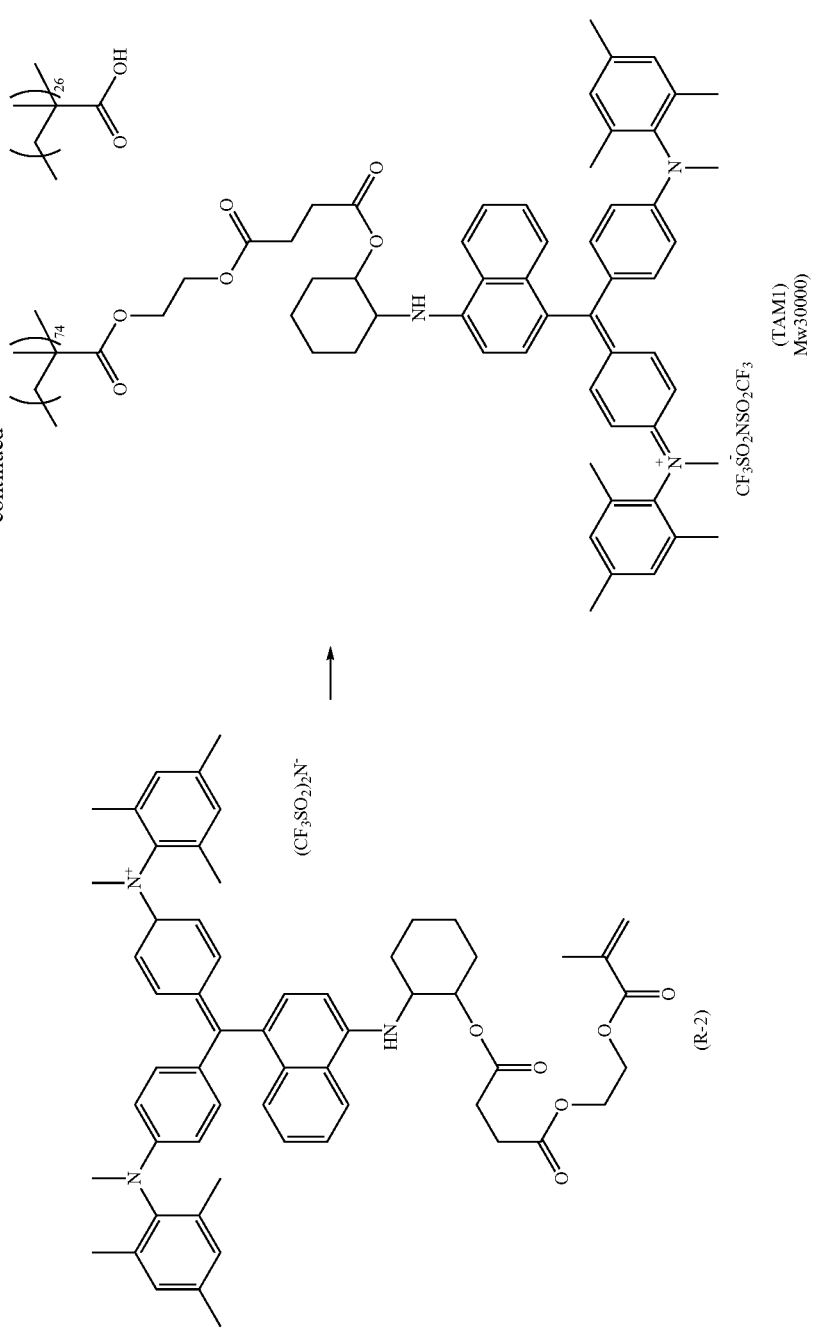

(Synthesis of Synthesis Intermediate (Compound 2))

25.1 g of 4,4'-dichlorobenzophenone (Compound 1), 200 mL of xylene, 28.8 g of sodium tert-butoxide, and 1,3,5-mesitylamine were introduced into a three-neck flask, and the mixture was subjected to nitrogen bubbling for 1 hour. 22.5 mg of palladium (II) acetate and 78.1 mg of dicyclohexyl(1,1-diphenyl-1-propen-2-yl) phosphine were added thereto, and the mixture was stirred at 110° C. for 3 hours.

After cooling the mixture to room temperature, a mixed solution of 200 mL of ion exchange water and 40 mL of 2-propanol were added thereto, and the mixture was filtered and then washed with a mixed solution of 160 mL toluene and 20 mL of 2-propanol, 200 mL of ion exchange water, and 200 mL of 2-propanol in this order to obtain 39.3 g (yield of 87.6%) of a compound 2.

(Synthesis of Synthesis Intermediate (Compound 3))

150 mL of N-methylpyrrolidone and 8.0 g of sodium hydride were introduced into a three-neck flask under a nitrogen flow. A solution in which 30.0 g of the compound 2 and 100 mL of N-methylpyrrolidone had been dissolved was added dropwise thereto for 30 minutes, and the mixture was stirred for 3 hours, and 27.4 g of methyl para-toluenesulfonate was added dropwise thereto for 30 minutes. Then, the mixture was stirred for 2 hours, a mixed solution of 220 mL of ion exchange water and 50 mL of 2-propanol was slowly added dropwise thereto, and then 70 mL of 1 mol/L aqueous hydrochloric acid was added dropwise to the mixture. The mixture was filtered and washed with 200 mL of ion exchange water, 200 mL of methanol, and a mixed solution of 160 mL of hexane and 20 mL of 2-propanol in this order to obtain 31.6 g (99.0%) of a compound 3.

(Synthesis of Synthesis Intermediate (Compound 5))

110 mL of acetonitrile, 24.5 g of 1-naphthylamine (compound 4), and 3.2 g of zinc perchlorate hexahydrate were added into a three-neck flask, and the mixture was warmed to 40° C. 23.5 g of 1,2-epoxycyclohexane was added dropwise thereto for 30 minutes, and then the mixture was stirred for 5 hours. 110 mL of acetonitrile was added thereto, and 170 mL of ion exchange water was added dropwise to the mixture. The mixture was stirred for 20 minutes, then cooled to room temperature, stirred for 1 hour, and then filtered. The mixture was washed twice with 50 mL of ion exchange water to obtain 32.3 g (yield of 71.2%) of a compound 5.

(Synthesis of Synthesis Intermediate (R-2))

20 mL of acetonitrile, 4.8 g of 2-methacryloyloxyethyl succinate, 5.3 g of para-toluenesulfonyl chloride, and 4.8 g of the compound 5 were added into a three-neck flask. While cooling the mixture to 10° C. or lower, 4.6 g of 1-methylimidazole was added dropwise thereto for 30 minutes, and the mixture was stirred for 5 hours. After warming the mixture to room temperature, the mixture was subjected to liquid separation by the addition of 30 mL of toluene and 30 mL of ion exchange water, then washed twice with 30 mL of a 5% by mass aqueous $NaHCO_3$ solution, and concentrated under reduced pressure to obtain an oily compound.

8.9 g of the obtained oily compound, 20 mL of acetonitrile, 9.1 g of the compound 3, and 6.4 g of phosphorus oxychloride were introduced into a three-neck flask, and the mixture was stirred at 90° C. for 3 hours, cooled to room temperature, and then subjected to liquid separation by the addition of 110 mL of ethyl acetate and 60 mL of ion exchange water. The mixture was washed with a 5% by mass aqueous $NaHCO_3$ solution, 7.3 g of lithium bis(trifluoromethanesulfonyl)imide was added thereto, and the mixture was stirred for 30 minutes and subjected to liquid separation by the addition of 60 mL of ion exchange water, and washed with a 5% by mass aqueous $NaHCO_3$ solution. The mixture was concentrated under reduced pressure and purified twice by a silica gel column to obtain 7.0 g (yield of 77.1%) of a compound R-2.

(Synthesis of TAM 1 (Polymerization Step))

1.9 g of propylene glycol-1-monomethyl ether-2-acetate was introduced into a three-neck flask, and heated to 60° C. under a nitrogen flow. A solution of 4.5 g of propylene glycol-1-monomethyl ether-2-acetate, 0.18 g of dodecylmercaptan, 3.8 g of a synthesis intermediate (R-2), 0.43 g of methacrylic acid, and 1.3 g of 2,2'-azobis(2,4-dimethylvaleronitrile) was added dropwise thereto for 1 hour, and the mixture was stirred for 1 hour, and then 0.08 g of 2,2'-azobis(2,4-dimethylvaleronitrile) was added thereto and the mixture was stirred for 5 hours. The mixture was cooled to room temperature to obtain a solution (concentration of a solid content of 50% by mass) of TAM 1 with a weight-average molecular weight of 30,000.

Synthesis Example 2

(Synthesis of TAM 2 to 6)

In the same manner as in Synthesis Example 1 except that the amounts of dodecylmercaptan in the polymerization step were changed, TAM 2 to 6 were synthesized.

Synthesis Example 3

(Synthesis of TAM 7 to 12, and 15 to 18)

In the same manner as for TAM 1 except that the amounts of the respective monomers or the types of the monomers having acid groups in the polymerization step were changed, TAM 7 to 12, and 15 to 18 were synthesized.

Synthesis Example 4

(Synthesis of TAM 13)

In the same manner as for TAM 1, using a synthesis intermediate synthesized by the same method as for the synthesis of the synthesis intermediate (R-2) except that the synthesis was carried out using methacrylic acid instead of 2-methacryloyloxyethyl succinic acid in the synthesis of the synthesis intermediate (R-2), TAM 13 was synthesized.

Synthesis Example 5

(Synthesis of TAM 14)

In the same manner as for TAM 1, using a synthesis intermediate synthesized by the same method as for the synthesis of the synthesis intermediate (R-2) except that the synthesis was carried out using 4,4'-bisdiethylaminobenzophenone instead of the compound 3 in the synthesis of the synthesis intermediate (R-2), TAM 14 was synthesized.

<Synthesis of R1>

Basic Blue 7 (manufactured by Tokyo Chemical Industry Co., Ltd.) and lithium bis(trifluoromethanesulfonyl)imide were mixed, and a counter anion of chlorine was exchanged by bis(trifluoromethanesulfonyl)imide to obtain R1.

<Synthesis of R2>

2.0 g of propylene glycol-1-monomethyl ether-2-acetate was introduced into a three-neck flask, and heated to 60° C. under a nitrogen flow, and a solution of 7.7 g of propylene glycol-1-monomethyl ether-2-acetate, 0.15 g of dodecyl-mercaptan, 3.2 g of the synthesis intermediate (R-2), 0.51 g of methacrylic acid, 0.51 g of cyclohexyl methacrylate, and 1.3 g of 2,2'-azobis(2,4-dimethylvaleronitrile) was added dropwise for 1 hour, and the mixture was stirred for 1 hour. Then, 0.08 g of 2,2'-azobis(2,4-dimethylvaleronitrile) was added thereto, and the mixture was stirred for 5 hours. The mixture was cooled to room temperature to obtain a solution (concentration of the solid content of 30% by mass) of R2 with a weight-average molecular weight of 30,000. In Comparative Example 2 using R2 as a colorant, the amount of the solution of R2 to be added to the coloring composition was set to 17.0 parts by mass.

<Synthesis of R3 and R4>

By the same method as for TAM 1 except that the mass ratio of the synthesis intermediate (R-2) to the methacrylic acid was set to be as follows, and the amount of dodecyl-mercaptan to be used was adjusted, R3 and R4 were synthesized.

R3 . . . Synthesis intermediate (R-2):methacrylic acid=90:10 in terms of mass ratio R4 . . . Synthesis intermediate (R-2):methacrylic acid=30:70 in terms of mass ratio Examples 1 to 18, and Comparative Examples 1, 3, and 4

(Preparation of Coloring Composition)

The respective components were mixed such that they had the following composition, thereby preparing a coloring composition.

<<Composition>>

Colorant (concentration of the solid content of 50% by mass solution) . . . 10.2 parts by mass
Polymerizable compound (T-1) . . . 6.0 parts by mass
Alkali-soluble binder (U-2) . . . 5.3 parts by mass
Photopolymerization initiator (V-4) . . . 0.3 parts by mass
Curing accelerator (V-5) . . . 0.2 parts by mass
Crosslinking agent (U-1) . . . 2.0 parts by mass
Additive (W-1) . . . 0.5 parts by mass
Solvent (X-1) . . . 71 parts by mass
Solvent (X-3) . . . 13 parts by mass
Surfactant (Z-1) . . . 0.01 parts by mass Comparative Example 2

In the same manner as in Example 1 except that 17 parts by mass of a solution (solution having a concentration of the solid content of 30% by mass) of R2 obtained above was used as a colorant, a coloring composition was prepared.

Colorant: Solutions of TAM 1 to 18, and R1 to R4 produced in Synthesis Examples above. The structures of TAM 1 to 18, and R1 to R4 are shown below. In the following formulae, the numerical values denoted together with repeating units are the mass ratios of the repeating units.

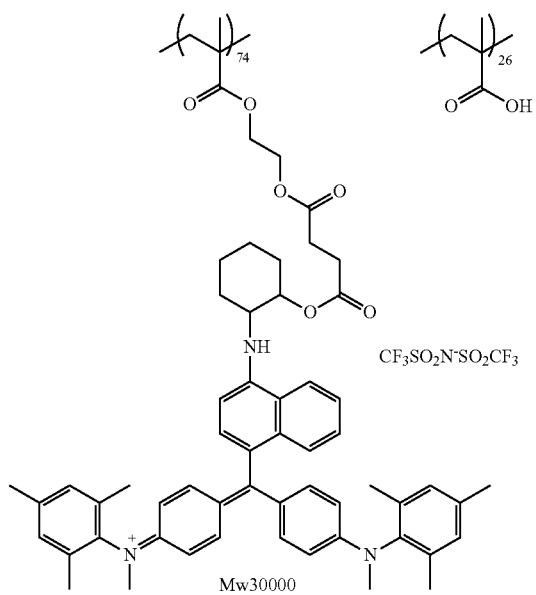

(TAM1)

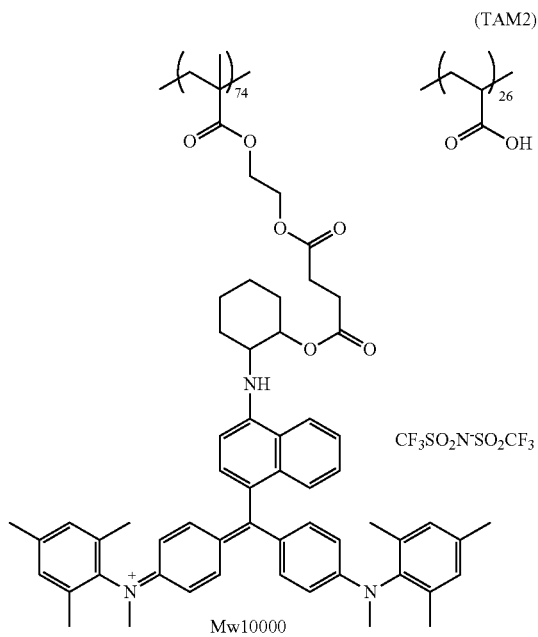

(TAM2)

(TAM3)
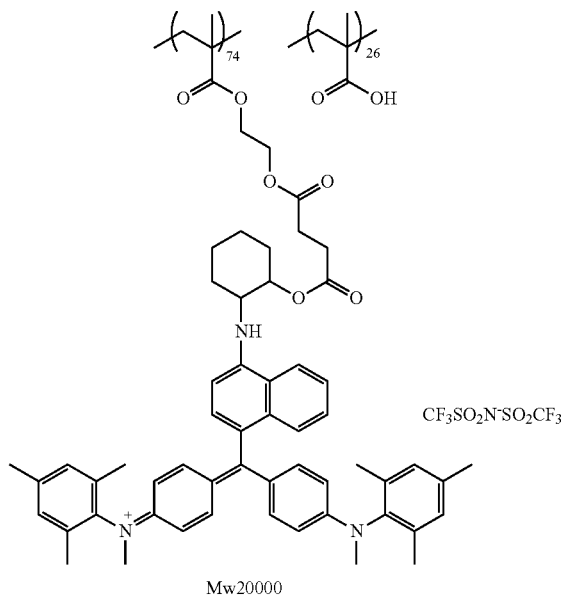
Mw20000
(TAM4)
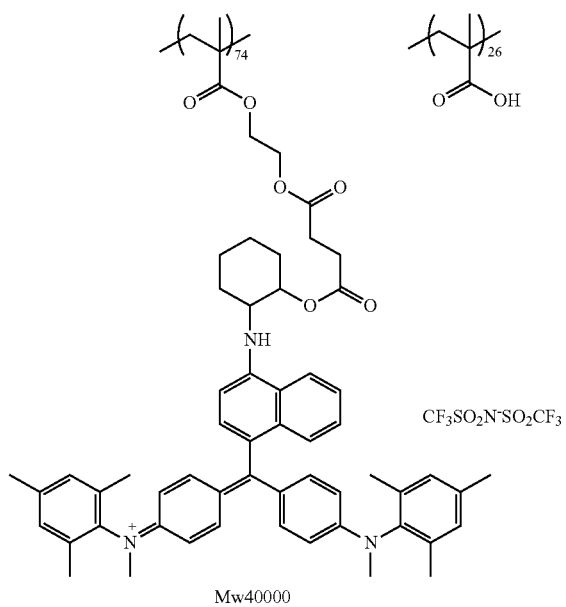
Mw40000
(TAM5)
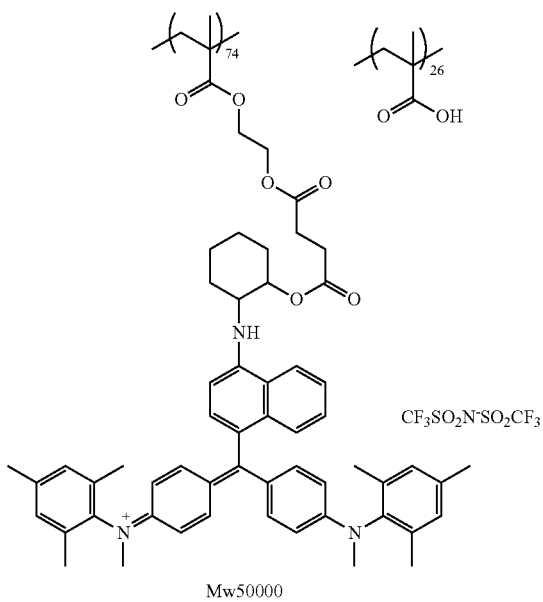
Mw50000
(TAM6)
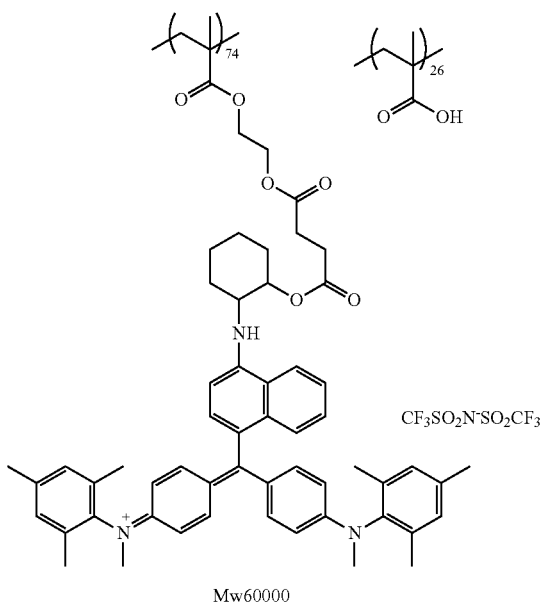
Mw60000

-continued
(TAM7)
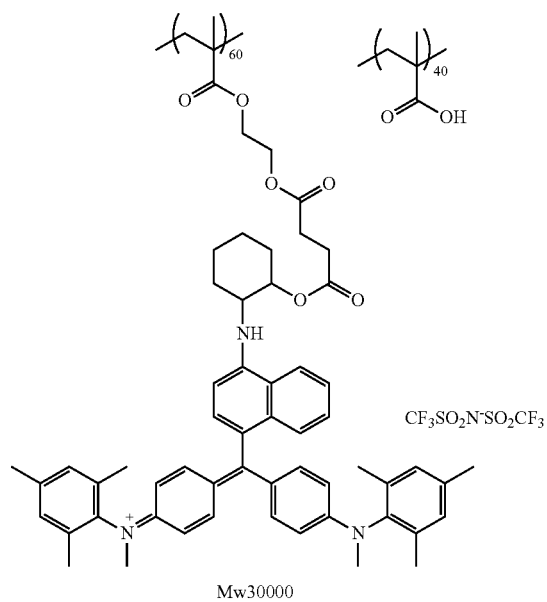
(TAM9)
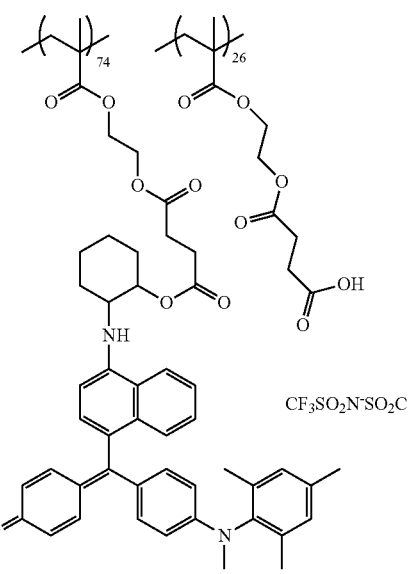
(TAM8)
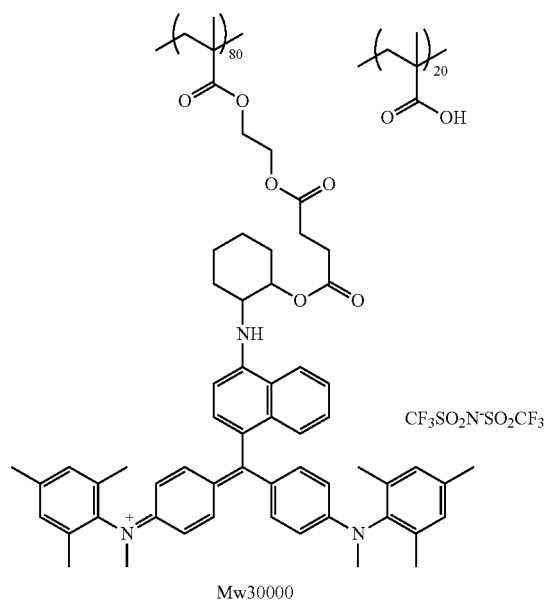
(TAM10)
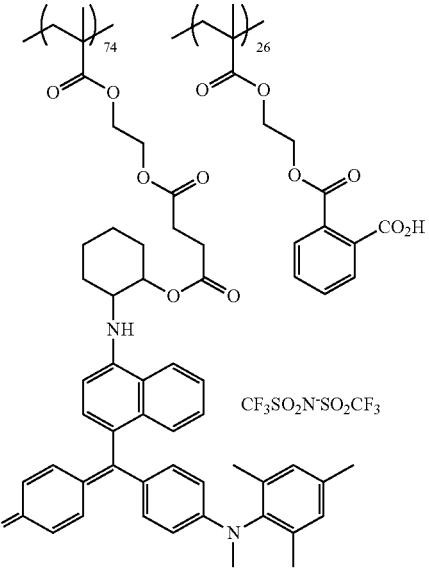

(TAM11)
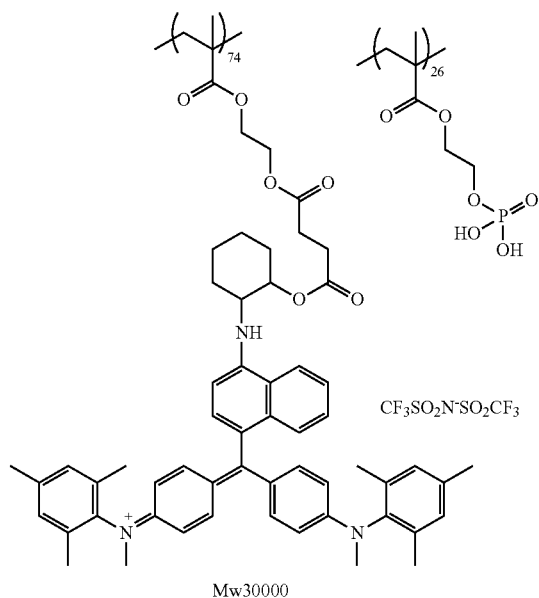
(TAM13)
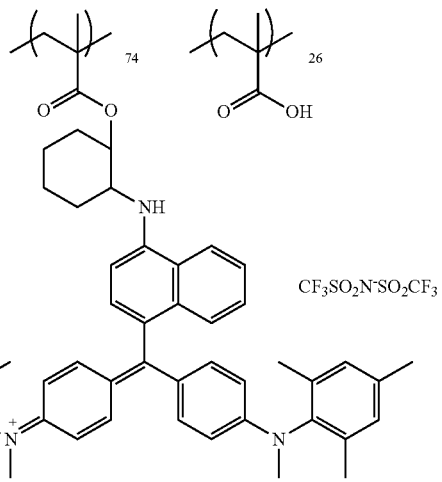
(TAM12)
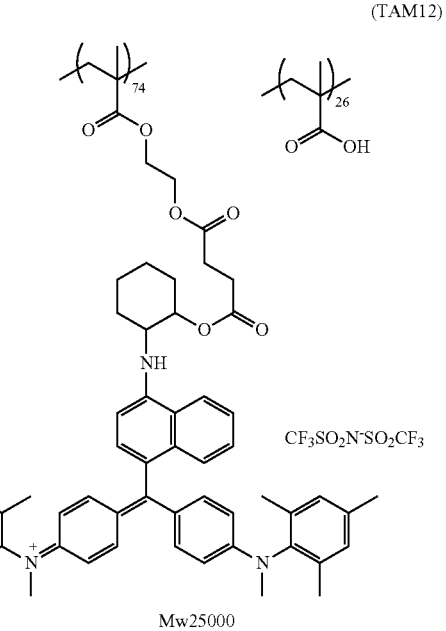
(TAM14)
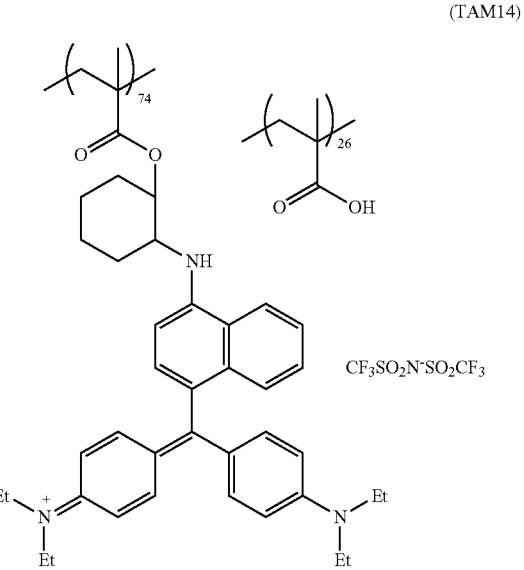

(TAM15)
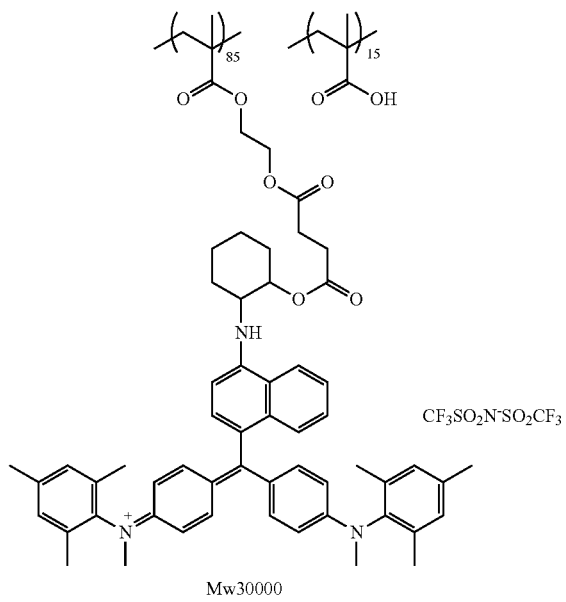
(TAM16)
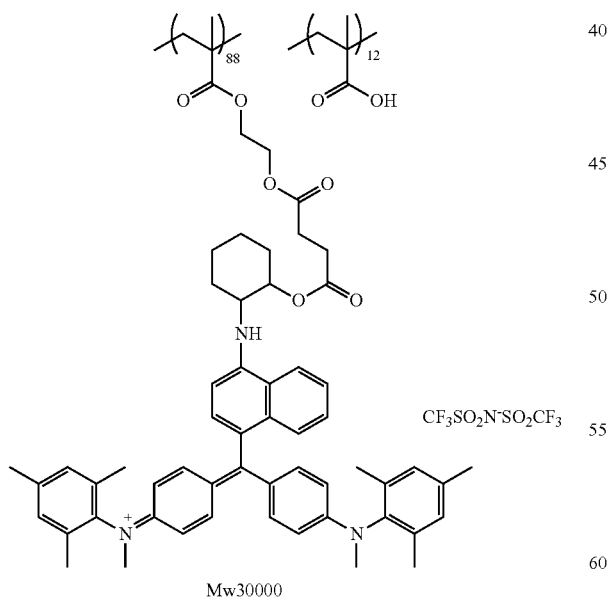
(TAM17)
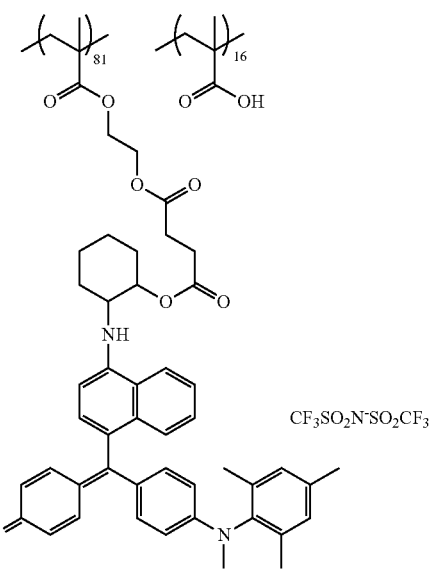
(TAM18)
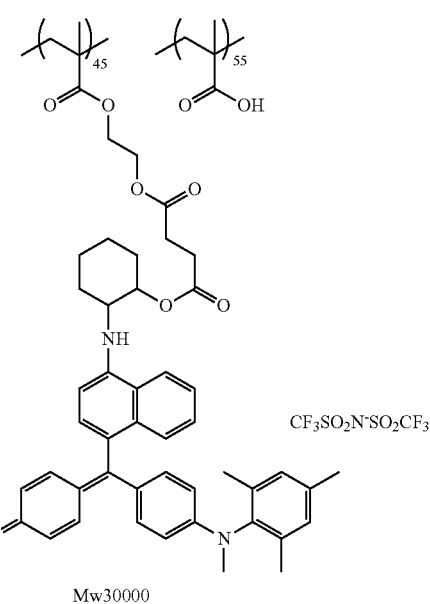
(R1)
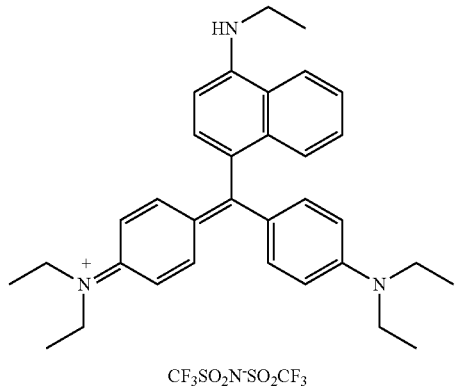

(R2)

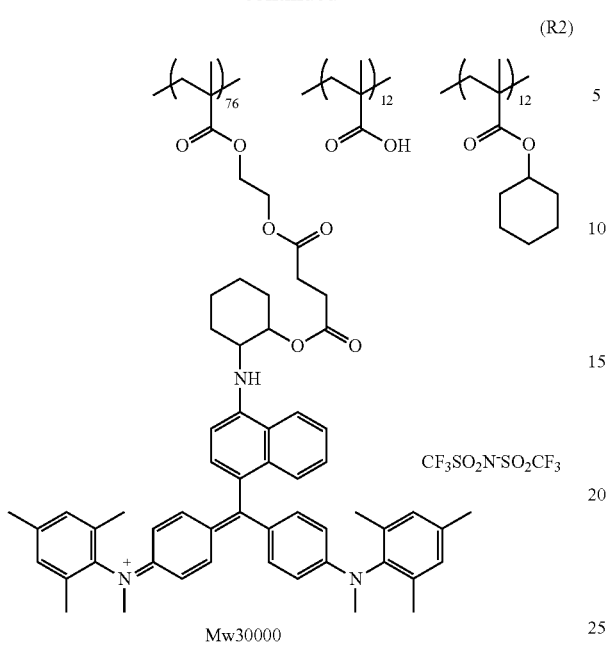

(R4)

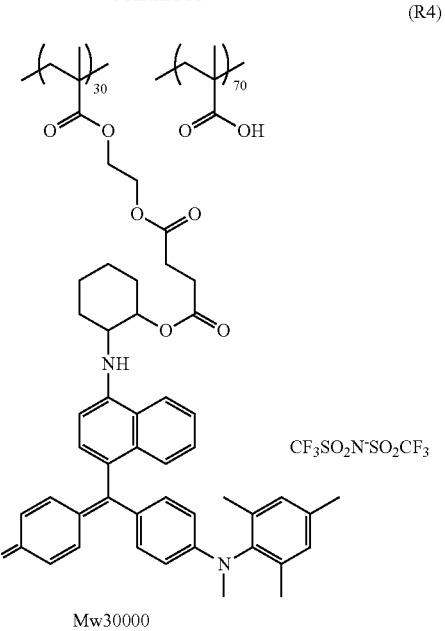

(R3)

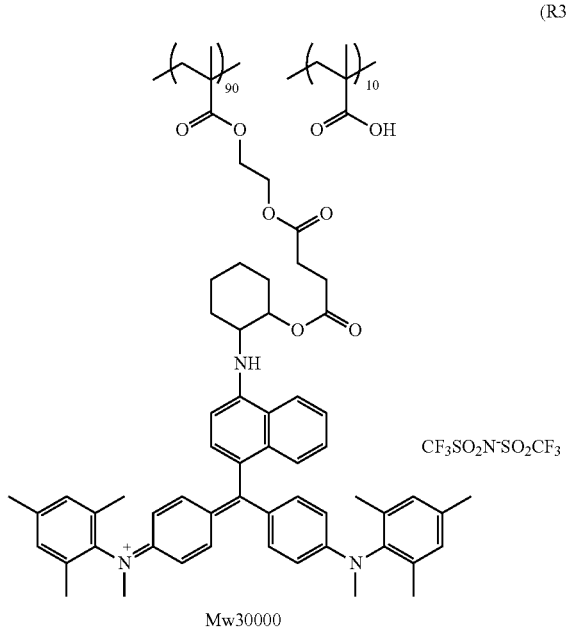

Polymerizable compound (T-1): KAYARAD DPHA (manufactured by Nippon Kayaku Co., Ltd., a mixture of dipentaerythritol pentaacrylate and dipentaerythritol hexaacrylate)

Alkali-soluble binder (U-2): methacrylic acid allyl/methacrylic acid (copolymer with a "mass ratio" of 77/23, a weight-average molecular weight of 37,000, and an acid value of 137 mgKOH/g)

Photopolymerization initiator (V-4): IRGACURE-OXE02 (manufactured by BASF)

Curing accelerator (V-5): KARENZ MTBD-1 (manufactured by Showa Denko K. K.)

Crosslinking agent (U-1): CELLOXIDE 2021P (manufactured by Daicel Corporation, epoxy compound)

Solvent (X-1): Propylene glycol monomethyl ether acetate

Solvent (X-3): (methyl ethyl diglycol (MEDG), manufactured by Nippon Nyukazai Co., Ltd.)

Additive (W-1): potassium bis(trifluoromethanesulfonyl) imide (manufactured by Mitsubishi Chemical Corporation)

Surfactant (Z-1): The following mixture (Mw=14,000)

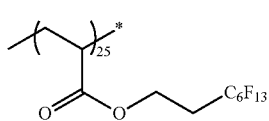
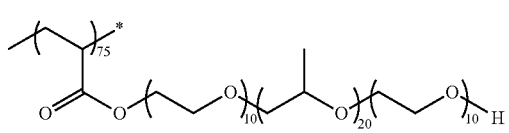
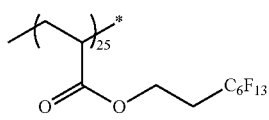
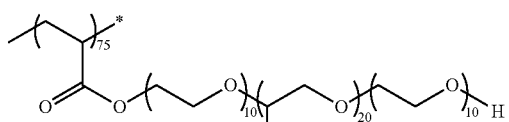

Mixture

<Manufacture of Cured Film>

The coloring composition obtained above was applied onto a glass substrate (1737, manufactured by Corning Inc.) in 100 mm×100 mm such that the maximum absorption at 600 to 700 nm reached 1.5 to 2.0, and dried in an oven at 100° C. for 180 seconds to manufacture a cured film (colored film) on the substrate. The cured film obtained above was evaluated as follows.

<Heat Resistance>

The ratio of the absorbance at 600 nm of the transmission spectrum of the cured film obtained above to the transmission spectrum after further calcining the cured film obtained above at 230° C. for 160 minutes was evaluated as a residual color rate. A higher residual color rate indicates higher heat resistance, which is thus good.

Residual color rate (%)=(absorbance at 600 nm of the cured film after further calcination/absorbance at 600 nm of the cured film before further calcination)×100

Residual color rate of 90% or more . . . 5
Residual color rate of 85% or more and less than 90% . . . 4
Residual color rate of 80% or more and less than 85% . . . 3
Residual color rate of 75% or more and less than 80% . . . 2
Residual color rate of less than 75% . . . 1

<Solvent Resistance (Difference in Chromaticity)>

The cured film obtained above was heated at 230° C. for 30 minutes and then immersed in propylene glycol monomethyl ether acetate (PGMEA) at 25° C. for 60 minutes, and the chromaticity before and after immersion was measured to calculate a hue change index ΔEab. The ΔEab value was calculated from the transmission spectrum from the cured film before and after immersion in PGMEA. Further, a smaller value of ΔEab indicated a smaller change in the hue and superior solvent resistance.

ΔEab is less than 1.5 . . . 6
ΔEab is 1.5 or more and less than 2 . . . 5
ΔEab is 2 or more and less than 3.5 . . . 4
ΔEab is 3.5 or more and less than 4 . . . 3
ΔEab is 4 or more and less than 5 . . . 2
ΔEab is 5 or more . . . 1

<Voltage Holding Ratio>

The coloring composition was applied onto a glass substrate equipped with an indium tin oxide (ITO) electrode (trade name: 1737, manufactured by Corning Inc.) such that the film thickness after drying the coloring composition reached 2.0 m, and dried (prebaked) in an oven at 100° C. for 60 seconds. Thereafter, the film was exposed at 100 mJ/cm$^2$ (with an illuminance of 20 mW/cm$^2$), not through a mask, and developed at 25° C. using a 1%-by-mass aqueous solution of an alkali developer (trade name: CDK-1, manufactured by FUJIFILM Electronic Materials Co., Ltd.). The coating film after water-washing and drying was subjected to a heating treatment (post-baked) in an oven at 230° C. for 20 minutes, thereby forming a cured film. Next, the substrate on which the cured film had been formed and the substrate on which only an ITO electrode was deposited in a predetermined shape were adhered to each other using a sealing agent that was mixed with 5 μm glass beads, and a liquid crystal MJ971189 (trade name) manufactured by Merck was injected between the substrates, thereby manufacturing a liquid crystal cell.

Subsequently, the liquid crystal cell was put into a constant-temperature tank at 60° C. for 24 hours, and then the voltage holding ratio of the liquid crystal cell was measured under the following measurement conditions, using a liquid crystal voltage holding ratio measurement system, Model VHR-1A (trade name), manufactured by Toyo Corporation, and evaluated with scores shown in the following standard. A higher score indicates a better voltage holding ratio.

Measurement Conditions
Distance between electrodes: 5 μm to 15 μm
Pulse amplitude of applied voltage: 5 V
Pulse frequency of applied voltage: 60 Hz
Pulse width of applied voltage: 16.67 msec
Voltage holding ratio: Value of a voltage applied at a liquid crystal cell potential difference/0 msec after 16.7 msec
Evaluation Method
90% or more: 5
85% or more and less than 90%: 4
80% or more and less than 85%: 3
75% or more and less than 80%: 2
Less than 75%: 1

TABLE 1

| | | Colorant | | | | | |
|---|---|---|---|---|---|---|---|
| | Type | Weight-average molecular weight | Content (% by mass) of repeating unit having acid group | Content (% by mass) of compound A having weight-average molecular weight of less than 5,000 | Heat resistance | Solvent resistance | Voltage holding ratio |
| Example 1 | TAM 1 | 30,000 | 26% by mass | 10% by mass | 5 | 6 | 5 |
| Example 2 | TAM 2 | 10,000 | 26% by mass | 19% by mass | 4 | 3 | 3 |
| Example 3 | TAM 3 | 20,000 | 26% by mass | 15% by mass | 5 | 4 | 4 |
| Example 4 | TAM 4 | 40,000 | 26% by mass | 8% by mass | 5 | 6 | 5 |
| Example 5 | TAM 5 | 50,000 | 26% by mass | 7% by mass | 4 | 6 | 5 |
| Example 6 | TAM 6 | 60,000 | 26% by mass | 5% by mass | 4 | 6 | 5 |
| Example 7 | TAM 7 | 30,000 | 40% by mass | 12% by mass | 5 | 5 | 5 |
| Example 8 | TAM 8 | 30,000 | 20% by mass | 10% by mass | 5 | 6 | 5 |
| Example 9 | TAM 9 | 30,000 | 26% by mass | 10% by mass | 5 | 6 | 5 |
| Example 10 | TAM 10 | 30,000 | 26% by mass | 12% by mass | 5 | 5 | 5 |
| Example 11 | TAM 11 | 30,000 | 26% by mass | 11% by mass | 5 | 3 | 5 |
| Example 12 | TAM 12 | 25,000 | 26% by mass | 15% by mass | 5 | 5 | 4 |
| Example 13 | TAM 13 | 30,000 | 26% by mass | 19% by mass | 3 | 3 | 3 |
| Example 14 | TAM 14 | 30,000 | 26% by mass | 18% by mass | 2 | 3 | 3 |
| Example 15 | TAM 15 | 30,000 | 15% by mass | 12% by mass | 4 | 4 | 4 |
| Example 16 | TAM 16 | 30,000 | 12% by mass | 14% by mass | 4 | 3 | 3 |
| Example 17 | TAM 17 | 30,000 | 19% by mass | 10% by mass | 5 | 6 | 5 |
| Example 18 | TAM 18 | 30,000 | 55% by mass | 12% by mass | 3 | 3 | 4 |
| Comparative Example 1 | R1 | *1) | — | — | 1 | 1 | 1 |
| Comparative Example 2 | R2 | 30,000 | 12% by mass | 35% by mass | 3 | 1 | 1 |
| Comparative Example 3 | R3 | 30,000 | 10% by mass | 10% by mass | 3 | 1 | 3 |
| Comparative Example 4 | R4 | 30,000 | 70% by mass | 11% by mass | 3 | 1 | 3 |

*1) The molecular weight of R1 is 758.84.

From the above results, it was possible to form a cured film having excellent heat resistance and solvent resistance according to Examples. In addition, the cured films obtained by Examples had excellent voltage holding ratios by Examples.

Furthermore, each of the coloring compositions of Examples 1 to 18 as prepared above was applied onto a glass (1737, manufactured by Corning Inc.) substrate by a spin coating method, and then dried at room temperature for 30 minutes to volatilize the volatile components, thereby obtaining a colored layer. The obtained colored layer was irradiated with i-rays (wavelength of 365 nm) with overall exposure, through a photomask having a 20 μm line-and-space pattern, to form a latent image. For a light source for the i-rays, an ultra-high pressure mercury lamp was used to form parallel light, which was then irradiated. At this time, the irradiation dose was set to 40 mJ/cm$^2$. Then, the colored layer on which this latent image had been formed was developed using an aqueous solution (concentration of 2.4% by mass) of sodium carbonate/sodium hydrogen carbonate at 26° C. for 45 seconds, rinsed with running water for 20 seconds, and then dried by a spray. The film after drying was calcined in a clean oven at 230° C.×20 minutes. The obtained pattern was observed with an optical microscope, and thus, the pattern forming properties were good and a pattern with a line width of 20 μm could also be formed.

On the other hand, in Comparative Examples, it was impossible to satisfy both of heat resistance and solvent resistance.

Furthermore, the content of the compound A with a weight-average molecular weight of less than 5,000 in the table was the content of the compound A in the mixture of a polymer TP having a repeating unit having a triarylmethane structure, and the compound A with a weight-average molecular weight of less than 5,000, having a triarylmethane structure, other than the polymer TP.

Synthesis Example 10

(Synthesis of TAM-A-1)

4.2 g of propylene glycol-1-monomethyl ether-2-acetate was introduced into a three-neck flask, and heated to 80° C. under a nitrogen flow, and a solution of 26.2 g of propylene glycol-1-monomethyl ether-2-acetate, 1.18 g of dodecyl-mercaptan, 14.8 g of the synthesis intermediate (R-2), 5.2 g of methacrylic acid, and 0.35 g of 2,2'-azobis(2-methylpropionate) was added dropwise thereto for 2 hours, and the mixture was stirred for 1 hour. Then, a solution in which 0.08 g of 2,2'-azobis(2-methylpropionate) had been dissolved in 0.5 g of propylene glycol-1-monomethyl ether-2-acetate was added thereto twice at an interval of 1.5 hours, and the mixture was further stirred for 1.5 hours. Thereafter, the mixture was heated to 90° C. and then further stirred for 1.5 hours. The mixture was cooled to room temperature to obtain a solution (concentration of the solid content of 40% by mass) of TAM-A-1 with a weight-average molecular weight 30,000.

Synthesis Example 11

(Synthesis of TAM-A-2 to A-6)

In the same manner as for TAM-A-1 except that the amount of dodecylmercaptan was changed, TAM-A-2 to A-6 were synthesized.

Synthesis Example 12

(Synthesis of TAM-A-7 to A-14)

In the same manner as for TAM-A-1 except that the amounts of the respective monomers or the types of the monomers having acid groups, TAM-A-7 to A-14 were synthesized.

Synthesis Example 13

(Synthesis of TAM-A-15)

In the same manner as for TAM-A-1, using a synthesis intermediate synthesized by the same method as for the synthesis of the synthesis intermediate (R-2) except that the synthesis was carried out using methacrylic acid instead of 2-methacryloyloxyethyl succinic acid in the synthesis of the synthesis intermediate (R-2), TAM-A-15 was synthesized.

Synthesis Example 14

(Synthesis of TAM-A-16)

In the same manner as for TAM-A-1, using a synthesis intermediate synthesized by the same method as for the synthesis of the synthesis intermediate (R-2) except that the synthesis was carried out using 4,4'-bisdiethylaminobenzophenone instead of the compound 3 in the synthesis of the synthesis intermediate (R-2), TAM-A-16 was synthesized.

Synthesis Example 15

(Synthesis of TAM-A-17)

4.2 g of propylene glycol-1-monomethyl ether-2-acetate was introduced into a three-neck flask, and heated to 80° C. under a nitrogen flow, and a solution of 27.6 g of propylene glycol-1-monomethyl ether-2-acetate, 1.18 g of dodecylmercaptan, 14.8 g of the synthesis intermediate (R-2), 5.2 g of methacrylic acid, 1.5 g of potassium bis(trifluoromethanesulfonyl)imide, and 0.35 g of 2,2'-azobis(2-methylpropionate) was added dropwise thereto for 2 hours, and the mixture was stirred for 1 hour. Then, a solution in which 0.08 g of 2,2'-azobis(2-methylpropionate) had been dissolved in 0.5 g of propylene glycol-1-monomethyl ether-2-acetate was added thereto twice at an interval of 1.5 hours, and the mixture was further stirred for 1.5 hours. Thereafter, the mixture was heated to 90° C. and then further stirred for 1.5 hours. The mixture was cooled to room temperature to obtain a mixed solution (concentration of the solid content of 40% by mass) of TAM-A-17 (the structure of the polymer was the same as that of TAM-A-1) with a weight-average molecular weight 30,000 and potassium bis(trifluoromethanesulfonyl)imide.

<Synthesis of R2-A>

4.2 g of propylene glycol-1-monomethyl ether-2-acetate was introduced into a three-neck flask, and heated to 80° C. under a nitrogen flow, and a solution of 24.8 g of propylene glycol-1-monomethyl ether-2-acetate, 0.58 g of dodecylmercaptan, 13.9 g of the synthesis intermediate (R-2), 2.2 g of methacrylic acid, 2.2 g of cyclohexyl methacrylate, and 0.36 g of 2,2'-azobis(2-methylpropionate) was added dropwise thereto for 2 hours, and the mixture was stirred for 1 hour. Then, a solution in which 0.12 g of 2,2'-azobis(2-methylpropionate) had been dissolved in 0.5 g of propylene glycol-1-monomethyl ether-2-acetate was added thereto twice at an interval of 1.5 hours, and the mixture was further stirred for 1.5 hours. Thereafter, the mixture was heated to 90° C. and then further stirred for 1.5 hours. The mixture was cooled to room temperature to obtain a solution (concentration of the solid content of 40% by mass) of R2-A with a weight-average molecular weight 30,000.

<Synthesis of R3-A and R4-A>

By the same method as for TAM-A-1 except that the mass ratios of the synthesis intermediate (R-2) to the methacrylic acid were set as follows, and the amount of dodecylmercaptan to be used was adjusted, R3-A and R4-A were synthesized.

R3-A . . . Synthesis intermediate (R-2):methacrylic acid=90:10 in terms of mass ratio R4-A . . . Synthesis intermediate (R-2):methacrylic acid=30:70 in terms of mass ratio <Preparation of Pigment Dispersion Liquid 1>

A pigment dispersion liquid 1 was prepared in the following manner. Raw materials were mixed so that they had the composition described below, stirred for 3 hours at a rotation speed of 3,000 rpm using a homogenizer, thereby preparing a mixed solution. Further, the mixture was subjected to a dispersion treatment for 8 hours with a bead dispersing machine, ULTRA APEX MILL (manufactured by Kotobuki Industries Co., Ltd.) using zirconia beads with a diameter of 0.1 mm. Here, the adsorptive group of Disperbyk110 is a phosphoric acid group (acid value of 53 mg KOH/g).

(Composition)

C. I. Pigment•Blue 15:6 9.7 parts

Disperbyk 110 manufactured by BYK Chemie (non-volatile fractions of 52% by mass) 13.3 parts Propylene glycol methyl ether acetate (hereinafter also referred to as PGMEA) 77.0 parts <Preparation of Pigment Dispersion Liquid 2>

By the same method as for the pigment dispersion liquid 1 except that the dispersant was changed to Disperbyk 162 (manufactured by BYK Chemie, non-volatile fractions of 38% by mass), a pigment dispersion liquid 2 was prepared. Further, the amount of the PGMEA to be added was adjusted such that the dispersant non-volatile fractions in the pigment dispersion liquid became the same as those of the pigment dispersion liquid 1. Here, the adsorptive group of the Disperbyk 162 is an amine (amine value of 13 mgKOH/g).

<Preparation of Pigment Dispersion Liquid 3>

By the same method as for the pigment dispersion liquid 1 except that the dispersant was changed to Disperbyk 191 (manufactured by BYK Chemie, non-volatile fractions of 98% by mass), a pigment dispersion liquid 3 was prepared. Further, the amount of the PGMEA to be added was adjusted such that the dispersant non-volatile fractions in the pigment dispersion liquid became the same as those of the pigment dispersion liquid 1. Here, the adsorptive group of the Disperbyk 191 is a carboxyl group (acid value of 30 mgKOH/g).

Examples 19 to 39, and Comparative Examples 6 to 8

(Preparation of Coloring Composition)

The respective components were mixed such that they had the following composition 1, composition 2, or composition 3, thereby preparing a coloring composition.

<<Composition 1>>

Colorant (concentration of the solid content of 40% by mass solution) . . . 10.6 parts by mass Polymerizable compound (T-1) . . . 6.0 parts by mass Alkali-soluble binder (U-2) . . . 4.0 parts by mass Photopolymerization initiator (V-4) . . . 0.31 parts by mass Curing accelerator (V-5) . . . 0.23 parts by mass Crosslinking agent (U-1) . . . 1.0 part by mass Antioxidant (A-1) . . . 0.32 parts by mass
Additive (W-1) . . . 0.30 parts by mass
Solvent (X-1) . . . 63.8 parts by mass
Solvent (X-3) . . . 12.6 parts by mass
Surfactant (Z-1) . . . 0.01 parts by mass
<<Composition 2>>
Colorant (concentration of the solid content of 40% by mass solution) . . . 11.4 parts by mass
Polymerizable compound (T-1) . . . 6.0 parts by mass
Alkali-soluble binder (U-2) . . . 4.0 parts by mass
Photopolymerization initiator (V-4) . . . 0.31 parts by mass
Curing accelerator (V-5) . . . 0.23 parts by mass
Crosslinking agent (U-1) . . . 1.0 part by mass
Antioxidant (A-1) . . . 0.32 parts by mass
Additive (W-1) . . . 0.30 parts by mass
Solvent (X-1) . . . 63.8 parts by mass
Solvent (X-3) . . . 12.6 parts by mass
Surfactant (Z-1) . . . 0.01 parts by mass
<<Composition 3>>
Colorant (concentration of the solid content of 40% by mass solution) . . . 10.6 parts by mass
Pigment dispersion liquid . . . 11.8 parts by mass
Polymerizable compound (T-1) . . . 6.0 parts by mass
Alkali-soluble binder (U-2) . . . 4.0 parts by mass
Photopolymerization initiator (V-4) . . . 0.31 parts by mass
Curing accelerator (V-5) . . . 0.23 parts by mass
Crosslinking agent (U-1) . . . 1.0 part by mass
Antioxidant (A-1) . . . 0.32 parts by mass
Additive (W-1) . . . 0.30 parts by mass
Solvent (X-1) . . . 48.1 parts by mass
Solvent (X-3) . . . 12.6 parts by mass
Surfactant (Z-1) . . . 0.01 parts by mass Details of the respective components with the compositions 1 to 3 are as follows.

Colorant: Solutions of TAM-A-1 to TAM-A-17, R2-A, R3-A, and R4-A produced in Synthesis Examples above
Pigment dispersion liquid: Pigment dispersion liquids 1 to 3 produced above
Polymerizable compound (T-1): KAYARAD DPHA (manufactured by Nippon Kayaku Co., Ltd., mixture of dipentaerythritol pentaacrylate and dipentaerythritol hexaacrylate)
Alkali-soluble binder (U-2): methacrylic acid allyl/methacrylic acid (copolymer with "mass ratio" of 77/23, weight-average molecular weight of 37,000, acid value of 137 mgKOH/g)
Photopolymerization initiator (V-4): IRGACURE-OXE02 (manufactured by BASF)
Curing accelerator (V-5): KARENZ MTBD-1 (manufactured by Showa Denko K. K.)
Crosslinking agent (U-1): CELLOXIDE 2021P (manufactured by Daicel Corporation, epoxy compound)
Antioxidant (A-1): ADEKASTAB AO-60 (manufactured by ADEKA Corporation)
Solvent (X-1): Propylene glycol monomethyl ether acetate
Solvent (X-3): (Methyl ethyl diglycol (MEDG) manufactured by Nippon Nyukazai Co., Ltd.)
Additive (W-1): Potassium bis(trifluoromethanesulfonyl) imide (manufactured by Mitsubishi Chemical Corporation)
Surfactant (Z-1): The following mixture (Mw=14,000)

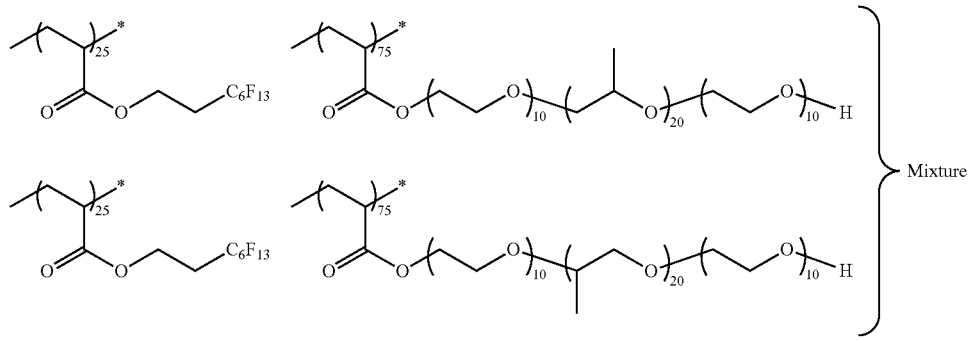

Comparative Example 5

In the same manner as in Example 19 except that R1 obtained above was used in the amount of 3.4 parts by mass, a coloring composition was prepared.

The structures of TAM-A-1 to TAM-A-16, R2-A, R3-A, and R4-A are shown below. In the following formulae, the numerical values denoted together with the repeating units are the mass ratios of the repeating units.

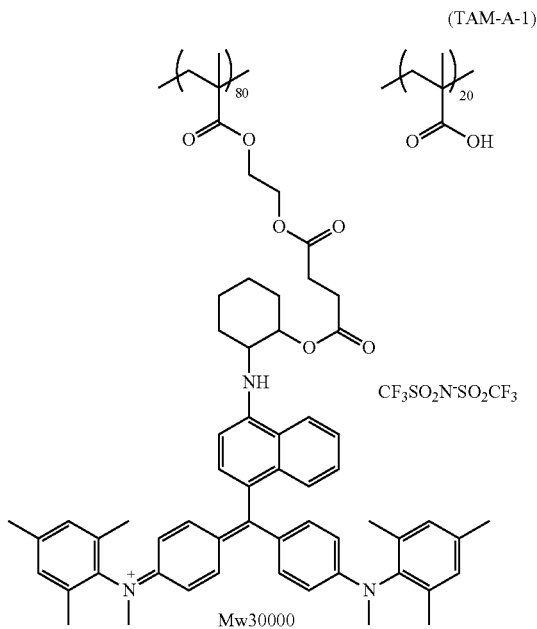

(TAM-A-1)

(TAM-A-2)
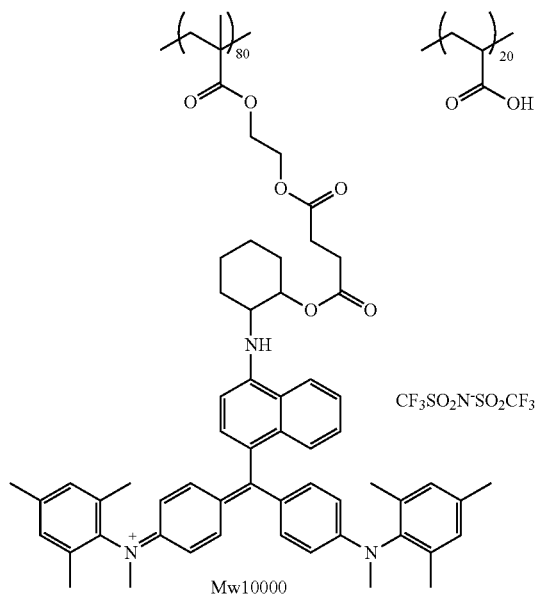
(TAM-A-4)
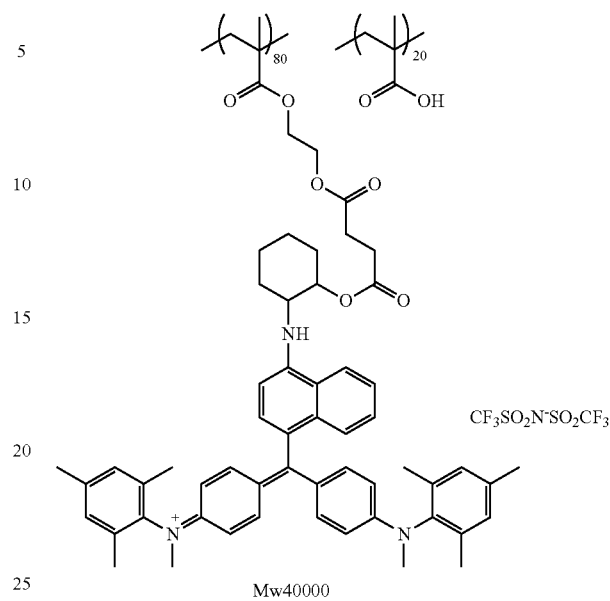
(TAM-A-3)
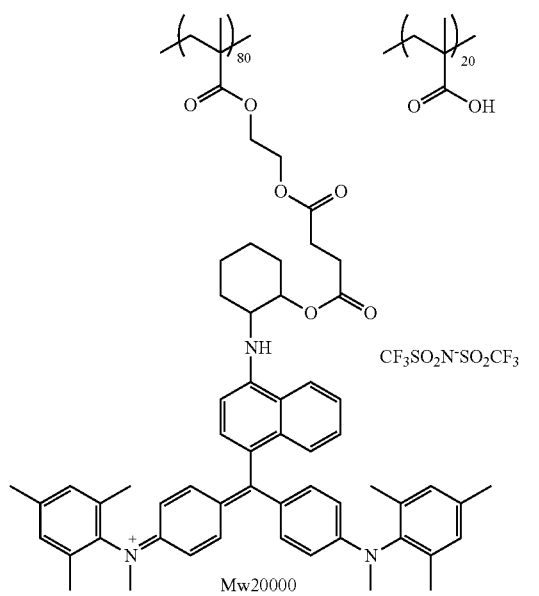
(TAM-A-5)
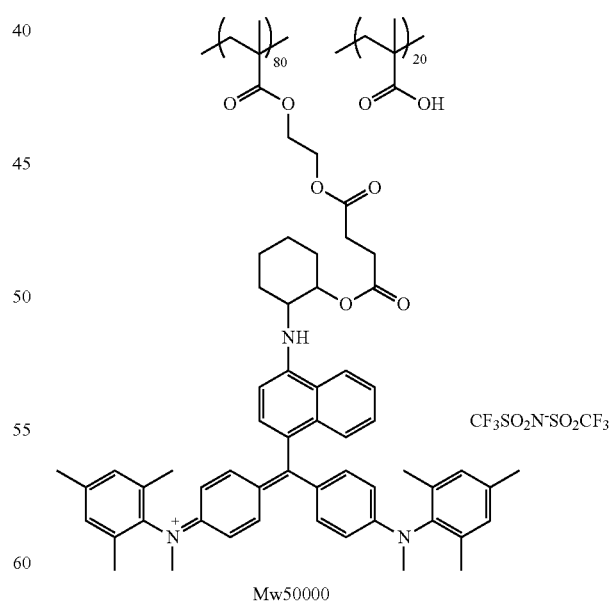

(TAM-A-6)
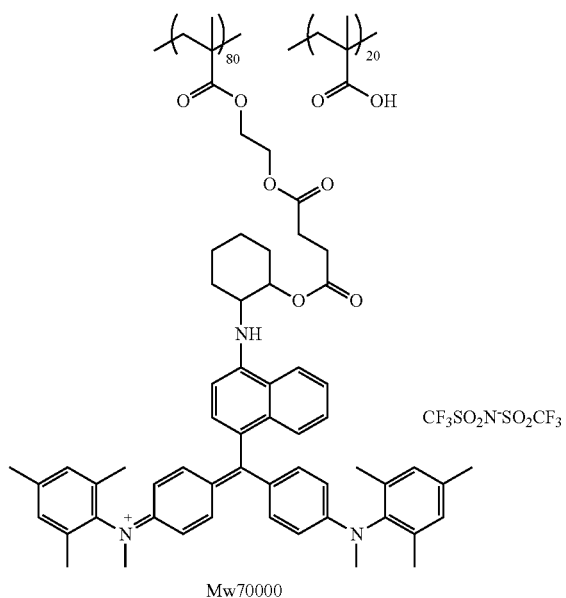
(TAM-A-8)
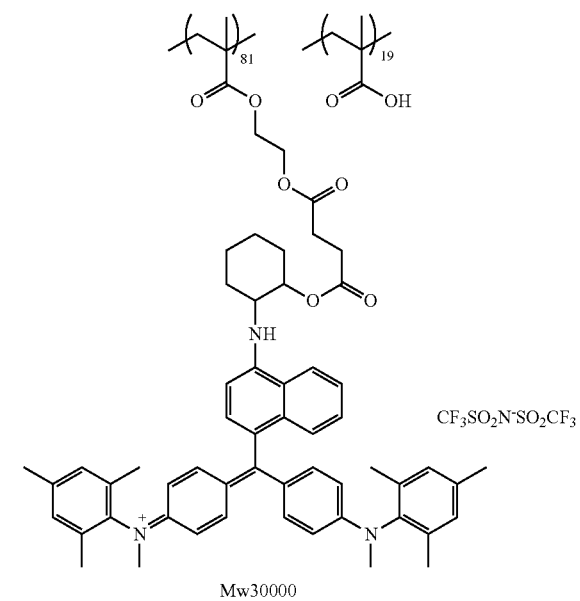
(TAM-A-7)
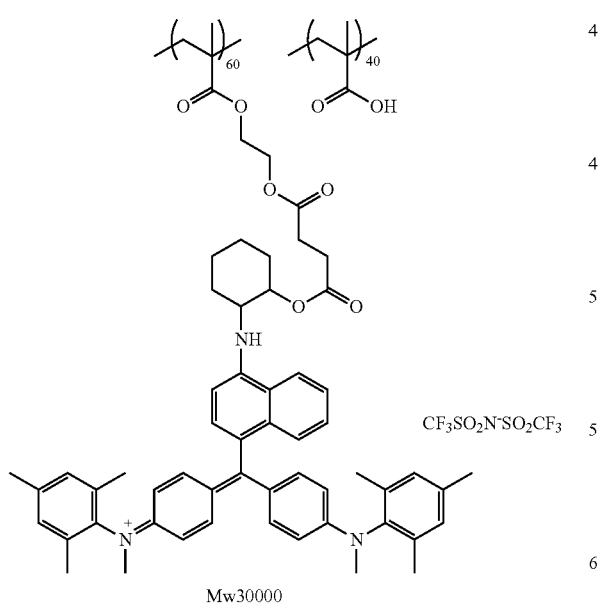
(TAM-A-9)
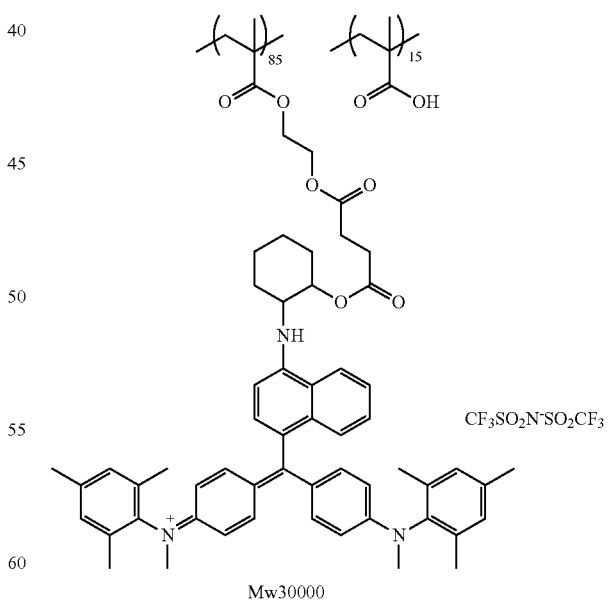

(TAM-A-10)
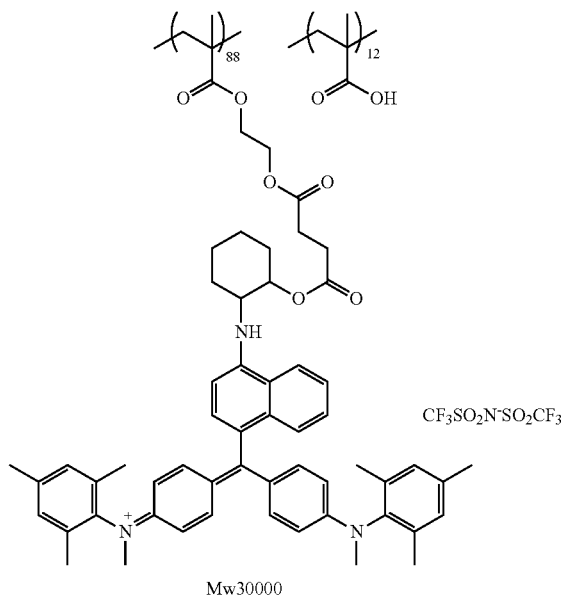
(TAM-A-12)
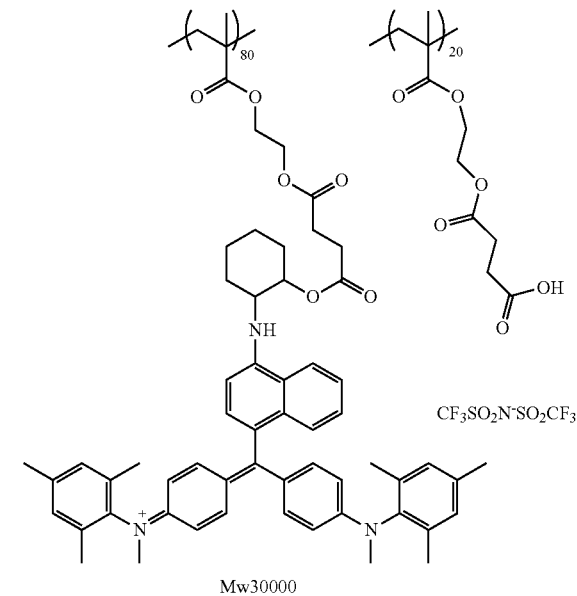
(TAM-A-11)
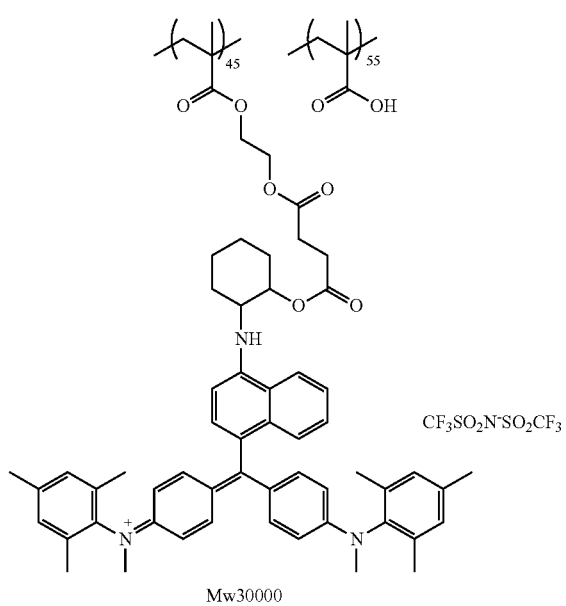
(TAM-A-13)
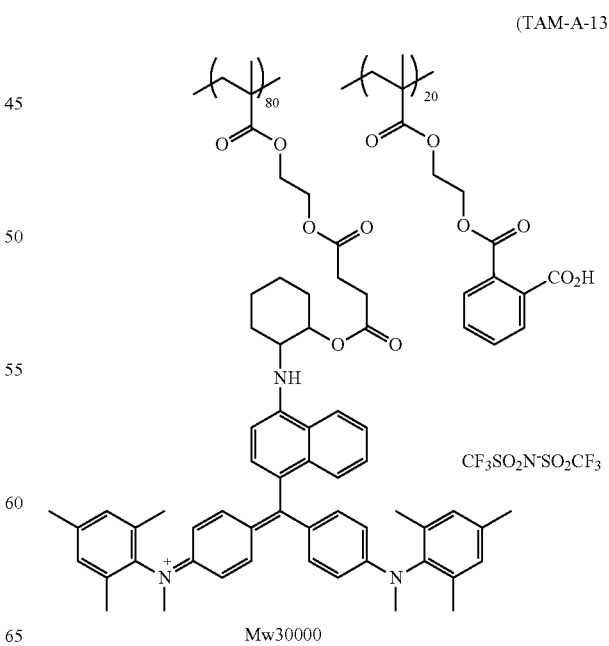

(TAM-A-14)
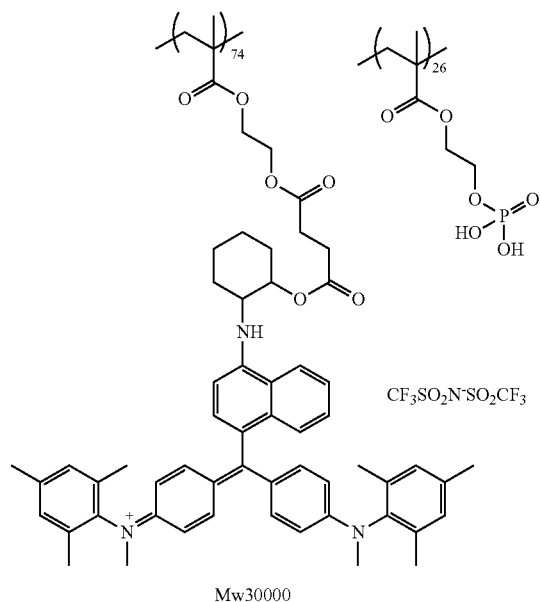
Mw30000
(TAM-A-15)
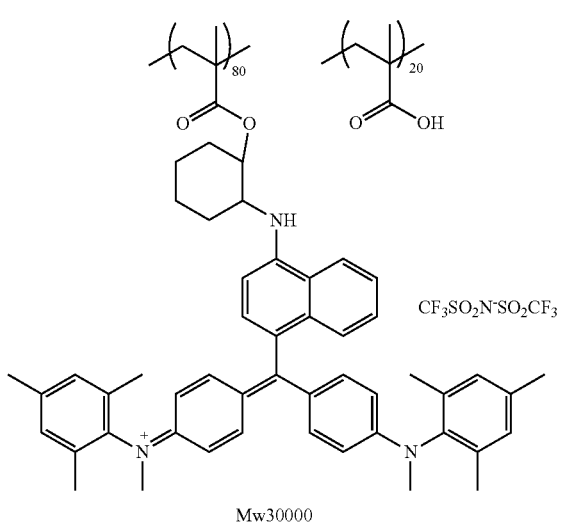
Mw30000
(TAM-A-16)
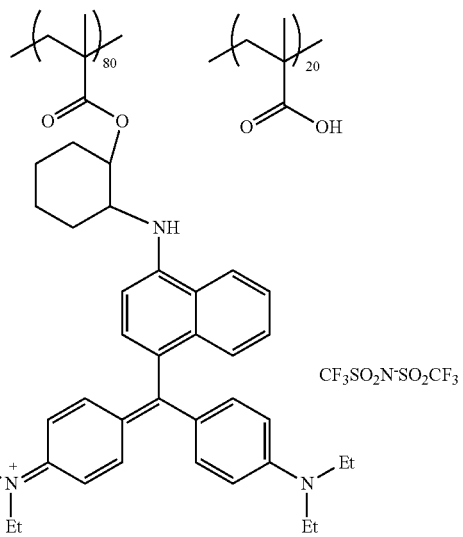
Mw30000
(R2-A)
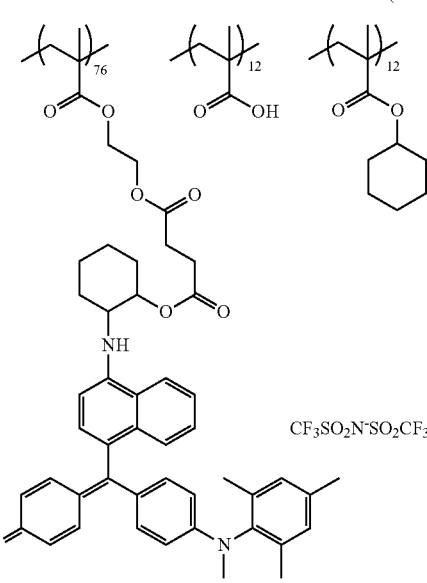
Mw30000

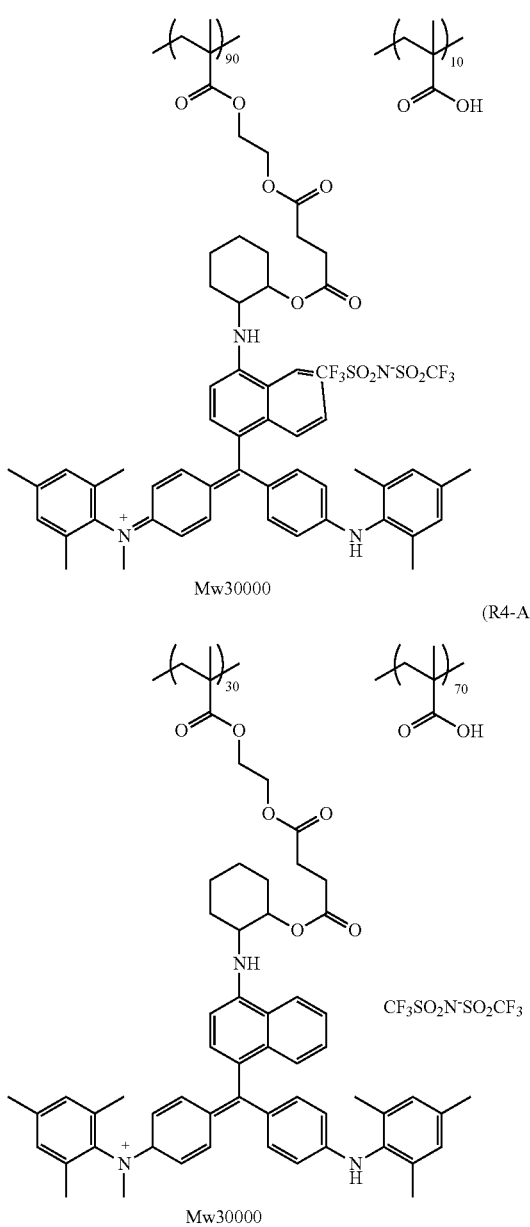

<Manufacture of Cured Film>

The coloring composition obtained above was applied onto a glass substrate (1737, manufactured by Corning Inc.) in 100 mm×100 mm such that the maximum absorption at 600 to 700 nm reached 1.5 to 2.0, and dried in an oven at 100° C. for 180 seconds to manufacture a colored layer on the substrate. This colored layer was irradiated with i-rays (wavelength of 365 nm) through a photomask having a line-and-space pattern with a line width of 20 μm, to form a latent image. For a light source for the i-rays, an ultra-high pressure mercury lamp was used to form parallel light, which was then irradiated. At this time, the irradiation dose was set to 40 mJ/cm$^2$. Then, the colored layer on which this latent image had been formed was developed using an aqueous solution (concentration of 2.4% by mass) of sodium carbonate/sodium hydrogen carbonate at 26° C. for 45 seconds, rinsed with running water for 20 seconds, and then dried by a spray. The film after drying was calcined in a clean oven at 230° C.×30 minutes to obtain a cured film. The obtained cured film was evaluated as follows.

<Heat Resistance>

The ratio of the absorbance at 600 nm of the transmission spectrum of the cured film obtained above to the transmission spectrum after further calcining the cured film obtained above at 230° C. for 130 minutes was evaluated as a residual color rate. A higher residual color rate indicates higher heat resistance, which is thus good.

Residual color rate (%)=(absorbance at 600 nm of the cured film after further calcination/absorbance at 600 nm of the cured film before further calcination)×100

Residual color rate of 90% or more . . . 5
Residual color rate of 85% or more and less than 90% . . . 4
Residual color rate of 80% or more and less than 85% . . . 3
Residual color rate of 75% or more and less than 80% . . . 2
Residual color rate of less than 75% . . . 1

<Solvent Resistance (Difference in Chromaticity)>

The cured film obtained above was immersed in propylene glycol monomethyl ether acetate (PGMEA) at 25° C. for 60 minutes, and the chromaticity before and after immersion was measured to calculate a hue change index ΔEab. The ΔEab value was calculated from the transmission spectrum from the cured film before and after immersion in PGMEA. Further, a smaller value of ΔEab indicated a smaller change in the hue and superior solvent resistance.

ΔEab is less than 1.5 . . . 6
ΔEab is 1.5 or more and less than 2 . . . 5
ΔEab is 2 or more and less than 3.5 . . . 4
ΔEab is 3.5 or more and less than 4 . . . 3
ΔEab is 4 or more and less than 5 . . . 2
ΔEab is 5 or more . . . 1

<Contrast>

The obtained cured film was sandwiched between two polarizing films, and a luminance value in a case where the polarization axes of the two polarizing films were parallel, and a luminance value in a case where the polarization axes of the two polarizing films were orthogonal were measured using a luminance colorimeter (model number: BM-5A, manufactured by Topcon Co., Ltd.). The luminance in a case where the polarization axes of the two polarizing films were parallel was divided by the luminance in a case where the polarization axes were orthogonal, and the obtained value was determined as a contrast. A higher contrast indicates better performance as a color filter for a liquid crystal display.

4: The contrast is 30,000 or more
3: The contrast is 20,000 or more and less than 30,000
2: The contrast is 10,000 or more and less than 20,000
1: The contrast is less than 10,000

<Voltage Holding Ratio>

The coloring composition was applied onto a glass substrate equipped with an indium tin oxide (ITO) electrode (trade name: 1737, manufactured by Corning Inc.) such that the film thickness after drying the coloring composition reached 2.0 μm, and dried (prebaked) in an oven at 100° C. for 60 seconds. Thereafter, the film was exposed at 100 mJ/cm$^2$ (with an illuminance of 20 mW/cm$^2$), not through a mask, and developed at 25° C. using a 1%-by-mass aqueous solution of an alkali developer (trade name: CDK-1, manufactured by FUJIFILM Electronic Materials Co., Ltd.). The coating film after water-washing and drying was subjected to a heating treatment (post-baked) in an oven at 230° C. for 20 minutes to form a cured film. Then, the substrate on which the cured film had been formed and the substrate on which only an ITO electrode was deposited in a predetermined shape were adhered to each other using a sealing agent that was mixed with 5 μm glass beads, and a liquid crystal MJ971189 (trade name) manufactured by Merck was injected between the substrates, thereby manufacturing a liquid crystal cell.

Subsequently, the liquid crystal cell was put into a constant-temperature tank at 60° C. for 24 hours, and then the voltage holding ratio of the liquid crystal cell was measured under the following measurement conditions, using a liquid crystal voltage holding ratio measurement system, Model VHR-1A (trade name), manufactured by Toyo Corporation, and evaluated with scores shown in the following standard. A higher score indicates a better voltage holding ratio.

Measurement Conditions
Distance between electrodes: 5 μm to 15 μm
Pulse amplitude of applied voltage: 5 V
Pulse frequency of applied voltage: 60 Hz
Pulse width of applied voltage: 16.67 msec
Voltage holding ratio: Value of a voltage applied at a liquid crystal cell potential difference/0 msec after 16.7 msec
Evaluation Method
90% or more: 5
85% or more and less than 90%: 4
80% or more and less than 85%: 3
75% or more and less than 80%: 2
Less than 75%: 1

From the above results, it was possible to form a cured film having excellent heat resistance and solvent resistance according to Examples. In addition, the obtained cured film had an excellent contrast and an excellent voltage holding ratio. Further, the pattern of the obtained cured film was observed with an optical microscope, and thus, the pattern forming properties were good and a pattern with a line width of 20 μm could also be formed.

On the other hand, in Comparative Examples, it was impossible to satisfy both of heat resistance and solvent resistance.

Furthermore, the content of the compound A with a weight-average molecular weight of less than 5,000 in the table was the content of the compound A in the mixture of a polymer TP having a repeating unit having a triarylmethane structure, and the compound A with a weight-average molecular weight of less than 5,000, having a triarylmethane structure, other than the polymer TP.

What is claimed is:

1. A coloring composition comprising:
    a polymer TP consisting only of a repeating unit A represented by General Formula (TP3-2), and a repeating unit B having an acid group; and
    a polymerizable compound,
    wherein the polymer TP contains the repeating unit B in the amount of 12% to 60% by mass with respect to all the repeating units of the polymer TP;

TABLE 2

| | | | Colorant | | | | | | | |
|---|---|---|---|---|---|---|---|---|---|---|
| | | | Content (% by mass) of repeating unit having acid group | Content (% by mass) of compound A with weight-average molecular weight of less than 5,000 | Composition | | | | | |
| | Type | Weight-average molecular weight | | | Composition | Pigment dispersion liquid | Heat resistance | Solvent resistance | Contrast | Voltage holding ratio |
| Example 19 | TAM-A-1 | 30,000 | 20% by mass | 9% by mass | 1 | — | 5 | 6 | 4 | 5 |
| Example 20 | TAM-A-2 | 10,000 | 20% by mass | 17% by mass | 1 | — | 4 | 3 | 4 | 3 |
| Example 21 | TAM-A-3 | 20,000 | 20% by mass | 14% by mass | 1 | — | 5 | 4 | 4 | 4 |
| Example 22 | TAM-A-4 | 40,000 | 20% by mass | 8% by mass | 1 | — | 5 | 6 | 3 | 5 |
| Example 23 | TAM-A-5 | 50,000 | 20% by mass | 7% by mass | 1 | — | 4 | 6 | 3 | 5 |
| Example 24 | TAM-A-6 | 70,000 | 20% by mass | 5% by mass | 1 | — | 4 | 6 | 3 | 5 |
| Example 25 | TAM-A-7 | 30,000 | 40% by mass | 13% by mass | 1 | — | 5 | 5 | 4 | 5 |
| Example 26 | TAM-A-8 | 30,000 | 19% by mass | 10% by mass | 1 | — | 5 | 6 | 4 | 5 |
| Example 27 | TAM-A-9 | 30,000 | 15% by mass | 11% by mass | 1 | — | 5 | 5 | 4 | 5 |
| Example 28 | TAM-A-10 | 30,000 | 12% by mass | 12% by mass | 1 | — | 4 | 4 | 3 | 4 |
| Example 29 | TAM-A-11 | 30,000 | 55% by mass | 13% by mass | 1 | — | 5 | 6 | 3 | 5 |
| Example 30 | TAM-A-12 | 25,000 | 20% by mass | 12% by mass | 1 | — | 5 | 5 | 3 | 4 |
| Example 31 | TAM-A-13 | 30,000 | 20% by mass | 13% by mass | 1 | — | 5 | 3 | 3 | 4 |
| Example 32 | TAM-A-14 | 30,000 | 20% by mass | 17% by mass | 1 | — | 5 | 5 | 4 | 4 |
| Example 33 | TAM-A-15 | 30,000 | 20% by mass | 16% by mass | 1 | — | 4 | 3 | 4 | 3 |
| Example 34 | TAM-A-16 | 30,000 | 20% by mass | 18% by mass | 1 | — | 3 | 3 | 4 | 3 |
| Example 35 | TAM-A-17 | 30,000 | 20% by mass | 9% by mass | 2 | — | 5 | 6 | 4 | 5 |
| Example 36 | TAM-A-1 | 30,000 | 20% by mass | 10% by mass | 2 | — | 4 | 5 | 3 | 4 |
| Example 37 | TAM-A-1 | 30,000 | 20% by mass | 10% by mass | 3 | 1 | 5 | 6 | 3 | 4 |
| Example 38 | TAM-A-1 | 30,000 | 20% by mass | 10% by mass | 3 | 2 | 5 | 6 | 3 | 4 |
| Example 39 | TAM-A-1 | 30,000 | 20% by mass | 10% by mass | 3 | 3 | 5 | 6 | 3 | 4 |
| Comparative Example 5 | R1 | *1) | — | — | 1 | — | 1 | 1 | 3 | 1 |
| Comparative Example 6 | R2-A | 30,000 | 12% by mass | 32% by mass | 1 | — | 2 | 2 | 3 | 2 |
| Comparative Example 7 | R3-A | 30,000 | 10% by mass | 14% by mass | 1 | — | 2 | 2 | 2 | 3 |
| Comparative Example 8 | R4-A | 30,000 | 70% by mass | 15% by mass | 1 | — | 1 | 3 | 2 | 3 |

*1) The molecular weight of R1 is 758.84.

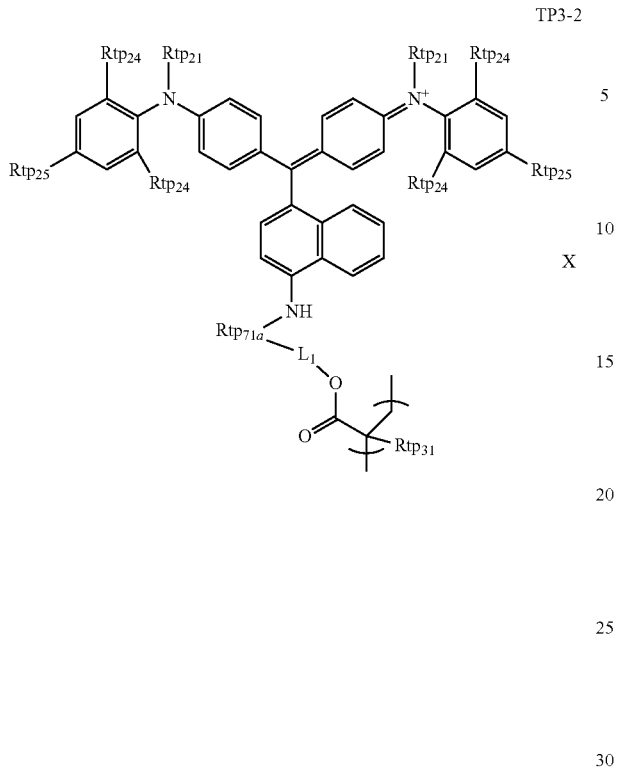

TP3-2 in General Formula (TP3-2), $Rtp_{21}$'s each independently represent a hydrogen atom or an alkyl group having 1 to 6 carbon atoms; $Rtp_{24}$'s each independently represent an alkyl group having 1 to 4 carbon atoms; $Rtp_{25}$'s each independently represent a hydrogen atom or an alkyl group having 1 to 3 carbon atoms; $Rtp_{71a}$ represents an alkylene group or an arylene group; $Rtp_{31}$ represents a hydrogen atom or a methyl group; $L_1$ represents a single bond or a divalent linking group; and X represents an anion, or X is not present and at least one of $Rtp_{21}$, $Rtp_{24}$, or $Rtp_{25}$ includes an anion.

2. The coloring composition according to claim 1,
wherein the weight-average molecular weight of the polymer TP is from 5,000 to 500,000.

3. The coloring composition according to claim 2, further comprising:
a compound A with a weight-average molecular weight of less than 5,000, having a triarylmethane structure,
wherein the content of the compound A is 20 parts by mass or less with respect to 100 parts by mass of the total amount of the polymer TP and the compound A.

4. The coloring composition according to claim 1,
wherein the acid group contained in the repeating unit B is a carboxyl group.

5. The coloring composition according to claim 1,
wherein X is selected from a fluorine anion, a chlorine anion, a bromine anion, an iodine anion, a cyanide ion, a perchloric acid anion, a borate anion, $PF_6^-$ and $SbF_6^-$ anions, and a compound having at least one structure selected from —$SO_3^-$, —$COO^-$, —$PO_4^-$, a structure represented by General Formula (A1), and a structure represented by General Formula (A2),

General Formula (A1)

in General Formula (A1), $R^1$ and $R^2$ each independently represent —$SO_2$— or —CO—; and

General Formula (A2)

in General Formula (A2), $R^3$ represents —$SO_2$— or —CO—; and $R^4$ and $R^5$ each independently represent —$SO_2$—, —CO—, or —CN.

6. The coloring composition according to claim 1,
wherein X is a compound including a bis(sulfonyl)imide anion, a tris(sulfonyl)methide anion, or a sulfonic acid anion.

7. The coloring composition according to claim 1,
wherein in General Formula (TP3-2), at least one of $Rtp_{21}$, $Rtp_{24}$ or $Rtp_{25}$ is substituted with General Formula (P);

General Formula (P)

in General Formula (P), L represents a single bond or a divalent linking group; $X^1$ represents at least one selected from —$SO_3^-$, —$COO^-$, —$PO_4^-$, a group including the structure represented by General Formula (A1), and a group including the structure represented by General Formula (A2);

General Formula (A1)

in General Formula (A1), $R^1$ and $R^2$ each independently represent —$SO_2$— or —CO—; and

General Formula (A2)

in General Formula (A2), $R^3$ represents —$SO_2$— or —CO—; and $R^4$ and $R^5$ each independently represent —$SO_2$—, —CO—, or —CN.

8. The coloring composition according to claim 1,
wherein the repeating unit A is represented by General Formula (TP3-3);

TP3-3

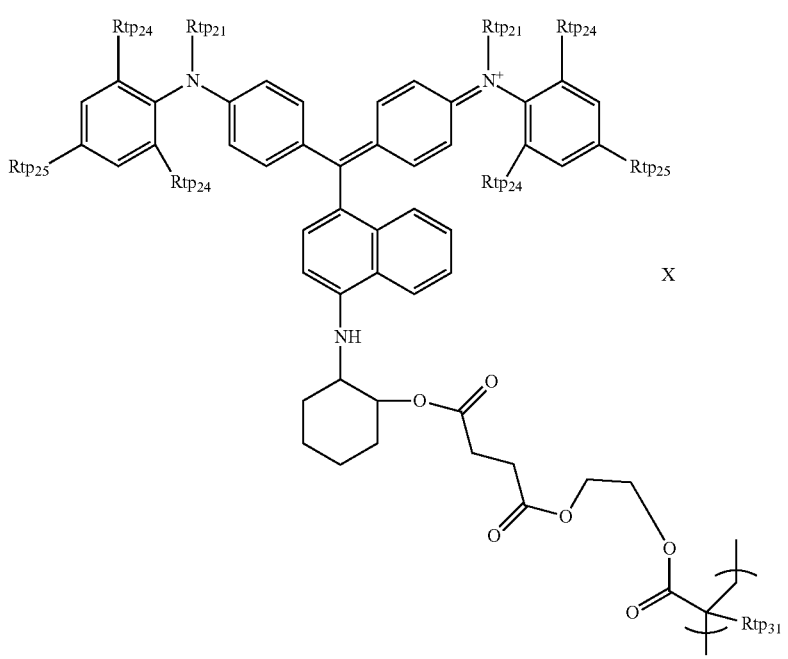

in General Formula (TP3-3), $Rtp_{21}$'s each independently represent a hydrogen atom or an alkyl group having 1 to 6 carbon atoms; $Rtp_{24}$'s each independently represent an alkyl group having 1 to 4 carbon atoms; $Rtp_{25}$'s each independently represent a hydrogen atom or an alkyl group having 1 to 3 carbon atoms; $Rtp_{31}$ represents a hydrogen atom or a methyl group; and X represents an anion.

9. The coloring composition according to claim 1, wherein the repeating unit B is represented by General Formula (B-1);

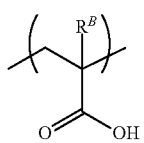

(B-1)

in General Formula (B-1), $R^B$ represents a hydrogen atom or a methyl group.

10. The coloring composition according to claim 1, further comprising:
at least one selected from a xanthene compound, a dipyrromethene-based metal complex compound, a dioxazine compound, and a phthalocyanine compound.

11. The coloring composition according to claim 1, wherein the polymer TP is a polymer represented by General Formula (TP-7);

TP-7

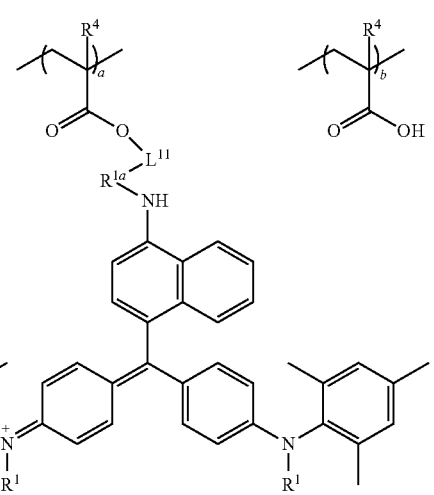

in General Formula (TP-7), $R^1$'s each independently represent a hydrogen atom or an alkyl group having 1 to 6 carbon atoms; $R^4$ represents a hydrogen atom or a methyl group; $R^{1a}$ represents an alkylene group or an arylene group; $L^{11}$ represents a single bond or a divalent linking group having 1 to 30 carbon atoms; X represents a compound including a bis(sulfonyl)imide anion, a tris(sulfonyl)methide anion, or a sulfonic acid anion; and a and b each represent the mass ratio of the repeating units, a represents 40 to 88, b represents 12 to 60, and a+b represents 100.

12. The coloring composition according to claim 1, wherein the polymer TP is a polymer represented by General Formula (TP-8);

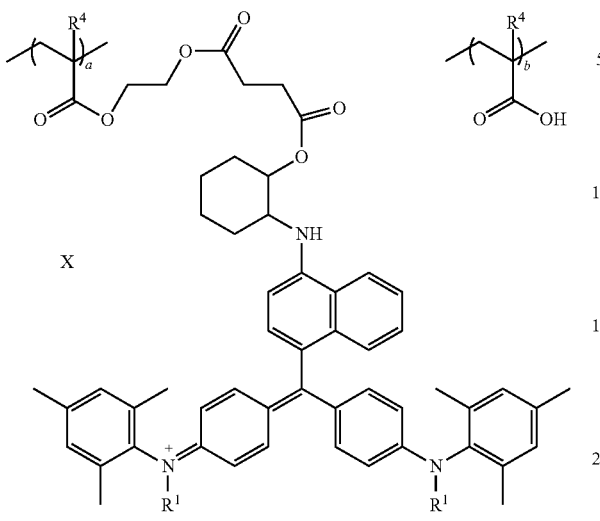

TP-8

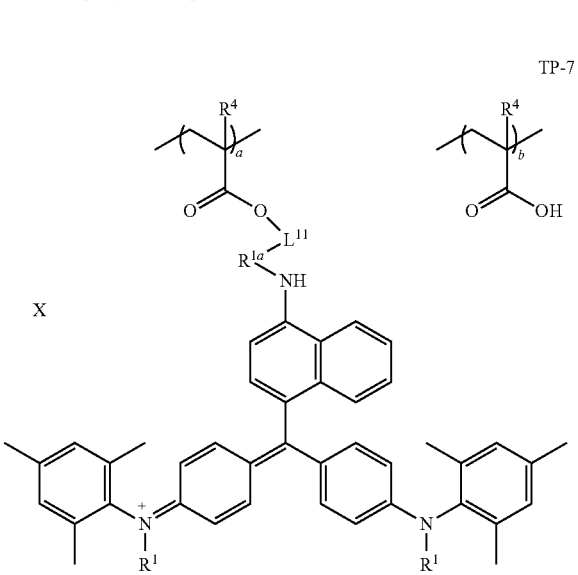

21. A polymer represented by General Formula (TP-7);

TP-7 in General Formula (TP-7), $R^1$'s each independently represent a hydrogen atom or an alkyl group having 1 to 6 carbon atoms; $R^4$ represents a hydrogen atom or a methyl group; $R^{1a}$ represents an alkylene group or an arylene group; $L^{11}$ represents a single bond or a divalent linking group having 1 to 30 carbon atoms; X represents a compound including a bis(sulfonyl)imide anion, a tris(sulfonyl)methide anion, or a sulfonic acid anion; and a and b each represent the mass ratio of the repeating units, a represents 40 to 88, b represents 12 to 60, and a+b represents 100.

22. The polymer according to claim 21, wherein the polymer represented by General Formula (TP-7) is a polymer represented by General Formula (TP-8);

in General Formula (TP-8), $R^1$'s each independently represent a hydrogen atom or an alkyl group having 1 to 6 carbon atoms; $R^4$ represents a hydrogen atom or a methyl group; X represents a compound including a bis(sulfonyl)imide anion, a tris(sulfonyl)methide anion, or a sulfonic acid anion; and a and b each represent the mass ratio of the repeating units, a represents 40 to 88, b represents 12 to 60, and a+b represents 100.

13. The coloring composition according to claim 1, wherein the polymer TP includes a bis(trifluoromethanesulfonyl)imide anion.

14. The coloring composition according to claim 1, further comprising:
a bis(trifluoromethanesulfonyl)imide salt.

15. The coloring composition according to claim 1, further comprising:
a crosslinking agent.

16. A cured film formed by curing the coloring composition according to claim 1.

17. A color filter comprising:
the cured film according to claim 16.

18. A method for manufacturing a color filter, comprising:
forming a coloring composition layer on a substrate, using the coloring composition according to claim 1; and
forming a pattern for the composition layer by a photolithography method or a dry etching method.

19. A solid-state imaging device comprising:
the color filter according to claim 17.

20. An image display device comprising:
the color filter according to claim 17.

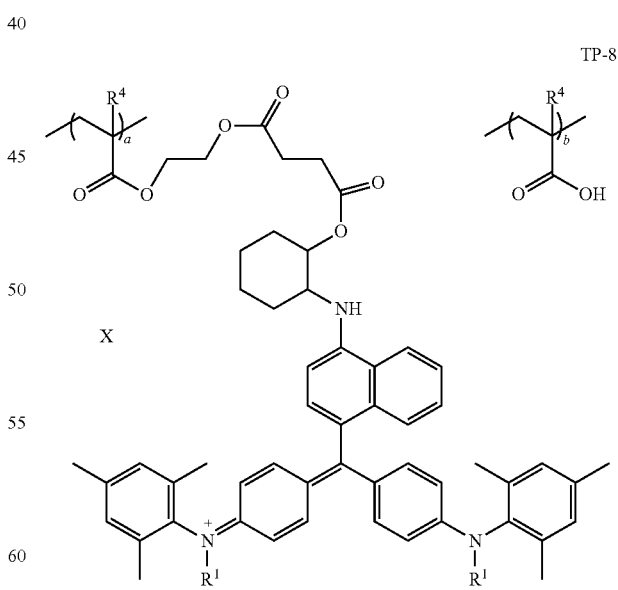

TP-8 in General Formula (TP-8), $R^1$'s each independently represent a hydrogen atom or an alkyl group having 1 to 6 carbon atoms; $R^4$ represents a hydrogen atom or a methyl group; X represents a compound including a bis(sulfonyl)imide anion, a tris(sulfonyl)methide anion, or a sulfonic acid anion; and a and b each represent the mass ratio of the repeating units, a represents 40 to 88, b represents 12 to 60, and a+b represents 100.

* * * * *